United States Patent
Ovsiannikov

(10) Patent No.: US 11,152,952 B2
(45) Date of Patent: Oct. 19, 2021

(54) CHANNEL-PARALLEL COMPRESSION WITH RANDOM MEMORY ACCESS

(71) Applicant: Samsung Electronics Co., Ltd., Suwon-si (KR)

(72) Inventor: Ilia Ovsiannikov, Porter Ranch, CA (US)

(73) Assignee: SAMSUNG ELECTRONICS CO., LTD.

(*) Notice: Subject to any disclaimer, the term of this patent is extended or adjusted under 35 U.S.C. 154(b) by 0 days.

(21) Appl. No.: 16/847,645

(22) Filed: Apr. 13, 2020

(65) Prior Publication Data

US 2020/0336154 A1  Oct. 22, 2020

Related U.S. Application Data

(63) Continuation of application No. 16/842,662, filed on Apr. 7, 2020.
(Continued)

(51) Int. Cl.
  *H03M 7/00* (2006.01)
  *H03M 7/30* (2006.01)
  (Continued)

(52) U.S. Cl.
  CPC ...... *H03M 7/3066* (2013.01); *G06F 9/30018* (2013.01); *G06F 9/30036* (2013.01);
  (Continued)

(58) Field of Classification Search
  CPC .... H03M 7/3066; H03M 7/40; H03M 7/6005; H03M 7/6011; H03M 7/6023;
  (Continued)

(56) References Cited

U.S. PATENT DOCUMENTS

| 5,499,382 A | 3/1996 | Nusinov et al. |
| 5,696,959 A | 12/1997 | Guttag et al. |

(Continued)

FOREIGN PATENT DOCUMENTS

| EP | 0617518 A2 | 9/1994 |
| EP | 3104309 A2 | 12/2016 |

(Continued)

OTHER PUBLICATIONS

Chen, Mingzhe et al., "Machine Learning for Wireless Networks with Artificial Intelligence: A Tutorial on Neural Networks", (arXiv preprint arXiv:1710.02913. Oct. 9, 2017.), Oct. 9, 2017, 98 pages.

(Continued)

*Primary Examiner* — Joseph J Lauture
(74) *Attorney, Agent, or Firm* — Renaissance IP Law Group LLP

(57) ABSTRACT

A data compressor includes a zero-value remover, a zero bit mask generator, a plurality of multiplexers, and a row-pointer generator. The zero-value remover receives $2^N$ bit streams of values and outputs $2^N$ non-zero-value bit streams having zero values removed. The zero bit mask generator generates a zero bit mask for a predetermined number of values of each bit stream that indicates a location of a zero value in the predetermined number of values corresponding to the zero bit mask. Each input of a multiplexer in a first column of the multiplexers receives a respective bit stream of the $2^N$ bit streams of non-zero values. The multiplexers in a last column outputting $2^N$ bit streams of values as packed non-zero values in which each output bit stream has a same bit-stream length. The row-pointer generator generates a row-pointer for each respective non-zero-value bit stream in a group of packed non-zero values.

20 Claims, 45 Drawing Sheets

Related U.S. Application Data

(60) Provisional application No. 62/841,819, filed on May 1, 2019, provisional application No. 62/835,496, filed on Apr. 17, 2019.

(51) Int. Cl.
*H03M 7/40* (2006.01)
*G06F 9/30* (2018.01)
*G06F 9/38* (2018.01)
*H04L 5/02* (2006.01)

(52) U.S. Cl.
CPC ........ *G06F 9/30145* (2013.01); *G06F 9/3818* (2013.01); *G06F 9/3851* (2013.01); *H03M 7/40* (2013.01); *H03M 7/6005* (2013.01); *H03M 7/6011* (2013.01); *H03M 7/6023* (2013.01); *H04L 5/023* (2013.01)

(58) Field of Classification Search
CPC ............. G06F 9/30018; G06F 9/30036; G06F 9/30145; G06F 9/3818; G06F 9/3851
See application file for complete search history.

(56) References Cited

U.S. PATENT DOCUMENTS

| | | |
|---|---|---|
| 5,727,225 A | 3/1998 | Guttag et al. |
| 5,798,719 A | 8/1998 | Wise et al. |
| 5,805,913 A | 9/1998 | Guttag et al. |
| 6,032,170 A | 2/2000 | Guttag et al. |
| 6,370,558 B1 | 4/2002 | Guttag et al. |
| 6,888,941 B2 | 5/2005 | Rose |
| 7,174,047 B2 | 2/2007 | Lin et al. |
| 9,418,458 B2 | 8/2016 | Chertok et al. |
| 9,904,874 B2 | 2/2018 | Shoaib et al. |
| 10,096,134 B2 | 10/2018 | Yan et al. |
| 2005/0093873 A1 | 5/2005 | Paltashev et al. |
| 2007/0285417 A1 | 12/2007 | Prokopenko et al. |
| 2015/0378734 A1 | 12/2015 | Hansen et al. |
| 2015/0379072 A1 | 12/2015 | Dirac et al. |
| 2016/0358069 A1 | 12/2016 | Brothers et al. |
| 2017/0011288 A1 | 1/2017 | Brothers et al. |
| 2017/0316312 A1 | 11/2017 | Goyal et al. |
| 2017/0357891 A1 | 12/2017 | Judd et al. |
| 2018/0032859 A1 | 2/2018 | Park et al. |
| 2018/0046894 A1 | 2/2018 | Yao |
| 2018/0046906 A1 | 2/2018 | Dally et al. |
| 2018/0046913 A1 | 2/2018 | Yu et al. |
| 2018/0046916 A1 | 2/2018 | Dally et al. |
| 2018/0101743 A1 | 4/2018 | Vang et al. |
| 2018/0129935 A1 | 5/2018 | Kim et al. |
| 2018/0129939 A1 | 5/2018 | Yang |
| 2018/0150240 A1 | 5/2018 | Bernat et al. |
| 2018/0181857 A1 | 6/2018 | Mathew et al. |
| 2018/0188704 A1 | 7/2018 | Cella et al. |
| 2018/0189642 A1 | 7/2018 | Boesch et al. |
| 2018/0259970 A1 | 9/2018 | Wang et al. |
| 2018/0285254 A1 | 10/2018 | Baum et al. |
| 2018/0307495 A1 | 10/2018 | Ould-Ahmed-Vall et al. |
| 2018/0307950 A1 | 10/2018 | Nealis et al. |
| 2019/0042923 A1 | 2/2019 | Janedula et al. |
| 2019/0065896 A1 | 2/2019 | Lee et al. |
| 2019/0066257 A1 | 2/2019 | Daga et al. |
| 2019/0079764 A1 | 3/2019 | Diamond et al. |
| 2019/0087713 A1 | 3/2019 | Lamb et al. |
| 2019/0095130 A1 | 3/2019 | Xu et al. |
| 2019/0108436 A1 | 4/2019 | David et al. |
| 2019/0114511 A1 | 4/2019 | Gao et al. |
| 2019/0156201 A1 | 5/2019 | Bichler et al. |
| 2019/0236049 A1 | 8/2019 | Vanliease et al. |
| 2019/0392287 A1 | 12/2019 | Ovsiannikov et al. |
| 2020/0336273 A1* | 10/2020 | Ovsiannikov ......... G06F 9/3818 |

FOREIGN PATENT DOCUMENTS

| | | |
|---|---|---|
| GB | 2560600 A | 9/2018 |
| WO | 2016186826 A1 | 11/2016 |
| WO | 2017129325 A1 | 8/2017 |
| WO | 2017142397 A1 | 8/2017 |
| WO | 2017186830 A1 | 11/2017 |
| WO | 2019213745 A1 | 11/2019 |

OTHER PUBLICATIONS

Wu, Zhenning et al., "A PCA and ELM Based Adaptive Method for Channel Equalization in MFL Inspection", Hindawi Publishing Corporation Mathematical Problems in Engineering, vol. 2014, Article ID 124968, 8 pages (http://dx.doi.org/10.1155/2014/124968), published Aug. 12, 2014.

Extended European Search Report for Application No. 20170105.9, dated Sep. 23, 2020.

Office Action for U.S. Appl. No. 16/842,682, dated Sep. 14, 2020.

Panda, Sunita, et al., "A new training strategy for neural network using shuffled frog-leaping algorithm and application to channel equalization," AEU—International Journal of Electronics and Communications, vol. 68, Issue 11, Nov. 1, 2014.

Sidelnikov, Oleg, et al., "Nonlinear Equalization in Long Haul Transmission Systems Using Dynamic Multi-Layer Perceptron Networks," 2018 European Conference on Optical Communication (ECOC), Rome, Sep. 23, 2018.

Wikipedia, "Multiplexer," Apr. 5, 2019 (Apr. 5, 2019), XP055727184, Retrieved from the Internet: URL:https://en.wikipedia.org/w/index.php?title=Multiplexer&oldid=891125543 [retrieved on Sep. 3, 2020], 7 pages.

Ahmad et al., "FPGA-based Accelerators of Deep Learning Networks for Learning and Classification: A Review," Jan. 1, 2019, Date of publication 2018 00, 0000, date of current version 2018 00, 0000. Digital Object Identifier 10.1109/ACCESS.2018.2890150DOI, arXiv:1901.00121vl[cs.NE[, pp. 1-41.

Aimar et al., "NullHop: A Flexible Convolutional Neural Network Accelerator Based on Sparse Representations of Feature Maps," Mar. 6, 2018, arXiv:1706.01406v2 [cs.CV], pp. 1-13.

Lascorz, Ad et al., "Bit-Tactical: Exploiting Ineffectual Computations in Convolutional Neural Networks: Which, Why, and How", Cornell University, Computer Science, Neural and Evolutionary Computing, Mar. 9, 2018, pp. 1-14, arXiv:1803.03688vl.

Mittal, Sparsh, "A survey of FPGA-based accelerators for convolutional neural networks," Neural Computing and Applications, 2020, 32 pages.

Notice of Allowance for U.S. Appl. No. 16/842,682, dated Jan. 15, 2021.

Office Action for U.S. Appl. No. 16/847,631, dated Feb. 11, 2021.

Shaoli et al., "Cambricon: An Instruction Set Architecture for Neural Networks," 2016 ACM/IEEE 43rd Annual International Symposium on Computer Architecture, pp. 1-13.

Sombatsiri, Salita, et al., "Parallelism-Flexible Convolution Core for Sparse Convolutional Neural Networks," SASIMI 2018 Proceedings, 2018, pp. 188-193.

Vu-Hsin et al., "Eyeriss v2: A Flexible Accelerator for Emerging Deep Neural Networks on Mobile Devices," May 20, 2019, arXiv:1807.07928v2 [csDC], pp. 1-21.

Notice of Allowance for U.S. Appl. No. 16/847,631, dated Apr. 26, 2021.

Office Action for U.S. Appl. No. 16/842,682, dated Apr. 29, 2021.

Notice of Allowance for U.S. Appl. No. 16/842,682, dated Aug. 19, 2021.

Supplemental Notice of Allowability for U.S. Appl. No. 16/847,631, dated Aug. 10, 2021.

\* cited by examiner

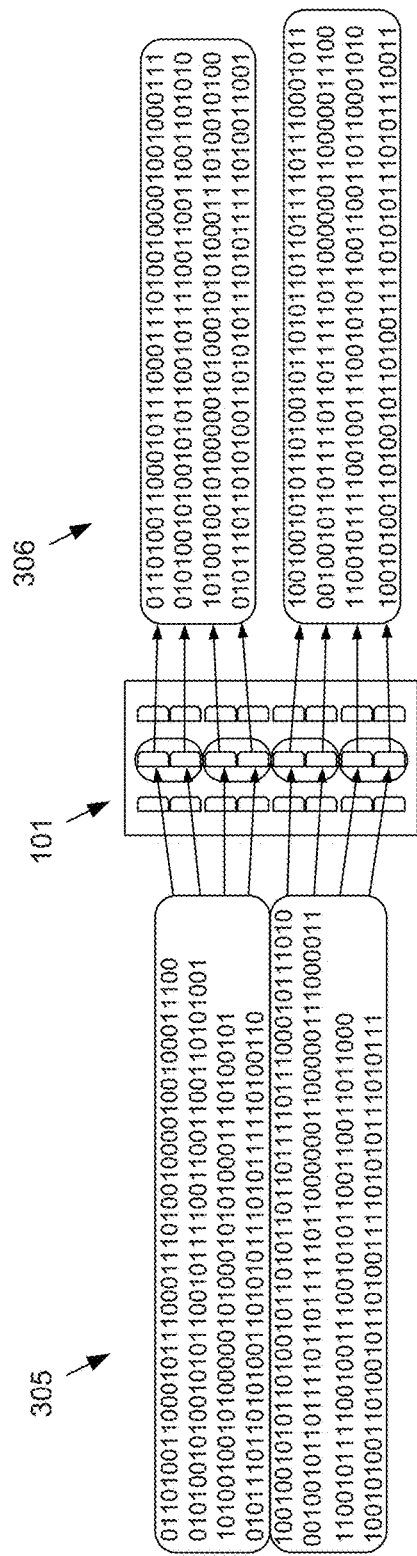
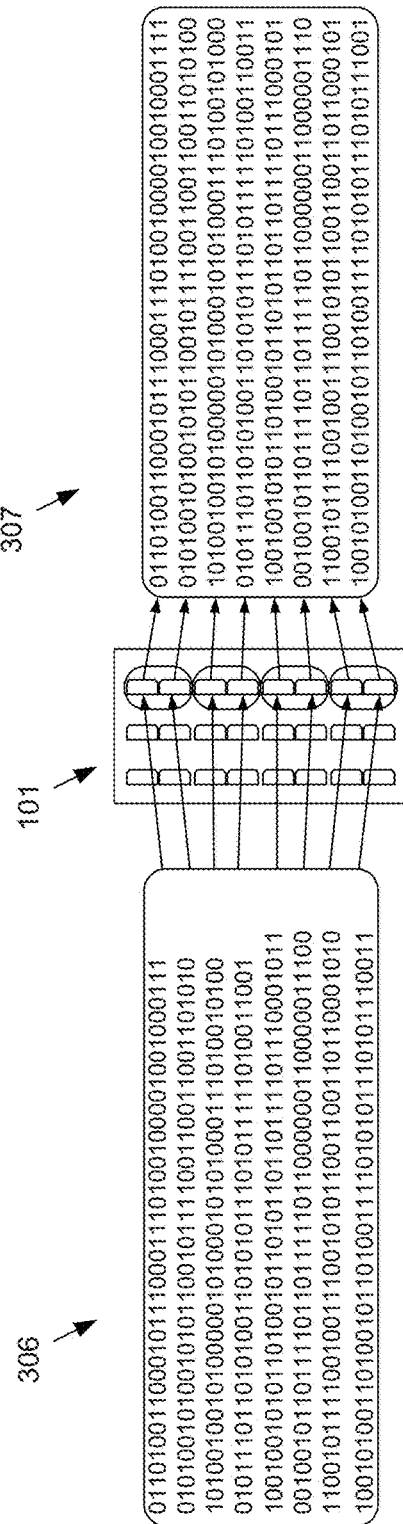
FIG. 3C
FIG. 3D

| Row0 Pix0 Lane0 | Row0 Pix0 Lane1 | Row0 Pix0 Lane2 | Row0 Pix0 Lane3 | Row0 Pix0 Lane4 | Row0 Pix0 Lane5 | 0 | Row0 Pix0 Lane7 | 0 | 0 | 0 | Row0 Pix0 Lane11 | 0 | 0 | 0 | 0 |
|---|---|---|---|---|---|---|---|---|---|---|---|---|---|---|---|
| 0 | Row0 Pix1 Lane1 | Row0 Pix1 Lane2 | Row0 Pix1 Lane3 | Row0 Pix1 Lane4 | Row0 Pix1 Lane5 | Row0 Pix1 Lane6 | Row0 Pix1 Lane7 | Row0 Pix1 Lane8 | Row0 Pix1 Lane9 | Row0 Pix1 Lane10 | 0 | Row0 Pix1 Lane12 | 0 | 0 | Row0 Pix1 Lane15 |
| 0 | 0 | Row0 Pix2 Lane2 | 0 | 0 | Row0 Pix2 Lane5 | Row0 Pix2 Lane6 | Row0 Pix2 Lane7 | Row0 Pix2 Lane8 | Row0 Pix2 Lane9 | Row0 Pix2 Lane10 | Row0 Pix2 Lane11 | Row0 Pix2 Lane12 | 0 | 0 | 0 |
| 0 | 0 | 0 | 0 | Row0 Pix3 Lane4 | Row0 Pix3 Lane5 | Row0 Pix3 Lane6 | 0 | 0 | 0 | 0 | 0 | Row0 Pix3 Lane12 | Row0 Pix3 Lane13 | Row0 Pix3 Lane14 | 0 |
| 0 | Row1 Pix0 Lane1 | Row1 Pix0 Lane2 | 0 | Row1 Pix0 Lane4 | 0 | Row1 Pix0 Lane6 | 0 | 0 | Row1 Pix0 Lane9 | Row1 Pix0 Lane10 | 0 | Row1 Pix0 Lane12 | 0 | 0 | 0 |
| 0 | Row1 Pix1 Lane1 | Row1 Pix1 Lane2 | Row1 Pix1 Lane3 | Row1 Pix1 Lane4 | Row1 Pix1 Lane5 | Row1 Pix1 Lane6 | 0 | Row1 Pix1 Lane8 | Row1 Pix1 Lane9 | 0 | 0 | Row1 Pix1 Lane12 | 0 | 0 | 0 |
| 0 | 0 | Row1 Pix2 Lane2 | 0 | 0 | Row1 Pix2 Lane5 | Row1 Pix2 Lane6 | Row1 Pix2 Lane7 | Row1 Pix2 Lane8 | Row1 Pix2 Lane9 | Row1 Pix2 Lane10 | Row1 Pix2 Lane11 | 0 | 0 | 0 | 0 |
| Row1 Pix3 Lane0 | 0 | 0 | 0 | 0 | Row1 Pix3 Lane5 | Row1 Pix3 Lane6 | 0 | 0 | 0 | Row1 Pix3 Lane10 | 0 | Row1 Pix3 Lane12 | Row1 Pix3 Lane13 | Row1 Pix3 Lane14 | 0 |

801 ← 16 Bytes Uncompressed Data

FIG. 8A

| Lane | 8-bit Data Original | 8-bit Data Transposed |
|---|---|---|
| 0 | 0x02 0x07 0x08 0x0A ... | 0x00 0x00 0x27 0x00 0x8A ... |
| 1 | 0x0B 0x03 0x00 0x02 ... | 0x80 0xB3 0x00 0x02 ... |
| 2 | 0x04 0x06 0x00 0x00 ... | 0x00 0x46 0x00 0x00 ... |
| ... | | |
| 15 | 0x35 0x10 0x70 0x81 ... | 0x31 0x50 0x78 0x01 ... |

FIG. 16A

| Lane | 16-bit Data Original | 16-bit Data Transposed |
|---|---|---|
| 0 | 0x02 0x07 0x08 0x0A ... | 0x00 0x00 0x27 0x8A ... |
| 1 | 0x0B 0x03 0x00 0x02 ... | 0x00 0x00 0xB3 0x02 ... |
| 2 | 0x04 0x06 0x00 0x00 ... | 0x00 0x00 0x46 0x00 ... |
| ... | | |
| 15 | 0x35 0x10 0x70 0x81 ... | 0x31 0x78 0x50 0x01 ... |

FIG. 16B

CHANNEL-PARALLEL COMPRESSION WITH RANDOM MEMORY ACCESS

CROSS-REFERENCE TO RELATED APPLICATION

This patent application is a continuation patent application of U.S. patent application Ser. No. 16/842,662, filed Apr. 7, 2020, and claims the priority benefit under 35 U.S.C. § 119(e) of U.S. Provisional Application Nos. 62/835,496 filed on Apr. 17, 2019, and 62/841,819 filed on May 1, 2019, the disclosures of which are incorporated herein by reference in their entirety.

TECHNICAL FIELD

The subject matter disclosed herein relates to multichannel data systems. More specifically, the subject matter disclosed herein relates to system capable of compressing and decompressing multichannel bit streams in parallel.

BACKGROUND

Neural inference accelerator hardware may store and retrieve data, such as weights and feature maps output from activation functions, in a parallel fashion (e.g., 16 concurrent lanes). The data stored and retrieved may have many zeros, which can and should be compressed to reduce read and write power and size storage in dynamic random access memory (DRAM) and static random access memory (SRAM). Known compression and decompression data algorithms (e.g., Huffman, dictionary-based, ZIP, run-length encoding, Golomb Rice, etc.) are typically serial processes and handle only one data bit stream at a time.

SUMMARY

An example embodiment provides a data compressor that may include a zero-value remover, a zero bit mask generator, a plurality of multiplexers, and a row-pointer generator. The zero-value remover may receive $2^N$ bit streams of values in which N is an integer greater than 1 and may output $2^N$ non-zero-value bit streams having zero values removed from each respective bit stream. The zero bit mask generator may receive the $2^N$ bit streams of values and may generate a zero bit mask for a predetermined number of values of each bit stream in which each zero bit mask may indicate a location of a zero value in the predetermined number of values corresponding to the zero bit mask. The plurality of multiplexers may receive the $2^N$ non-zero-value bit streams output from the zero-value remover in which the plurality of multiplexers may be arranged in $2^N$ rows and N columns, in which each input of a multiplexer in a first column may receive a respective bit stream of the $2^N$ bit streams of non-zero values, in which each respective non-zero-value bit stream may include a bit-stream length based on data in the non-zero-value bit stream, in which the multiplexers in a last column may output $2^N$ bit streams of values as a group of packed non-zero values, and in which each output bit stream has a same bit-stream length. The row-pointer generator may generate a row-pointer for each respective non-zero-value bit stream in the group of packed non-zero values. In one embodiment, the data compressor may include a memory-write arbiter that may receive the group of packed non-zero values, zero bit masks corresponding to the $2^N$ bit streams formed into the group of packed non-zero values, and the row-pointers for the group of packed non-zero values in which the memory-write arbiter may send to storage the group of packed non-zero values, the zero bit masks corresponding to the group of packed non-zero values or the row-pointers for the group of packed non-zero values.

An example embodiment provides a data compressor that may include a zero-value remover, a zero bit mask generator, a plurality of multiplexers, and a row-pointer generator. The zero-value remover may receive 8 bit streams of values and may output 8 non-zero-value bit streams having zero values removed from each respective bit stream. The zero bit mask generator may receive the 8 bit streams of values and may generate a zero bit mask for 16 values of each bit stream in which each zero bit mask may indicate a location of a zero value in the 16 values corresponding to the zero bit mask. The plurality of multiplexers may receive the 8 non-zero-value bit streams output from the zero-value remover in which the plurality of multiplexers may be arranged in 8 rows and 3 columns, in which each input of a multiplexer in a first column may receive a respective bit stream of the 8 bit streams of non-zero values, in which each respective non-zero-value bit stream may include a bit-stream length based on data in the non-zero-value bit stream, in which the multiplexers in a last column may output 8 bit streams of values as a group of packed non-zero values, and in which each output bit stream has a same bit-stream length. The row-pointer generator may generate a row-pointer for each respective non-zero-value bit stream in the group of packed non-zero values.

An example embodiment provides a data decompressor that may include a memory-read arbiter, a plurality of multiplexers, a zero-value mask unpacker, and a zero-value inserter. The memory-read arbiter may receive row-pointers for a group of packed non-zero values, zero bit masks corresponding to the group of packed non-zero values, and the group of packed non-zero values based on the row-pointers for the group of packed non-zero values. The plurality of multiplexers may receive the group of packed non-zero-values from the memory-read arbiter in which the plurality of multiplexers may be arranged in an $2^N$ rows and N columns in which N is an integer greater than 1, in which each input of a multiplexer in a first column may receive a respective bit stream of the $2^N$ bit-streams of packed non-zero values, in which each respective bit stream of packed non-zero values may include a same bit-stream length, and in which the multiplexers in a last column may output $2^N$ bits streams each having a bit stream length corresponding to unpacked data of the bit stream. The zero-value mask unpacker may receive the zero bit masks corresponding to the group of packed non-zero values. The zero-value inserter may insert zero values into each bit stream of packed non-zero values based on the zero bit masks corresponding to the bit stream of packed non-zero values.

BRIEF DESCRIPTION OF THE DRAWING

In the following section, the aspects of the subject matter disclosed herein will be described with reference to exemplary embodiments illustrated in the figure, in which:

FIG. 3A depicts another example of data packing that involves an example block of raw 8-bit data, such as an 8×8 set of weights, according to the subject matter disclosed herein;

FIG. 3B depicts a multichannel output from a first column of a butterfly shuffler according to the subject matter disclosed herein;

FIG. 3C depicts a multichannel output from a second column of a butterfly shuffler according to the subject matter disclosed herein;

FIG. 3D depicts a multichannel output from a third column of a butterfly shuffler according to the subject matter disclosed herein;

FIGS. 8A and 8B respectively depict another example of uncompressed data and compression of data with random access of the compressed data provided by the zero-collapsing data compressor and packing circuit of FIG. 6A according to the subject matter disclosed herein;

FIG. 16A depicts a channel-wise transposition technique for an 8-bit data unit, i.e., a byte according to the subject matter disclosed herein;

FIG. 16B depicts the transposition technique for 16-bit data according to the subject matter disclosed herein;

DETAILED DESCRIPTION

Figure 1B:
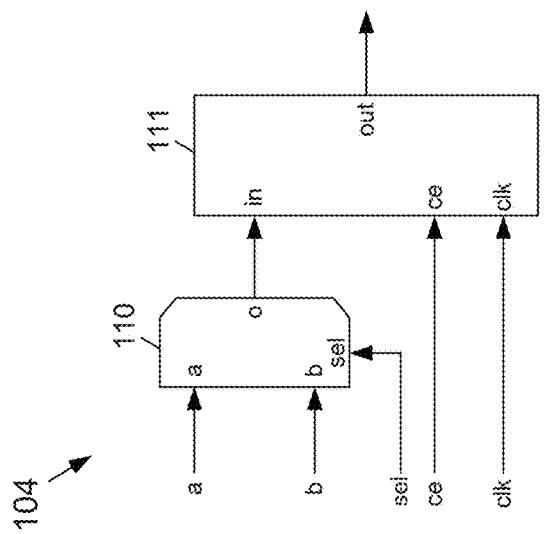
FIG. 1B depicts a block diagram of an example embodiment of a butterfly shuffler multiplexer according to the subject matter disclosed herein.

In the following detailed description, numerous specific details are set forth in order to provide a thorough understanding of the disclosure. It will be understood, however, by those skilled in the art that the disclosed aspects may be practiced without these specific details. In other instances, well-known methods, procedures, components and circuits have not been described in detail not to obscure the subject matter disclosed herein.

Reference throughout this specification to "one embodiment" or "an embodiment" means that a particular feature, structure, or characteristic described in connection with the embodiment may be included in at least one embodiment disclosed herein. Thus, the appearances of the phrases "in one embodiment" or "in an embodiment" or "according to one embodiment" (or other phrases having similar import) in various places throughout this specification may not be necessarily all referring to the same embodiment. Furthermore, the particular features, structures or characteristics may be combined in any suitable manner in one or more embodiments. In this regard, as used herein, the word "exemplary" means "serving as an example, instance, or illustration." Any embodiment described herein as "exemplary" is not to be construed as necessarily preferred or advantageous over other embodiments. Additionally, the particular features, structures, or characteristics may be combined in any suitable manner in one or more embodiments. Also, depending on the context of discussion herein, a singular term may include the corresponding plural forms and a plural term may include the corresponding singular form. Similarly, a hyphenated term (e.g., "two-dimensional," "pre-determined," "pixel-specific," etc.) may be occasionally interchangeably used with a corresponding non-hyphenated version (e.g., "two dimensional," "predetermined," "pixel specific," etc.), and a capitalized entry (e.g., "Counter Clock," "Row Select," "PIXOUT," etc.) may be interchangeably used with a corresponding non-capitalized version (e.g., "counter clock," "row select," "pixout," etc.). Such occasional interchangeable uses shall not be considered inconsistent with each other.

Also, depending on the context of discussion herein, a singular term may include the corresponding plural forms and a plural term may include the corresponding singular form. It is further noted that various figures (including component diagrams) shown and discussed herein are for illustrative purpose only, and are not drawn to scale. Similarly, various waveforms and timing diagrams are shown for illustrative purpose only. For example, the dimensions of some of the elements may be exaggerated relative to other elements for clarity. Further, if considered appropriate, reference numerals have been repeated among the figures to indicate corresponding and/or analogous elements.

The terminology used herein is for the purpose of describing some example embodiments only and is not intended to be limiting of the claimed subject matter. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The terms "first," "second," etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement some of the example embodiments disclosed herein.

It will be understood that when an element or layer is referred to as being on, "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

The terms "first," "second," etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement some of the example embodiments disclosed herein.

Unless otherwise defined, all terms (including technical and scientific terms) used herein have the same meaning as commonly understood by one of ordinary skill in the art to which this subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "module" refers to any combination of software, firmware and/or hardware configured to provide the functionality described herein in connection with a module. The software may be embodied as a software package, code and/or instruction set or instructions, and the term "hardware," as used in any implementation described herein, may include, for example, singly or in any combination, hardwired circuitry, programmable circuitry, state machine circuitry, and/or firmware that stores instructions executed by programmable circuitry. The modules may, collectively or individually, be embodied as circuitry that forms part of a larger system, for example, but not limited to, an integrated circuit (IC), system on-chip (SoC) and so forth. The various components and/or functional blocks disclosed herein may be embodied as modules that may include software, firmware and/or hardware that provide functionality described herein in connection with the various components and/or functional blocks.

The subject matter disclosed herein provides a compression and decompression system and technique that may process many channels (e.g., 8 or 16) in parallel, and also may be hardware-friendly (i.e., have small silicon area and low operating power). Additionally, the subject matter disclosed herein provides a scalable multiplexer circuit or module, referred to herein as a "butterfly shuffler," that efficiently permutes data for purposes including packing and unpacking data in a parallel fashion. In one mode of operation, the butterfly shuffler packs multiple channels of bit streams so that all channels have equal lengths, or numbers, of bits. In another mode of operation, the butterfly shuffler unpacks the equal-length bit streams, or channels, to reform the original bit streams. For a system that operates on eight (8) channels of bit streams, a butterfly shuffler includes 24 2-to-1 multiplexers that can flexibly permute, or rearrange, the bits in a bit stream into another bit stream. For a system that operates on 16 channels of bit streams, a butterfly shuffler includes 64 2-to-1 multiplexers that can flexibly permute, or rearrange, the bits in a bit stream into another bit stream. The butterfly shuffler disclosed herein is not a full cross-bar multiplexer configuration. A full cross-bar configuration has a large area $O(N^2)$ in which N is number of lanes of data. In contrast, the area of the butterfly shuffler is $O(N*\log(N))$, in which N is the number of lanes of data.

One embodiment of the subject matter disclosed herein provides a "zero-collapsing" data compressor and data packer that may use a butterfly shuffler and that provides random access to the packed data so that any part of the packed data may be randomly accessed in which "zero-collapsing" refers to an ability to remove zeros from uncompressed data to obtain compressed data. Another embodiment provides an unpacker and decompressor that may be used to unpack and decompress the packed data using the random access capability provided by the zero-collapsing data compressor and data packer.

Still another embodiment of the subject matter disclosed herein may provide a butterfly shuffler that may homogenize sparse data to make the sparsity of the data more uniform. A butterfly shuffler may be used to permute, i.e., rearrange, data values of sparse data and thereby homogenize the sparse data so that clumps of non-zero values are spread more uniformly through the sparse data.

Yet another embodiment of the subject matter disclosed herein may provide a channel-parallel compressor and data packer that may use a butterfly shuffler and that provides random access to packed data. A channel-parallel unpacker and decompressor may be used to unpack and decompress the packed data using the random access capability provided by the channel-parallel compressor and data packer.

Different granularities of compression may also be used with the various data compressors disclosed herein. One embodiment of a data compressor that uses a butterfly shuffler may provide a nibble compression granularity for the compressed data. Another embodiment of a data compressor that uses a butterfly shuffler may provide a byte compression granularity for the compressed data. Still another embodiment of a data compressor that uses a butterfly shuffler may provide a multiple-byte compression granularity for the compressed data.

Figure 1A:
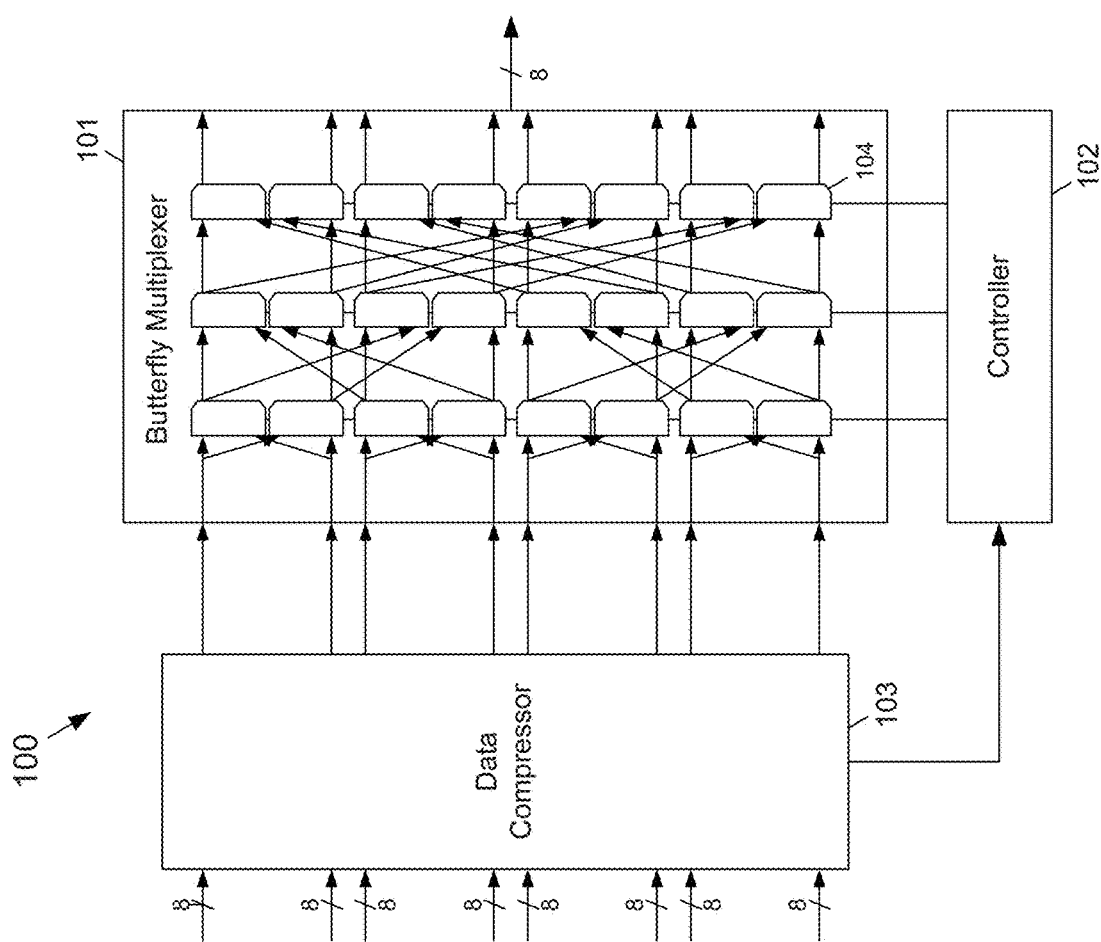
FIG. 1A depicts a block diagram of one example embodiment of a multichannel data packer according to the subject matter disclosed herein.

FIG. 1A depicts a block diagram of one example embodiment of a multichannel data packer 100 according to the subject matter disclosed herein. The multichannel data packer 100 may include a butterfly shuffler 101, a controller 102 and a data compressor 103. The data compressor may receive 8 byte streams and compress each byte stream into a bit stream. Each input byte stream is compressed in parallel with and independently from all other input byte streams. The compression algorithm can be any known algorithm that compresses a byte stream into a bit stream. The butterfly shuffler 101 may receive the resulting 8 channels of bit streams that generally have different bit-stream lengths, and under control of the controller 102, may permute 8 channels of bit streams such that each output stream has the same bit-stream length and may be treated as a single byte stream. In one embodiment, the data compressor 103 may receive the 8 channels of bit streams and remove zero values from each bit stream to provide a compressed bit stream for each bit-stream channel. The data compressor 103 may also generate a zero-bit-mask (ZBM) (not shown in FIG. 1A) for each bit stream channel. The butterfly shuffler 101, the controller 102 and/or the data compressor 103 may be implemented as circuits and/or as modules. The butterfly shuffler 101 may include multiplexer module components 104, or "multiplexers," that may be implemented as a multiplexer 110 having an output buffered using a shift register 111, as depicted in FIG. 1B. In some embodiments, the shift register 111 may be optional.

Figure 1C:
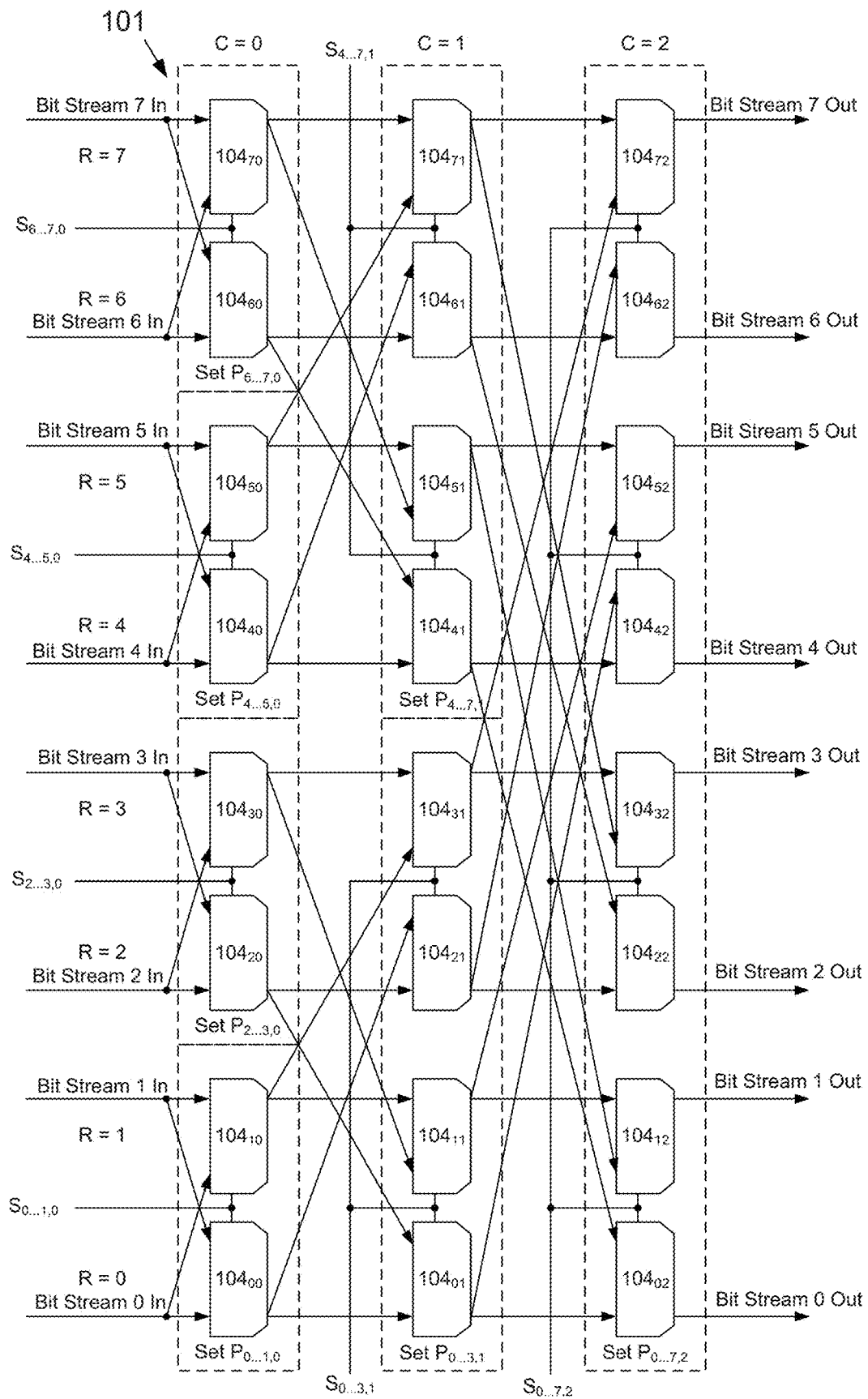
FIG. 1C depicts a block diagram of one example embodiment of the butterfly shuffler according to the subject matter disclosed herein.

FIG. 1C depicts a block diagram of one example embodiment of the butterfly shuffler 101 according to the subject matter disclosed herein. The butterfly shuffler 101 may include 24 2-to-1 8-bit multiplexers 104 arranged in an array of 8 rows (R=0 through R=7) and 3 columns (C=0 through C=2). The butterfly shuffler 101 may receive 8 channels of bit streams that generally have different bit-stream lengths. Alternatively, the multiplexers 104 may be arranged in an array of 3 rows and 8 columns in which each respective column receives one of the 8 channels of bit streams.

Referring to the arrangement depicted in FIG. 1C, the output of a multiplexer in a row in column C=0 may be connected to the input of the corresponding multiplexer in the same row in column C=1. Similarly, the output of the multiplexer in a row in column 1 may be connected to the input of the corresponding multiplexer in the same row in column C=2. For example, the output of the multiplexer $104_{00}$ is connected to the input of the multiplexer $104_{01}$, and the output of the multiplexer $104_{01}$ is connected to the input of the multiplexer $104_{02}$.

Additionally, the outputs of the multiplexer $104_{00}$ and the multiplexer $104_{10}$ in column C=0 may be further respectively coupled to the inputs of the multiplexer $104_{21}$ and the multiplexer $104_{31}$ in column C=1. The outputs of the multiplexer $104_{20}$ and the multiplexer $104_{30}$ in column 0 may be further respectively coupled to the inputs to the multiplexer $104_{01}$ and the multiplexer $104_{11}$ in column C=1. The outputs of the multiplexer $104_{40}$ and the multiplexer $104_{50}$ in column 0 may be further respectively coupled to the inputs to the multiplexer $104_{61}$ and the multiplexer $104_{71}$ in column C=1. The outputs of the multiplexer $104_{60}$ and the multiplexer $104_{70}$ in column 0 may be further respectively coupled to the inputs to the multiplexer $104_{41}$ and the multiplexer $104_{51}$ in column C=1.

The outputs of the multiplexer $104_{01}$ and the multiplexer $104_{11}$ in column 1 may be further respectively coupled to the inputs to the multiplexer $104_{42}$ and the multiplexer $104_{52}$ in column C=2. The outputs of the multiplexer $104_{21}$ and the multiplexer $104_{31}$ in column C=1 may be further respectively coupled to the inputs to the multiplexer $104_{62}$ and the multiplexer $104_{72}$ in column 2. The outputs of the multiplexer $104_{41}$ and the multiplexer $104_{51}$ in column C=1 may be further respectively coupled to the inputs to the multiplexer $104_{02}$ and the multiplexer $104_{12}$ in column C=2. The outputs of the multiplexer $104_{61}$ and the multiplexer $104_{71}$ in column C=1 may be further respectively coupled to the inputs to the multiplexer $104_{22}$ and the multiplexer $104_{32}$ in column C=2.

One input of each multiplexer in the column C=0 may receive a bit stream. For example, the multiplexer $104_{00}$ may receive a bit stream 0, and the multiplexer $104_{10}$ may receive a bit stream 1. The multiplexer $104_{00}$ and the multiplexer $104_{10}$ are paired, so the bit stream 0 may also be input to the multiplexer $104_{10}$, and the bit stream 1 may be input to the multiplexer $104_{00}$. Similarly, a bit stream 2 and a bit stream 3 may be input to both the multiplexer $104_{20}$ and the multiplexer $104_{30}$. A bit stream 4 and a bit stream 5 may be input to both the multiplexer $104_{40}$ and the multiplexer $104_{50}$. A bit stream 6 and a bit stream 7 may be input to both the multiplexer $104_{60}$ and the multiplexer $104_{70}$. Bit streams of a larger bit width, i.e., byte, may also be used.

In general, a butterfly shuffler with $2^K$ inputs includes $2^K$ rows and K columns of 2-to-1 multiplexers in which K is an integer greater than 1, and may be constructed as follows. Multiplexers in each column C may be grouped into logical consecutive sets in which each set has a size $2^{C+1}$ and in which C=0, 1 . . . K. More specifically, the multiplexers in column C=0 (i.e., the leftmost column in FIG. 1C) may be grouped in sets in which each set in column C=0 has a size $2^{C+1}=2$. Thus, the multiplexers $104_{00}$ and $104_{10}$ form a set $P_{0 \ldots 1, 0}$. The multiplexers $104_{20}$ and $104_{30}$ form a set $P_{2 \ldots 3, 0}$. The multiplexers $104_{40}$ and $104_{50}$ form a set $P_{4 \ldots 5, 0}$. The multiplexers $104_{60}$ and $104_{70}$ form a set $P_{6 \ldots 7, 0}$. The set $P_{0 \ldots 1, 0}$ receives the bit streams 0 and 1 that are respectively connected to multiplexers $104_{00}$ and $104_{10}$. Similarly, the set $P_{2 \ldots 3, 0}$ receives the bit streams 2 and 3. The set $P_{4 \ldots 5, 0}$ receives the bit streams 4 and 5; and so on.

Each set in column C=0 may receive a control signal, e.g., $S_{0 \ldots 1, 0}$, from the controller 102 (FIG. 1A). If the control signal is de-asserted, the set of multiplexers connected to the control signal selects input bit streams so that each input bit stream passes through the multiplexer of the set to stay in the same row. If the control signal is asserted, the set of multiplexers connected to the control signal selects input bit streams so that the input bit streams are output to the other row of the set of multiplexers so that the row number becomes swapped.

For example, in FIG. 1C, considering the set $P_{0 \ldots 1, 0}$, de-asserting the control signal $S_{0 \ldots 1, 0}$ causes the input bit stream 0 (i.e., the bit stream in row 0, column 0) to be output to column 1 in the same row 0, and the input bit stream 1 (i.e., the bit stream in row 0, column 0) to be output to column 1 in the same row 1. Asserting the control signal $S_{0 \ldots 1, 0}$ causes the input bit stream 0 and the input bit stream 1 to swap rows as they are output to column 1. That is, the bit stream input to row 0, column 0 is output to row 1, column 1, and the bit stream input to row 1, column 0 is output to row 0, column 1. The other sets of multiplexers respond to their respective control signals in the same way.

The multiplexers in column C=1 (i.e., the second column from the left in FIG. 1C) may be grouped in sets in which each set has a size $2^{C+1}=4$. For example, the multiplexers $104_{01}$, $104_{11}$, $104_{21}$ and $104_{31}$ form a set $P_{0 \ldots 3, 1}$, and the multiplexers $104_{41}$, $104_{51}$, $104_{61}$ and $104_{71}$ form a set $P_{4 \ldots 7, 1}$. Each set of multiplexers in column C=1 receives inputs from two sets of multiplexers in the previous column C=0. In general, each set of multiplexers in a column C+1 receives inputs from two sets of multiplexers in the previous column C.

The set $P_{0 \ldots 3, 1}$ in column 1 may receive a control signal $S_{0 \ldots 3, 1}$. If the control signal $S_{0 \ldots 3, 1}$ is de-asserted, each multiplexer in the set $P_{0 \ldots 3, 1}$ acts to pass an input from corresponding sets in the previous column to the next column C=2 so that data stays in same row. For example, referring to the set $P_{0 \ldots 3, 1}$, the output of multiplexers $104_{01}$, $104_{11}$, $104_{21}$ and $104_{31}$ equals to the output by multiplexers $104_{00}$, $104_{30}$, $104_{20}$ and $104_{10}$ respectively. Similarly, for the set $P_{4 \ldots 7, 1}$, if $S_{4 \ldots 7, 1}$ is de-asserted, the output of multiplexers $104_{41}$, $104_{51}$, $104_{61}$ and $104_{71}$ equals to the output by multiplexers $104_{40}$, $104_{70}$, $104_{60}$ and $104_{50}$ respectively.

If the control signal $S_{0 \ldots 3, 1}$ is asserted, the multiplexers in the set $P_{0 \ldots 3, 1}$ act to swap the associated input sets. Specifically, referring to the set $P_{0 \ldots 3, 1}$, the output of multiplexers $104_{01}$, $104_{11}$, $104_{21}$ and $104_{31}$ equals to the output by multiplexers $104_{20}$, $104_{30}$, $104_{00}$ and $104_{10}$ respectively. Similarly, for the set $P_{4 \ldots 7, 1}$, if $S_{4 \ldots 7, 1}$ is de-asserted, the output of multiplexers $104_{41}$, $104_{51}$, $104_{61}$ and $104_{71}$ equals to the output by multiplexers $104_{60}$, $104_{70}$, $104_{40}$ and $104_{50}$ respectively.

In general, if a control signal S is de-asserted in the column C=1, the associated set of multiplexers controlled by the control signal S acts to pass outputs of the two input sets associated with the set of multiplexers without swapping the two associated input sets, i.e., the outputs of the two associated input sets remain in the same row. If the control signal S is asserted in the column C=1, however, the associated set of multiplexers controlled by the control signal S acts to pass outputs of the two input sets associated with the set of multiplexers swapped with each other.

The multiplexer connections in column C=2 . . . (K−1) may be constructed following same rules as those described above for column 1. For the specific embodiment depicted in FIG. 1C, which includes only three columns of multiplexers, the multiplexers of column C=2 are grouped into one logical set $P_{0 \ldots 7, 2}$ having a size $2^{C+1}=2^3=8$. The control signals $S_{i \ldots j, k}$ may be generated by a logic circuit based on bit stream lengths using functional/operational description that follows.

Figure 1D:
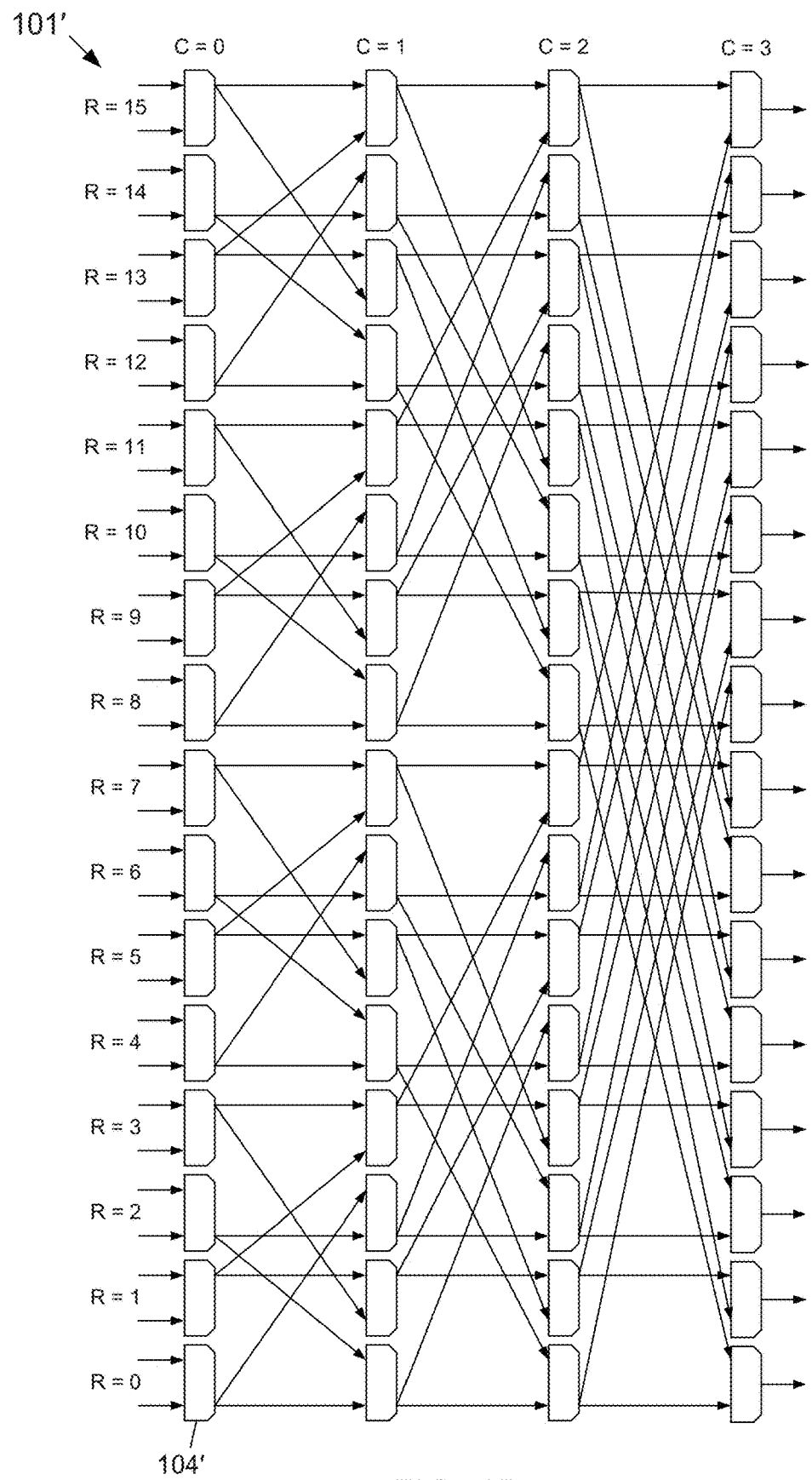
FIG. 1D depicts a block diagram of another example embodiment of the butterfly shuffler according to the subject matter disclosed herein.

FIG. 1D depicts a block diagram of another example embodiment of the butterfly shuffler 101' according to the subject matter disclosed herein. The butterfly shuffler 101' may include 64 2-to-1 8-bit multiplexers 104' arranged in an array of 16 rows (R=0 through R=15) and 4 columns (C=0 through C=3). The multiplexers 104' of the first column C=0 of the butterfly shuffler 101' may receive 16 channels of bit streams that generally have different bit-stream lengths. The butterfly shuffler 101' may be controlled so that the multiplexers 104' of column C=3 output 16 channels of bit streams that each has the same bit-stream length. The butterfly shuffler 101' in FIG. 1D operates in basically the same manner as the butterfly shuffler 101 depicted in FIG. 1C, except that the butterfly shuffler 101' receives 16 inputs and provides 16 outputs. Control signals $S_{i \ldots j, k}$ in FIG. 1D have been omitted.

Referring back to FIG. 1A, the data compressor 103 receives blocks of uncompressed, i.e., raw, data and compresses each byte stream into a respective bit lane individually using, for example, any known compression algorithm that accepts a bit stream as an input and generates another bit stream as an output. Because each bit lane is compressed individually, i.e., independently from other bit lanes, the length of output bit streams may vary from one bit lane to another. For example, the data compressor 103 may compress an 8-channels-by-32-byte long block of raw data into eight bit streams of various lengths and output the compressed eight bit streams as depicted at 201 in FIG. 2A. Each bit stream having valid compressed bits is depicted at 201 as rectangles, as the bit streams are clocked out of the data compressor 103 in parallel, with bit stream 4 being the longest among all eight lanes and bit stream 3 being the shortest. Correspondingly, as the butterfly shuffler 101 starts receiving the eight compressed streams in parallel, at first, i.e., during a first clock cycle, only bits in lane 4 contain valid data. During subsequent clock cycles, bits in lane 0 will become valid at some point, in addition to bits in lane 4 being valid. Eventually, all bits in all eight bit lanes become valid, corresponding to the tail, i.e., leftmost, part of the streams at 201.

Figure 2A:
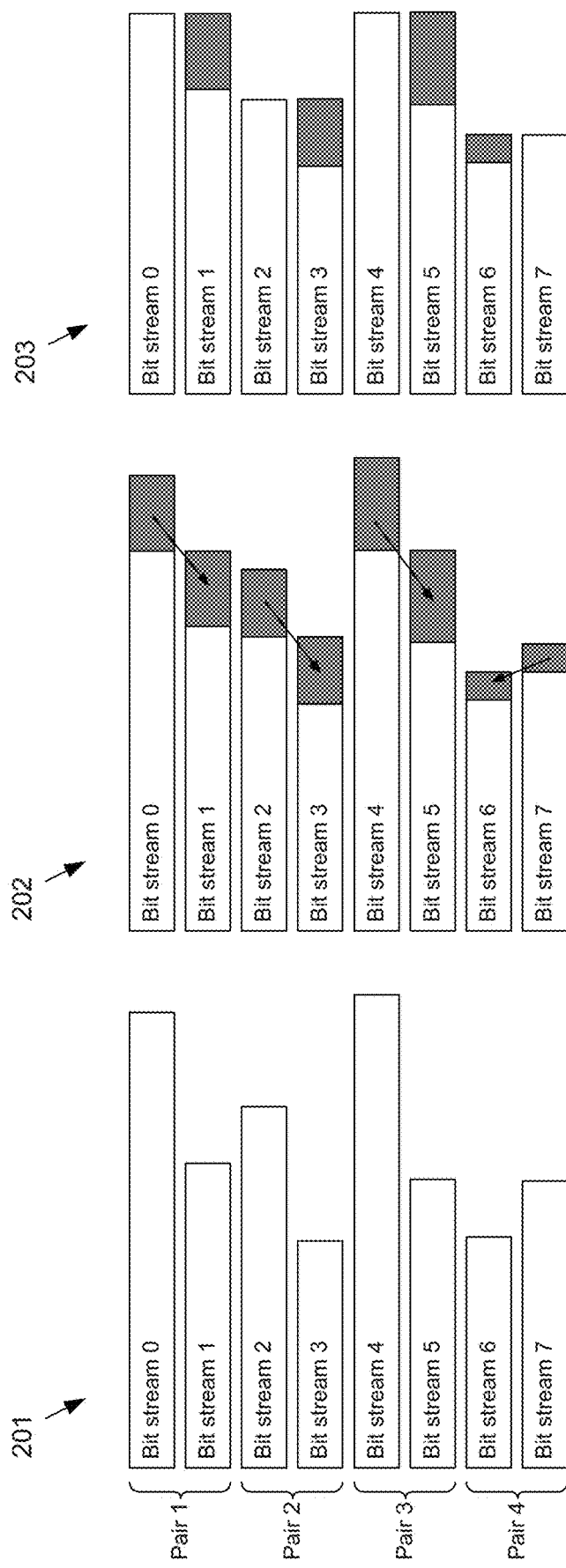
FIGS. 2A-2C conceptually depict eight example bit streams of different bit-stream lengths being recursively packed to become eight bit streams each having equal bit-stream lengths according to the subject matter disclosed herein.
Figure 2B:
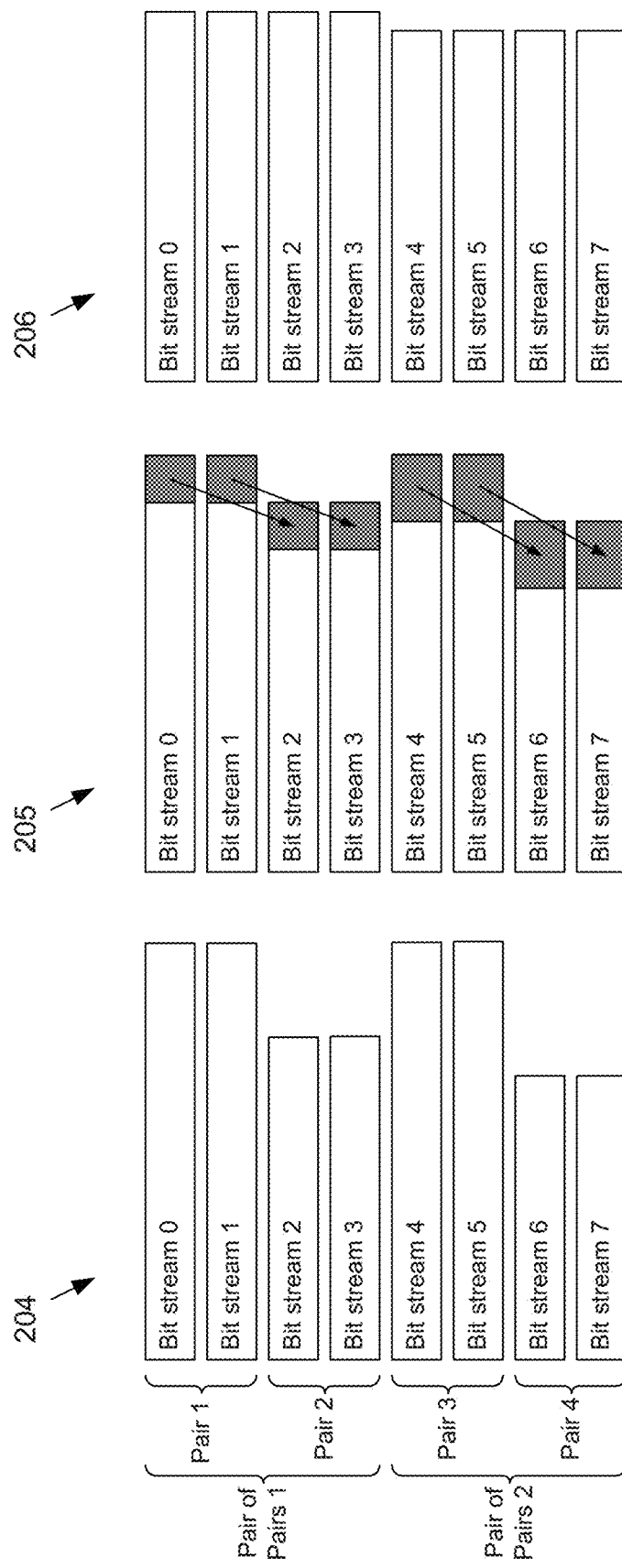
Figure 2C:
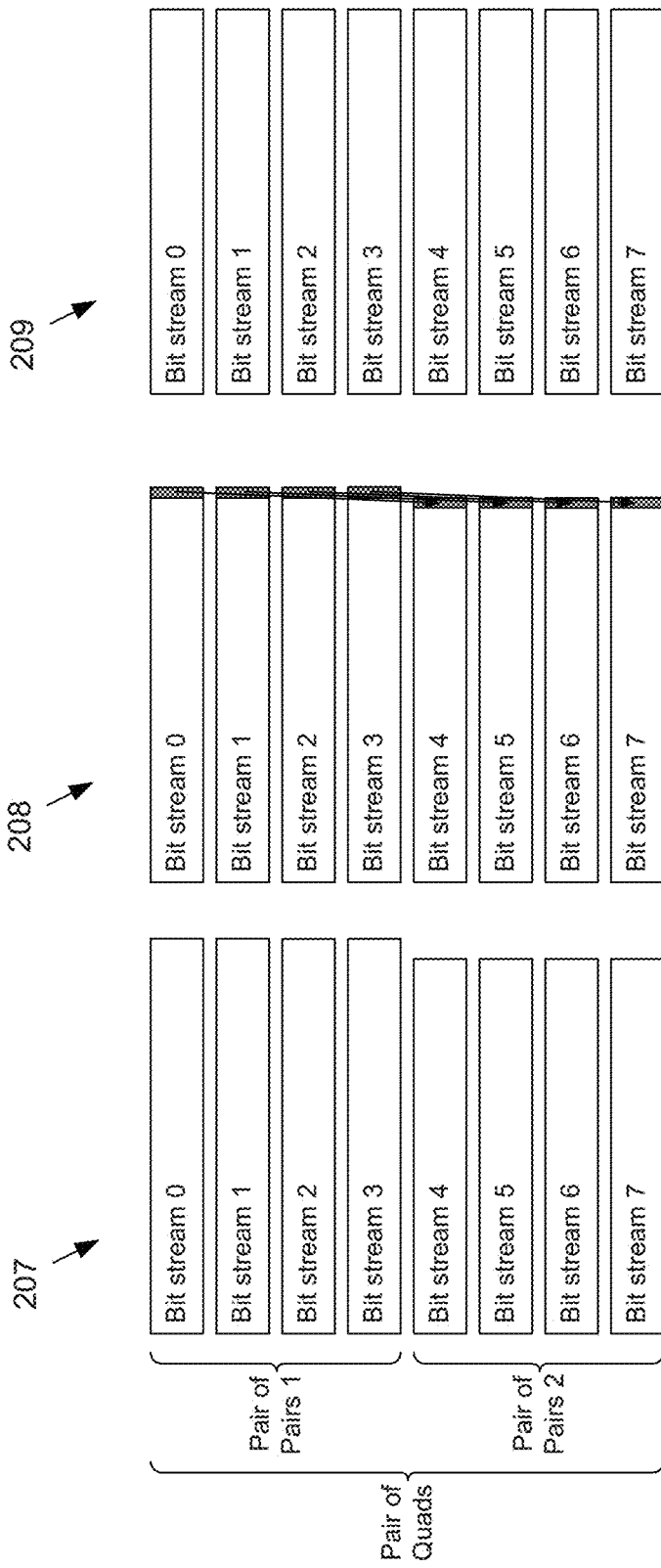

FIGS. 2A-2C conceptually depict eight example bit streams of different bit-stream lengths being recursively packed to become eight bit streams each having equal bit-stream lengths according to the subject matter disclosed herein. The eight example bit streams 0-7, depicted at 201, generally have different bit-stream lengths and are input to the multiplexers $104_{00}$ to $104_{70}$ of, for example, the butterfly shuffler 101 in FIG. 1C. The bit streams 0-7 are paired, or grouped, into four pairs corresponding to the pairing of the input multiplexers.

At 202 in FIG. 2A, a leading portion, or head, of the longer bit-stream length of each pair is relocated, or redirected, through the butterfly shuffler 101 to be part of the shorter bit stream of the pair by controlling the multiplexers of the pair so that the pair of bit streams has equal bit-stream lengths. For example, a portion of bit stream 0 is redirected by the multiplexers of column C=0 to become part of bit stream 1. Similarly, a portion of bit stream 2 is redirected to become part of bit stream 3. A portion of bit stream 4 is redirected to bit stream 5, and a portion of bit stream 7 is directed to be part of bit stream 6. In situations in which the difference in bit-stream lengths of a pair of bit streams is an odd number of bits, a dummy, or filler, bit may be added to the shorter of the two bit streams. The pairs of bit streams having equal bit-stream lengths within the pairs are depicted at 203, and are output from the multiplexers of column C=0. The gray regions indicated at 203 represent portions of bit streams that have been redirected to become part of another bit stream. The resulting streams at 203 may be generated by column C=0 of a butterfly shuffler 101. A clock enable input of the multiplexer modules 104 may be used to prevent the shift registers from clocking in invalid bits, while holding buffered data until it is time to start shifting the buffered data out. Also, the bit stream lengths for each compressed data block should be known before butterfly packing begins.

At 204 in FIG. 2B, the pairs of bits streams having equal bit-stream lengths within the pairs are input to the multiplexers $104_{01}$ through $104_{71}$ in the second column (column C=1) of the butterfly shuffler 101. The pairs of bit streams are further paired, or grouped, into two pairs of pairs corresponding to the pairing of the multiplexers in the second column of the butterfly shuffler 101.

At 205, a portion of each of bit streams of the pair of bit streams that has the longer bit-stream length are relocated, or redirected, to respectively be part of the pair of bit streams having the shorter bit-stream length by controlling the multiplexers of the second column. For example, a portion of each of the bit streams of the first pair of pairs (pair of pairs 1) is redirected by the multiplexers of the second column to respectively become part of the shorter bit streams of the first pair of pairs of bit streams. Similarly, a portion of each of the bit streams of the second pair of pairs (pair of pairs 2) is redirected by the multiplexers of the second column to respectively become part of the shorter bit streams of the second pair of pairs of bit streams. The pairs of pairs of bit streams having equal bit-stream lengths within the pair of pairs are depicted at 206. The resulting streams at 206 may be generated by column C=1 of a butterfly shuffler 101.

At 207 in FIG. 2C, the pairs of pairs of bits streams having equal bit-stream lengths are input to the multiplexers $104_{02}$ through $104_{72}$ in the third column (column C=2) of the butterfly shuffler 101. The pairs of pairs of bit streams are further paired, or grouped, into a pair of quads of bit stream corresponding to the pairing of the multiplexers in the third column of the butterfly shuffler 101.

At 208, a portion of each of bit streams of the pair-of-pairs (quad) of bit streams having the longer bit-stream length are relocated, or redirected, to respectively be part of the pair-of-pairs (quad) of bit streams having the shorter bit-stream length by controlling the multiplexers of the third column of the butterfly shuffler 101. For example, a portion of each of the bit streams in the first quad is redirected by the multiplexers of the third column to respectively become part of the shorter bit streams in the second quad of bit streams. The bit streams now having equal bit-stream lengths are depicted at 209. The resulting streams at 209 may be generated by column C=2 of a butterfly shuffler 101.

Figures 3A, 3B:
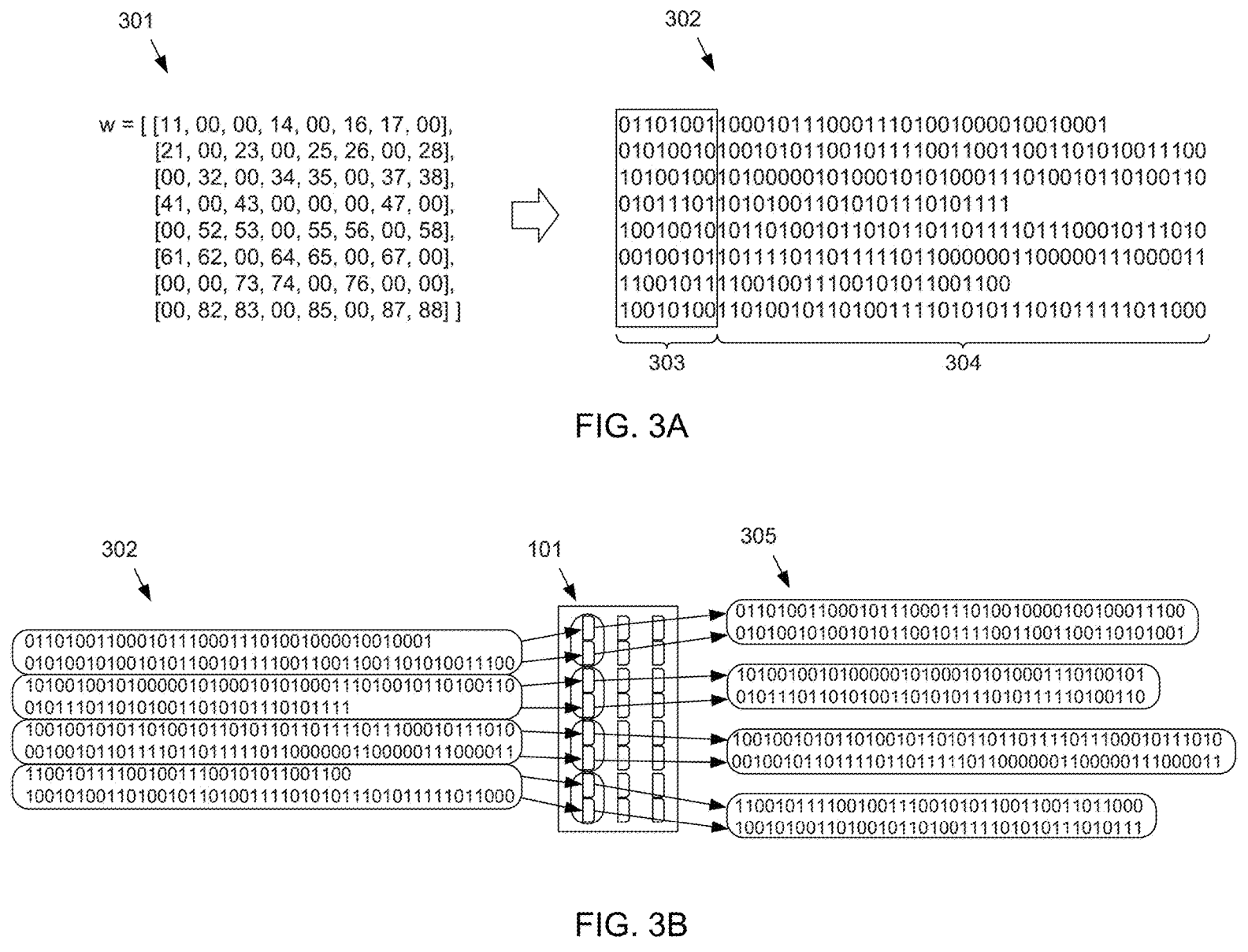

FIG. 3A depicts another example of data packing that involves an example block 301 of raw 8-bit data, such as an 8×8 set of weights, according to the subject matter disclosed herein. The set of weights 301 may include zero and non-zero values. A data compressor 103 (FIG. 1A) may compress the set of weights 301 to remove the zero values and provide, for example, a ZBM (Zero Bit Mask)-compressed multichannel bit stream 302 in which a channel corresponds to a row of the 8×8 set of weights. In another embodiment, the example block 301 may be a set of feature map values output from an activation function.

Each channel of the multichannel bit stream 302 may include a zero bit mask portion 303 in the first eight bits and a compressed data portion 304. In one embodiment, the non-zero bits in the zero bit mask portion 303 represent non-zero values of the set 301. Correspondingly, the compressed data portion 304 contains the weights 301, with their sequence order unchanged, except values of weights equal to zero have been omitted. The bit-stream length of each channel will generally be different from other ZBM-compressed channels. If the compressed data 302 is stored as is in memory, such as in volatile memory or non-volatile memory, the unequal bit-stream lengths of the different channels may waste memory space. The butterfly shuffler 101 may be used to pack the data to make the bit-stream lengths of the different channels equal. The logic of the data compressor 103 (FIG. 1A) may use the zero bit masks to compute the length of each bit stream and to control the paths through the butterfly shuffler 101 using controller 102.

In FIG. 3B, the multichannel bit stream 302 is input to the butterfly shuffler 101. A multichannel bit stream 305 is output from the first column of multiplexers of the butterfly shuffler 101. That is, a portion of the longer bit-stream length of each pair of channels is relocated, or redirected, under control of a controller 102 (FIG. 1A) to be part of the shorter bit stream of the pair so that each pair of bit streams has equal bit-stream lengths similar to that described in connection with FIG. 2A.

In FIG. 3C, the multichannel bit stream 305 is input to the multiplexers in the second column of the butterfly shuffler 101 and a multichannel bit stream 306 is output similar to that described in connection with FIG. 2B. In FIG. 3D, the multichannel bit stream 306 in input to the multiplexers in the third column of the butterfly shuffler 101 and a multichannel bit stream 307 is output similar to that described in connection with FIG. 2C. All of the channels of the multi-channel bit stream 307 have been packed to be equal lengths using the butterfly shuffler 101, and the block of data represented by the multichannel bit stream 307 may be efficiently stored in memory, whether volatile or non-volatile, without wasted space. Note that as a general concept for this example, the zero bit mask portion 303 in the first eight bits and a compressed data portion 304 of a channel remaining after processing by the butterfly shuffler 101 are stored together.

Instead of using the multiplexers 104 with outputs buffered by a shift register 110, multiplexers 110 alone (without shift registers 110), may be used to reduce circuit area and power. More specifically, each step depicted in FIGS. 2A through 2B and FIGS. 3A through 3B may be effected by having the bits streams buffered into a temporary memory, applying of permutation using a butterfly shuffler 101, and saving the permuted stream back into the temporary memory. Correspondingly, three passes of such processing may be needed to pack data in which each pass corresponds to one step in FIGS. 2A through 2B and FIGS. 3A through 3B.

Unpacking the packed data operates in reverse. A zero bit mask may be positioned to be first in each packed channel, so the packed non-zero data that follows the zero bit mask may be unpacked using the zero bit mask. More specifically, unpacking packed streams involves first determining lengths of original streams, which is readily available from zero bit mask 303 at the beginning of a packed block, followed by reproducing the calculations performed during packing when stream lengths within pairs (or pairs-of-pairs, or pairs-of-pairs-of-pairs) were compared to determine which head of which stream is to be cropped-and-appended to which stream. At that time, the difference between stream lengths was determined or calculated, divided by two to determine the length of the head to be cropped-and-appended, with optional padding to avoid having fractional part after division. The calculations provide offsets into packed streams pointing to where each cropped-and-appended head may be located in storage. During unpacking, the butterfly shuffler 101 may be controlled to swap back cropped heads between channels to restore original streams. Note that multiplexers may need to register data and a bit stream flow in a shorter channel may need to be stalled while a head is re-appended from the shorter channel to the original stream of the head.

Figure 4:
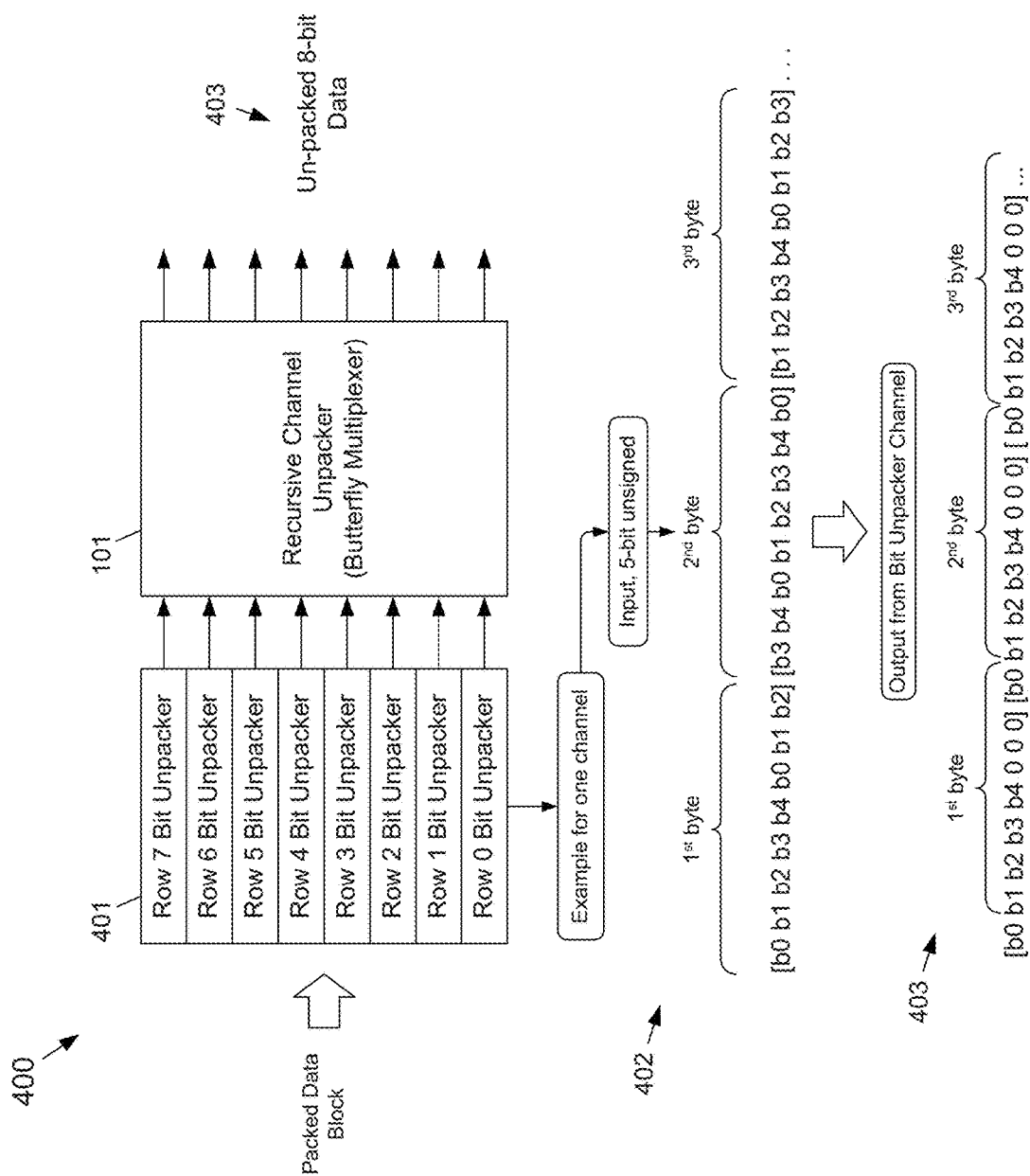
FIG. 4 depicts a block diagram of an example data unpacker according to the subject matter disclosed herein.

FIG. 4 depicts a block diagram of an example data unpacker 400 according to the subject matter disclosed herein. The data unpacker 401 may include a bit unpacker 401, a butterfly shuffler 101 and a controller (not shown in FIG. 4; see, for example, the controller 102 in FIG. 1A).

The bit unpacker 401 receives a block of packed non-zero data as a multichannel signal. In one embodiment, the unpacker 400 depicted in FIG. 4 may be configured for 8 channels of packed data. Each channel of the bit unpacker 401 may include two 8-bit registers and eight 8:1 1-bit multiplexers that operate independently from other channels of the bit unpacker 401. The packed data may be an n-bit integer. For example, for n=5, the packed data can be an int5 or a uint5 type, in each channel. Un-packed data in computer systems, however, typically has the granularity of one byte, i.e., int8 or uint8. In this case, 5-bit data may be transformed (padded) into 8-bit data before unpacking. As an example, the packed data may be 5-bit unsigned data, which is depicted at 402. The bit unpacker 401 adds, in this example, three zero bits to the most significant bits (MSBs) of each packed data byte to form 8-bit bytes of unsigned data at 403.

The output of the bit unpacker 401, which includes the 8-bit zero bit mask for each channel, is input to a recursive channel unpacker, which may be the butterfly shuffler 101 in FIG. 1C. In this particular example, each channel of the butterfly multiplexer has a width of one byte, as opposed to one bit, as discussed earlier. The controller (i.e., controller 102) uses the zero bit mask of each channel to control the data paths through the butterfly shuffler 101 to form unpacked multichannel 8-bit data (i.e., weights, feature map values, etc.) at 404.

Figure 5:
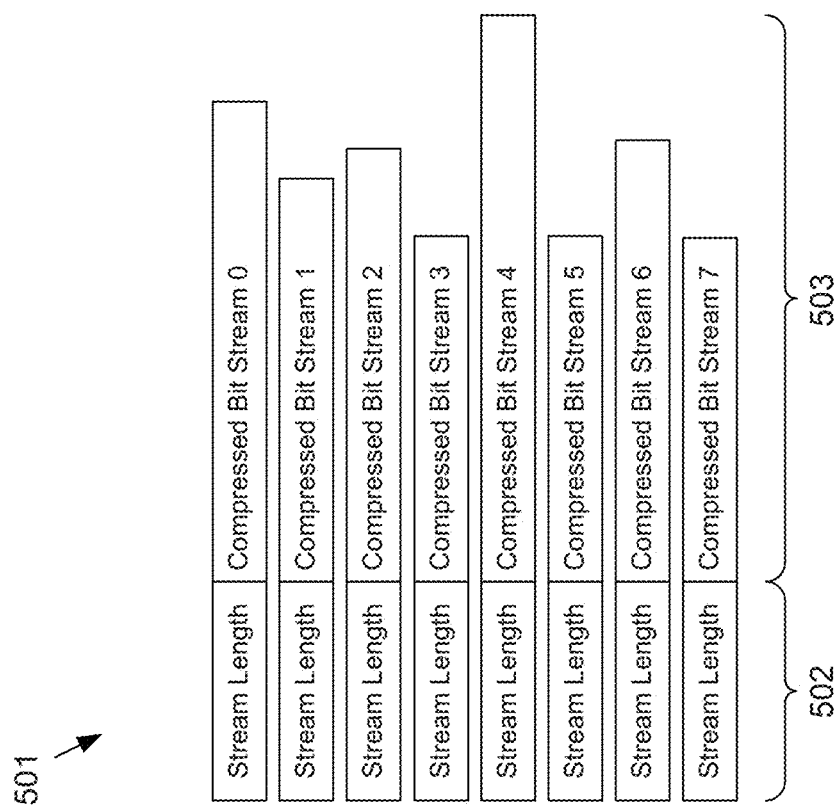
FIG. 5 depicts a data block that includes a stream length portion and a compressed data portion according to the subject matter disclosed herein.

In an alternative embodiment, rather than using encoded data having a fixed bit length and in which zeros are skipped, the subject matter disclosed herein may be extended to an encoding technique having a data length that provides a variable bit width. For example, if the data was pre-compressed using Golomb Rice coding or using Sparse Exponential Golomb Rice coding, the zero bit mask 303 (FIG. 3A) may be replaced by a data portion indicating a length of the stream and a full stream length when stored unpacked. FIG. 5 depicts a data block 501 that includes a stream length portion 502 and a compressed data portion 503 according to the subject matter disclosed herein. Packing the compressed streams may be performed as disclosed herein. The stream-length bit width should be selected to accommodate longest-possible variable-length sequence.

In an alternative embodiment, the output feature maps and/or the outputs from activation functions may be shuffled (while storing weights also pre-shuffled) using a butterfly shuffler disclosed herein to spread out (i.e., balance) zero-values across lanes that may be output from the activation functions to better utilize multipliers as described elsewhere herein.

Figure 6A:
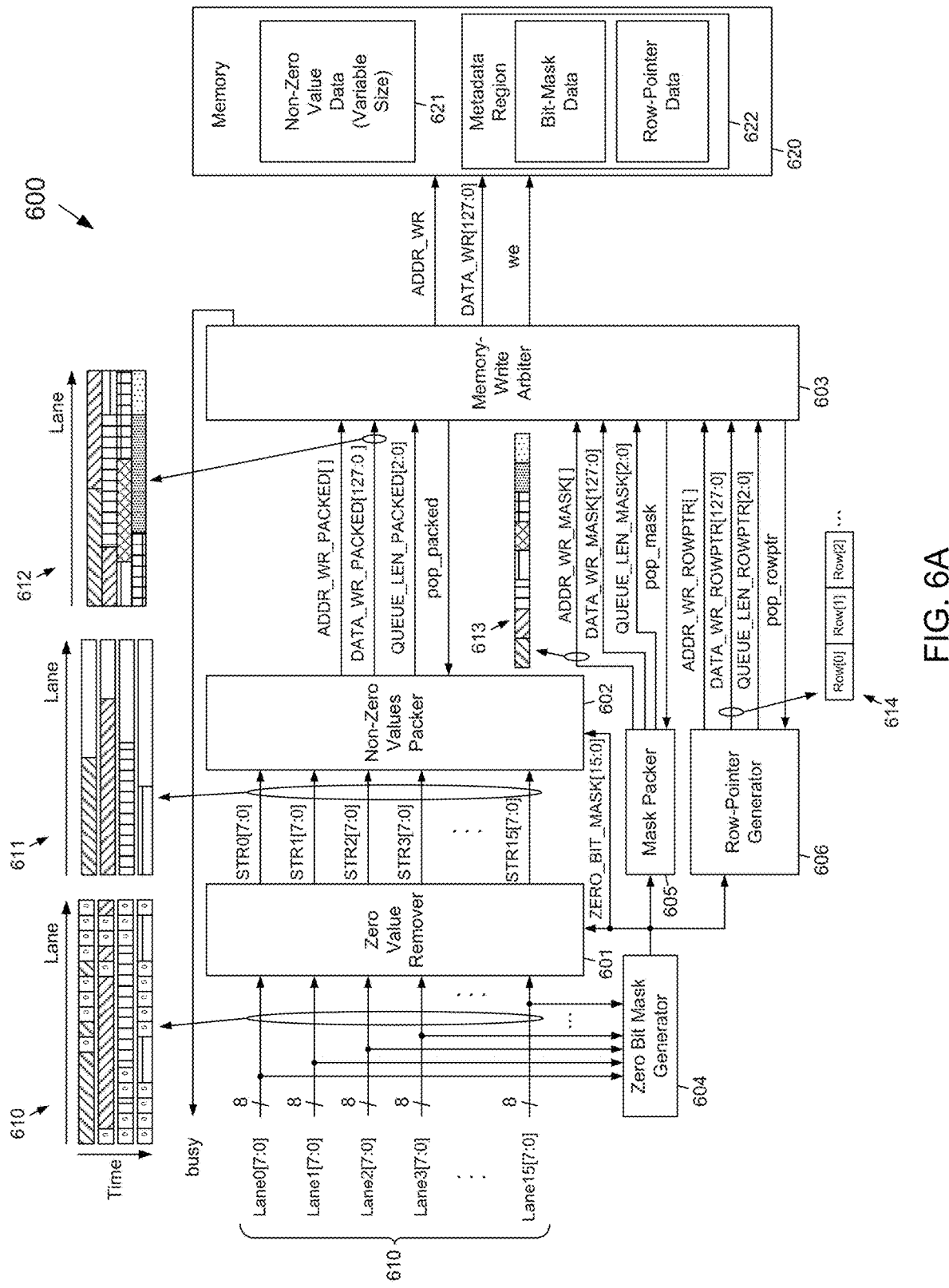
FIG. 6A depicts a block diagram of an example embodiment zero-collapsing data compressor and packing circuit that provides random access to the packed data according to the subject matter disclosed herein.
Figure 6B:
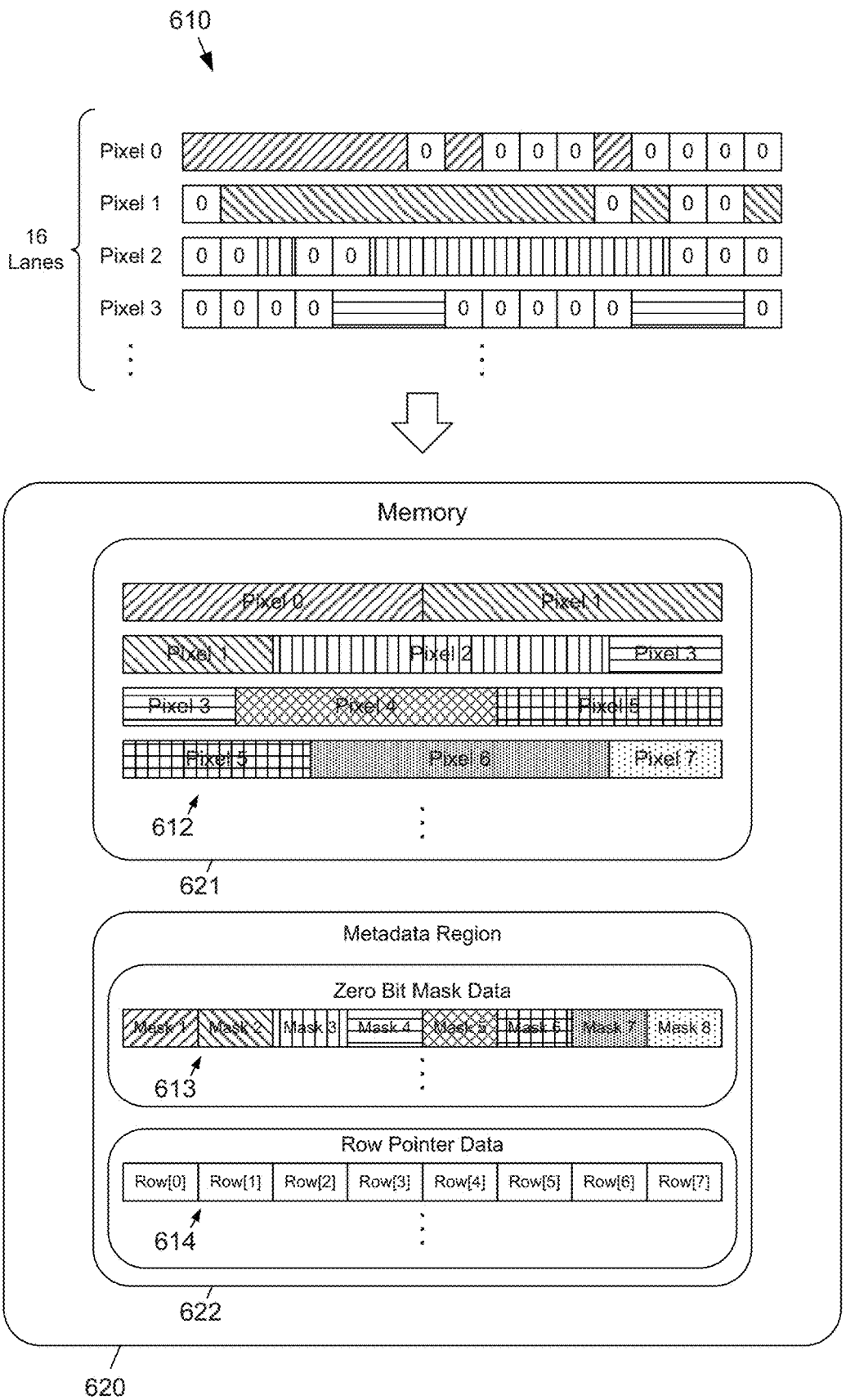
FIG. 6B depicts an example compression of data with random access of the compressed data provided by the zero-collapsing data compressor and packer circuit of FIG. 6A.

FIG. 6A depicts a block diagram of an example embodiment zero-collapsing data compressor and packing circuit 600 that provides random access to the packed data according to the subject matter disclosed herein. FIG. 6B depicts an example compression of data with random access of the compressed data provided by the zero-collapsing data compressor and packer circuit 600.

Referring to both FIGS. 6A and 6B, the circuit 600 may include a zero-value remover 601, a non-zero values packer 602, a memory-write arbiter 603, a zero bit mask generator 604, a mask packer 605, and a row pointer generator 606. The various components forming the circuit 600 (including the circuit 600 as a whole) may be implemented as one or more circuits and/or as one or more modules.

The zero-value remover 601 may receive, for example, 16 lanes (i.e., Lane0[7:0]-Lane15[7:0]) or channels of stream data 610. Each lane of the stream data 610 may include 8-bits (one byte) values of uncompressed non-zero value data and zero-value data. The data stream 610 may be subdivided into groups, each group having a length of 16 bytes, such that the packing circuit 600 operates on blocks of data of size 16 bytes by 16 lanes. Example non-zero value data is indicated in FIGS. 6A and 6B by cross-hatching or shading, and zero-value data is indicated by a "0". In one embodiment, the 8-bit values may correspond to pixel data. The zero-value remover 601 may be configured to remove the zero-value data from each data stream 610. The zero-value remover 601 outputs 16 data streams STR0[7:0]-STR15[7:0] in which the respective data streams have the zero byte values removed.

Figure 6C:
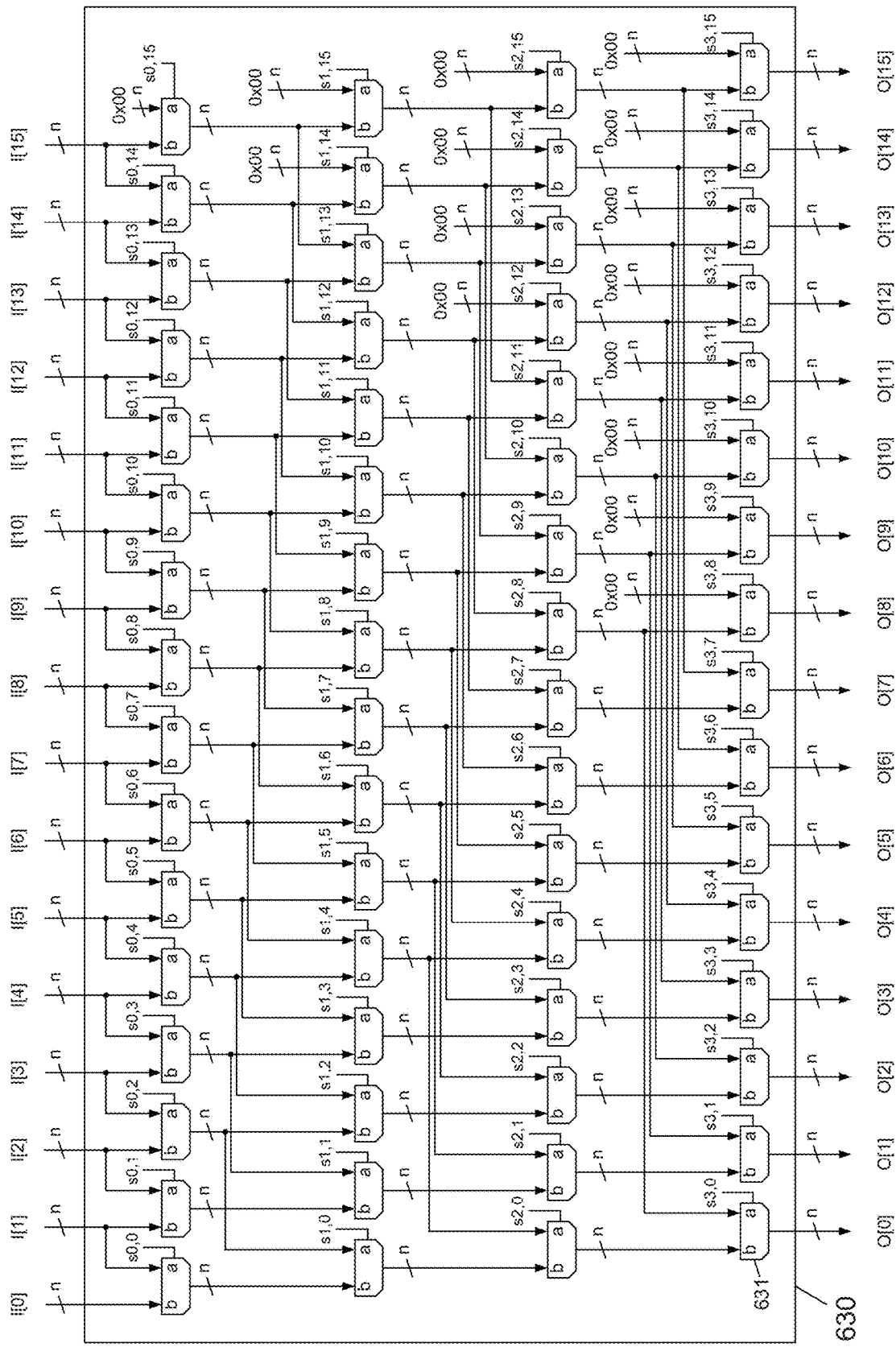
FIG. 6C depicts a block diagram of an example embodiment of a zero value remover that uses a zero-collapsing shifter according to the subject matter disclosed herein.

FIG. 6C depicts a block diagram of an example embodiment of a zero value remover 601 (FIG. 6A) that uses a zero-collapsing shifter 630 according to the subject matter disclosed herein. One purpose of the zero-collapsing shifter 630 is to remove zeros from an input vector. For example, if an input vector is formed from bytes having the values {0x01, 0x02, 0x0, 0x04, 0x5, 0x06, 0x07}, the zero-collapsing shifter 630 transforms this input vector to an output vector having byte values {x01, 0x02, 0x04, 0x05, 0x06, 0x07, 0x00}. Note that the zero value in the third position (as counted from the left) was taken out ("collapsed"), the non-zero values in positions 4, 5, 6 and 7 were all shifted by one position to the left, and the zero-value byte was moved from the third position to the end of the vector at position 8.

In another example, an input vector having values {0x01, 0x02, 0x00, 0x04, 0x05, 0x00, 0x00, 0x08} is transformed by the zero-collapsing shifter 630 to be an output vector having values {x01, 0x02, 0x04, 0x05, 0x08, 0x00, 0x00, 0x00}. Here the zeros at position 3, 6 and 7 in the input vector are "collapsed" and moved to positions 6, 7 and 8 in the output vector. The remaining non-zero elements are shifted left as necessary to fill the voids left by "collapsed" zeros with the order of non-zero elements preserved. In still another example, if none of the input values are zero, the output will be identical to the input.

As described previously, one purpose of the zero-collapsing shifter 630 is to enable storing only non-zero values in the memory 620 (FIG. 6A), while using a zero bit mask to keep track of original locations of zero values, so that compressed data (i.e., data having zero values removed) may be decompressed in a lossless fashion.

Consider a vector I[m−1 . . . 0][n−1 . . . 0] having m values that is input to the zero-collapsing shifter 630. The bit width n of all m values is same and selected to match the bit width of data to be processed. For example, in one example embodiment, the values may be set to m=16 and n=8 thus making I[15 . . . 0][7 . . . 0]. Let the output of the zero-collapsing shifter 630 be vector O having m values, O[m−1 . . . 0][n−1 . . . ]. Both vectors I and O have same length m, and all elements of vectors I and O have same bit width n.

A zero-collapsing shifter 630 having m=$2^N$ inputs (channels) may be implemented as a multistage interconnection network that may include a matrix of multiplexers 631 (of which only one multiplexer 631 is indicated) accompanied with control logic. More specifically, in one embodiment, a zero-collapsing shifter 630 having m=$2^N$ inputs (channels) may include a matrix of 2:1 multiplexers 631 organized into m columns (channels) and N rows, as depicted in FIG. 6C.

Figure 6D:
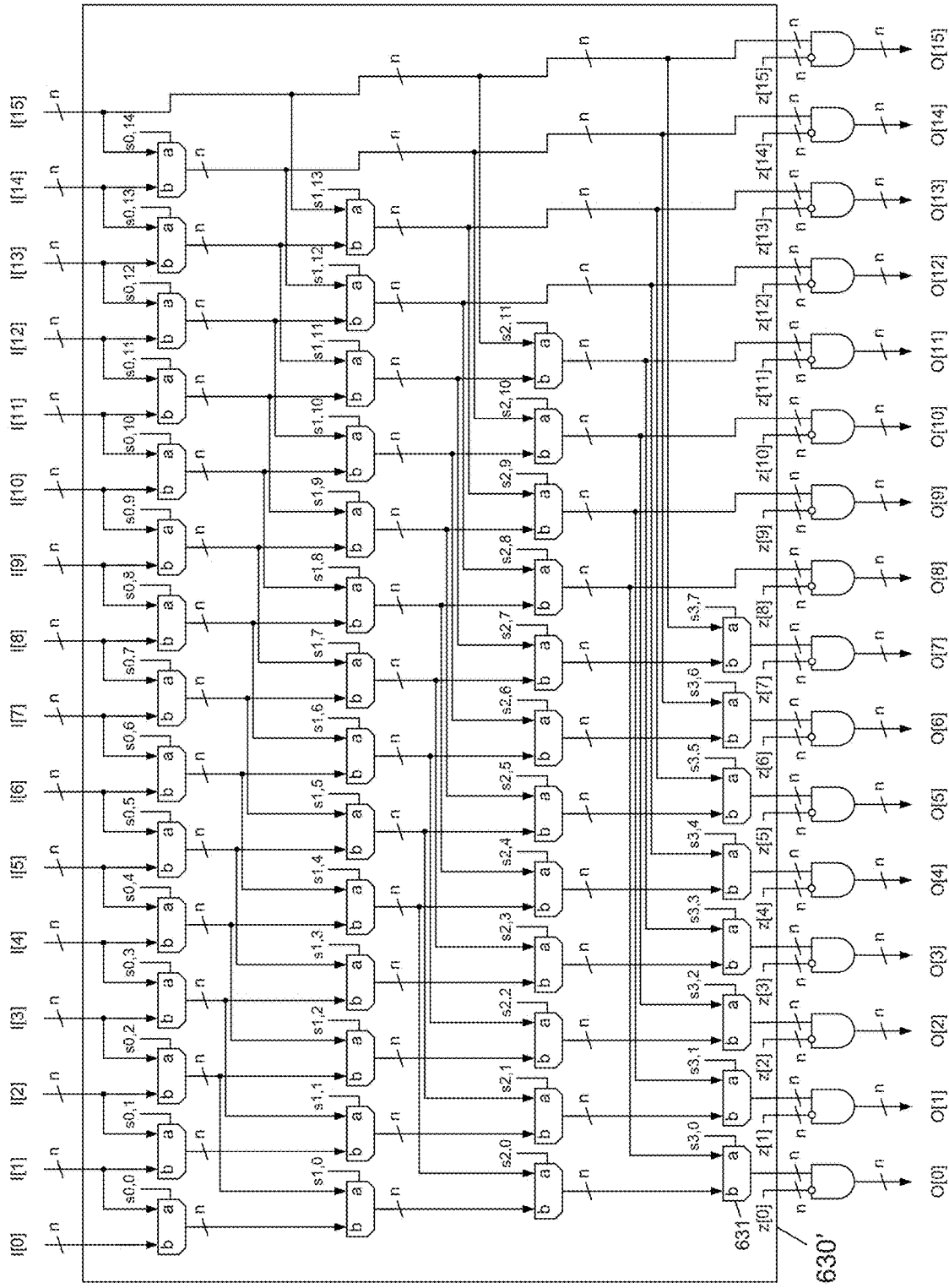
FIG. 6D depicts a block diagram of an example alternative embodiment of a zero value remover that uses a zero-collapsing shifter according to the subject matter disclosed herein.

For clarity of explanation, m may be a power of N in which N is a natural number, e.g., N=4. The zero-collapsing shifter 630 having a number of inputs m that is not equal to a power of 2 can be equivalently represented by using a zero-collapsing shifter 630' having k inputs in which k=$2^N$>m and in which the unused I[k . . . m−1] inputs are set to zero and the unused outputs O[k . . . m−1] are left disconnected, as depicted in in FIG. 6D.

The control logic may include a zero bit mask generator 604, e.g., as depicted in FIG. 6A, and a generator (not shown) of select signals for each multiplexer in the multiplexer matrix. The zero bit mask generator 604 may check each input channel to determine whether the value of the channel is equal to zero. The zero bit mask generator 604 outputs a vector Z[0 . . . m−1] of one-bit signals in which each active-high signal indicates that the value of the corresponding input channel equals to zero. Subsequently, the select signal generator logic converts Z[0 . . . m−1] into control values for select signals s for all multiplexers 631 in the multiplexer matrix, as described in more detail below.

The select signals s may be defined in the shape of a matrix, s[row][channel] in which row=0 . . . N−1, channel= 0 . . . m−1. Referring to FIG. 6C, s[0][0] is located in the upper-left corner and s[3][15] is located in the lower-right corner. The determination of the select signals s[row][channel] from Z[0 . . . m−1] proceeds as follows.

Initially, all multiplexer select signals are set to zero, that is, s[0 . . . N−1][0 . . . m−1]:=0. A count of zero-valued channels nz_ch is also initialized to equal zero, that is, nz_ch:=0. Next, the multiplexer select signals s[row][col] are configured to properly route values from non-zero input channels to output channels. To do this, the channels are iterated, starting from channel ch:=0, while keeping a count of zero-valued channels in nz_ch. As a matter of notation, note that setting multiplexer select signals for a matrix location s[row][col]:=x is equivalent to s[row][ch][0 . . . n−1]:=n{x}, i.e., the value of a bit x replicated to the width of n, as written in Verilog notation. Therefore, for brevity the notation of s[row][col]:=x will be used herein in place of s[row][ch][0 . . . n−1]:=n{x} where suitable.

If I[ch] !=0, then nz_ch count is incremented, the current value of nz_ch is converted to binary notation nz_ch_bin[0 . . . N−1], the current multiplexer select channel is initialized to ch_current:=ch, and starting from row=0 nz_ch_bin[0 . . . N−1] is iterated. The iteration loop first sets s[row][ch_current]:=nz_ch_bin[row], then checks whether nz_ch_bin[row]==1. If the condition is determined to be true, referring to FIG. 6C or FIG. 6D, follow laterally (horizontally) the wire from the output of the multiplexer corresponding to s[row][ch_current], to the left in the multiplexer select matrix s, by setting ch_current:=ch_current− $2^{row}$. If the condition is false, i.e., if s[row][ch]==0, then the nz_ch counter is incremented and multiplexer select signals are configured to output O[m−nz_ch]:=0, as described in detail below.

For example, consider ch_z:=m−nz_ch. In the example embodiment of FIG. 6D, setting O[ch_z]:=0 may be accomplished by decoding ch_z into z[0 . . . m−1][0 . . . n−1], such that z[0 . . . ch_z−1][0 . . . n−1]:=0, z[ch_z . . . m−1][0 . . . n−1]:=1, and applying bit-wise logical "and" O[0 . . . m−1][0 . . . n−1]:=s[N−1][0 . . . m−1][0 . . . n−1] AND !z_and[0 . . . m−1][0 . . . n−1].

In the example embodiment depicted in FIG. 6C, instead of adding AND gates to zero out the output of the zero-collapsing shifter 630, the existing multiplexer matrix may be used to zero out outputs of interest. Specifically, if (nz_ch==m), then do nothing (i.e., all channel inputs are zero), otherwise iterate over rows N−1 . . . 0 as follows. If ch_z≥m, the calculation has completed, otherwise set select signal s[row][ch_z]:=1 in which the row is the current row number and check whether the zero value for multiplexer s[row][ch_z] is being received over a lateral connection. The zero value check includes setting lateral_distance:=$2^{row}$, i.e., the length of lateral connections in this row, expressed in channels, followed by setting ch_z:=m−lateral_distance, i.e., the number of the channel that might be passing a zero to a select signal s[row][ch_z] over a lateral connection. If ch≥ch_z, then the calculation is finished; otherwise if (ch_z+ lateral_distance<m), then set ch_z:=ch_z+lateral_distance, i.e., if the lateral connection exists (from multiplexer s[row] [ch_z+lateral_distance] to s[row][ch_z]), follow that connection to configure multiplexer select signal of s[row] [ch_z+lateral_distance] in the next iteration.

Figure 6E:
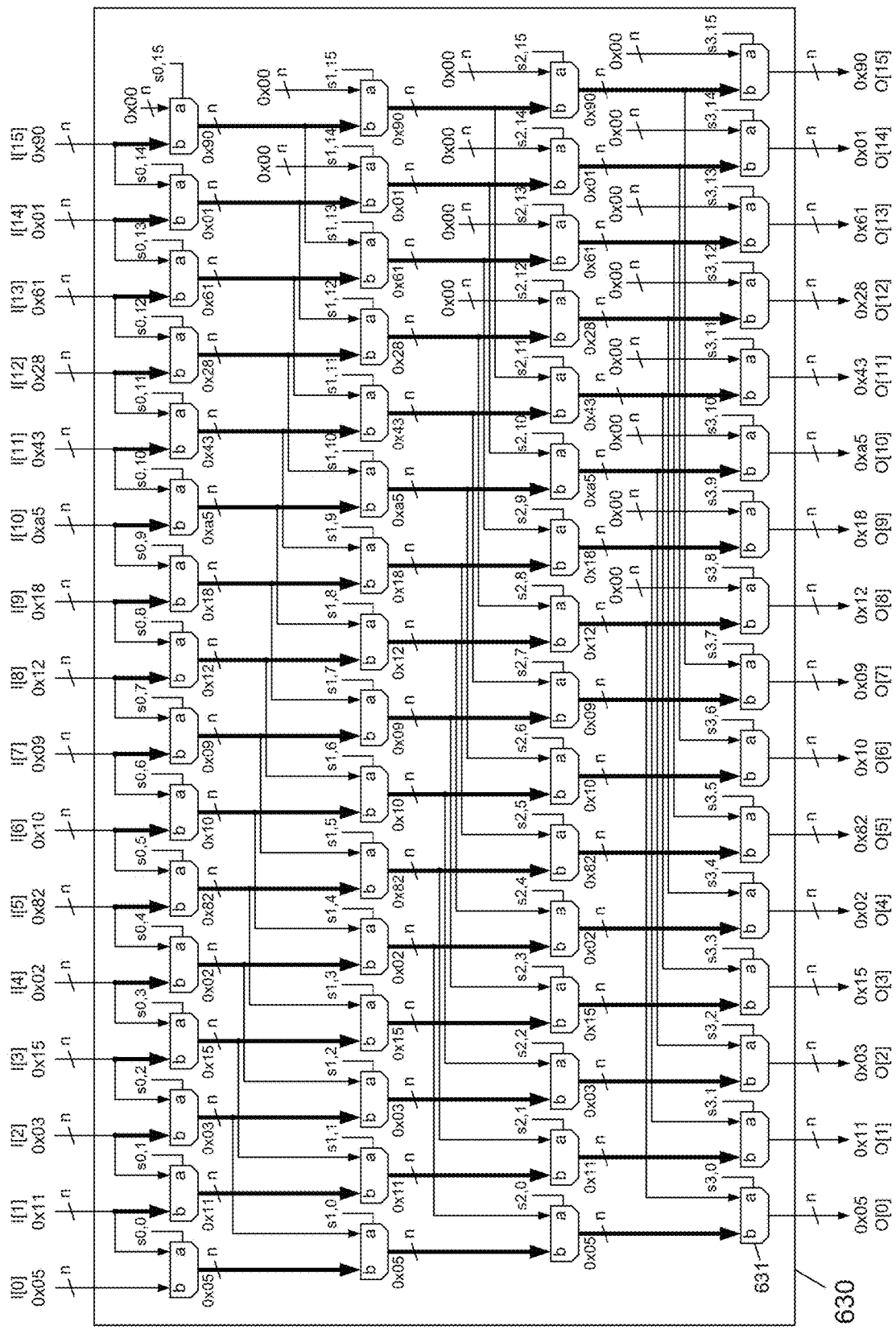
FIG. 6E depicts an example embodiment of a zero-collapsing shifter according to the subject matter disclosed herein in which all channels receive non-zero values.

FIG. 6E depicts a situation in which all channels of the zero-collapsing shifter 630 receive non-zero values. In this case, all multiplexer select signals s[row][ch]:=0 and the output O[0 . . . m−1][0 . . . n−1] of the zero-collapsing shifter 630 is identical to the input I[0 . . . m−1][ . . . n−1]. In FIGS. 6E-6J, a signal path that has a relatively heavier line weight indicates the path a particular input value takes through the zero-collapsing shifter 630 to the output.

Figure 6F:
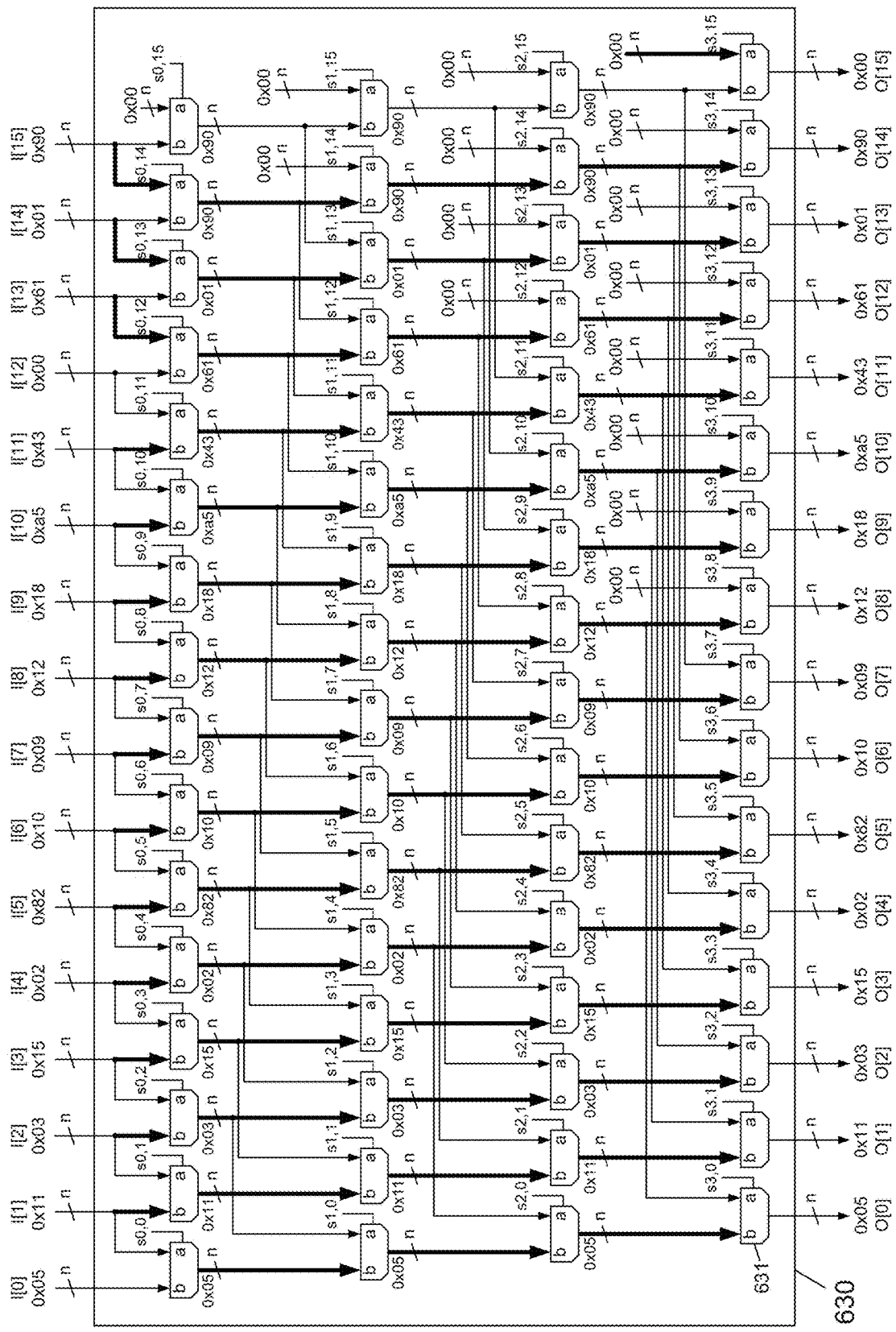
FIG. 6F depicts an example embodiment of a zero-collapsing shifter according to the subject matter disclosed herein in which one channel (channel 12) receives a zero-value input.
Figure 6G:
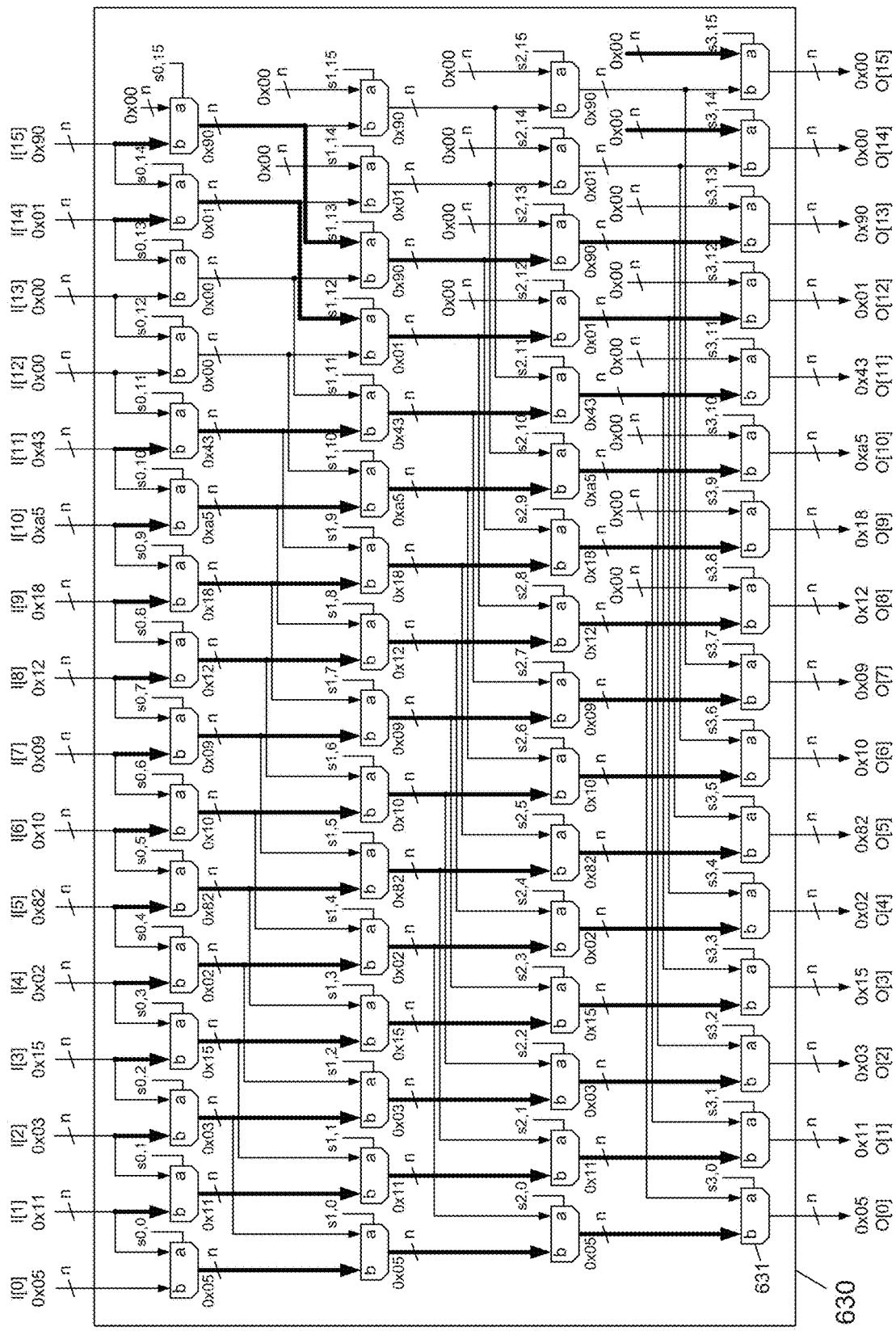
FIGS. 6G-6J respectively depict an example embodiment of a zero-collapsing shifter according to the subject matter disclosed herein for additional more advanced cases in which the channels receive progressively more zero values.
Figure 6H:
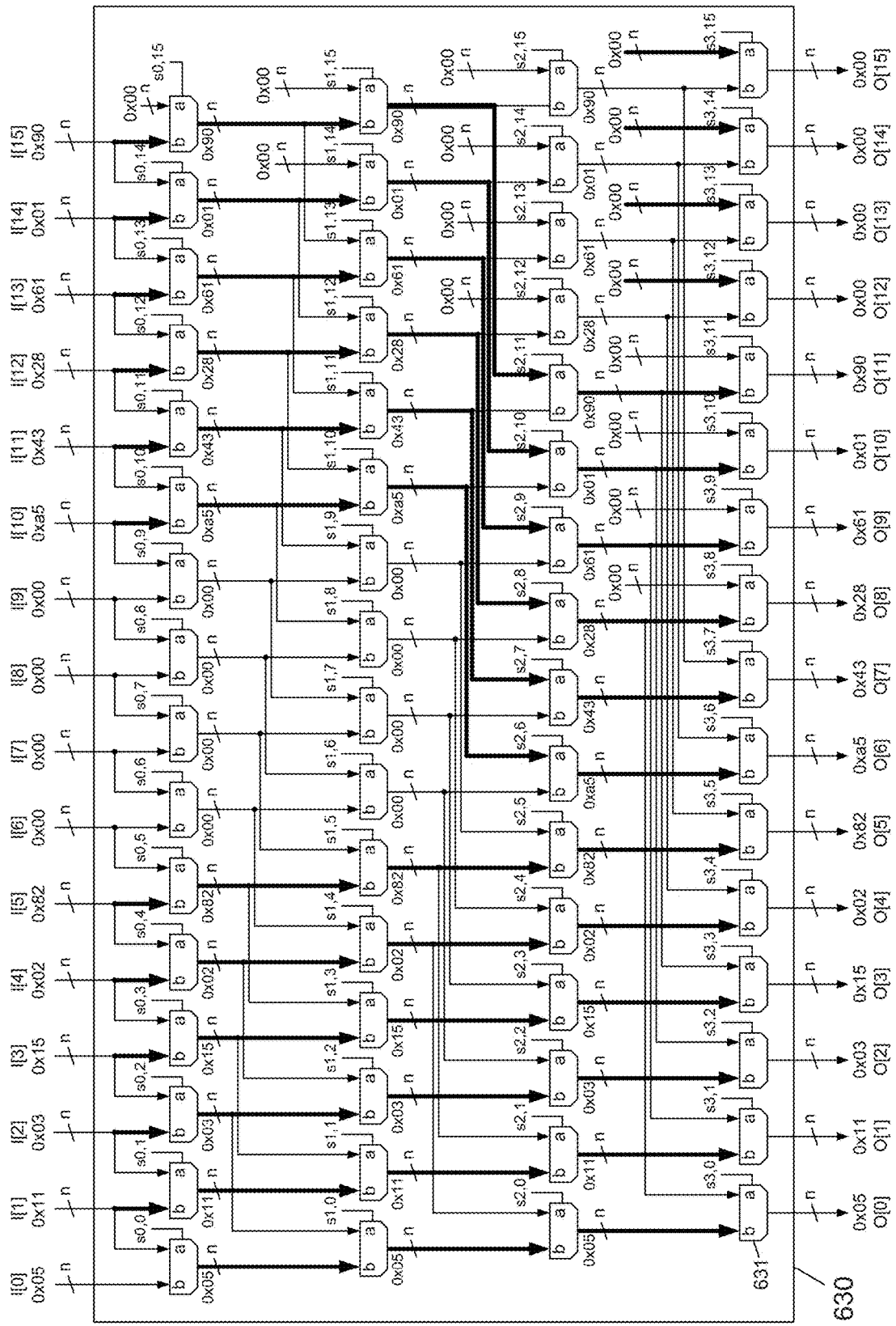
Figure 6I:
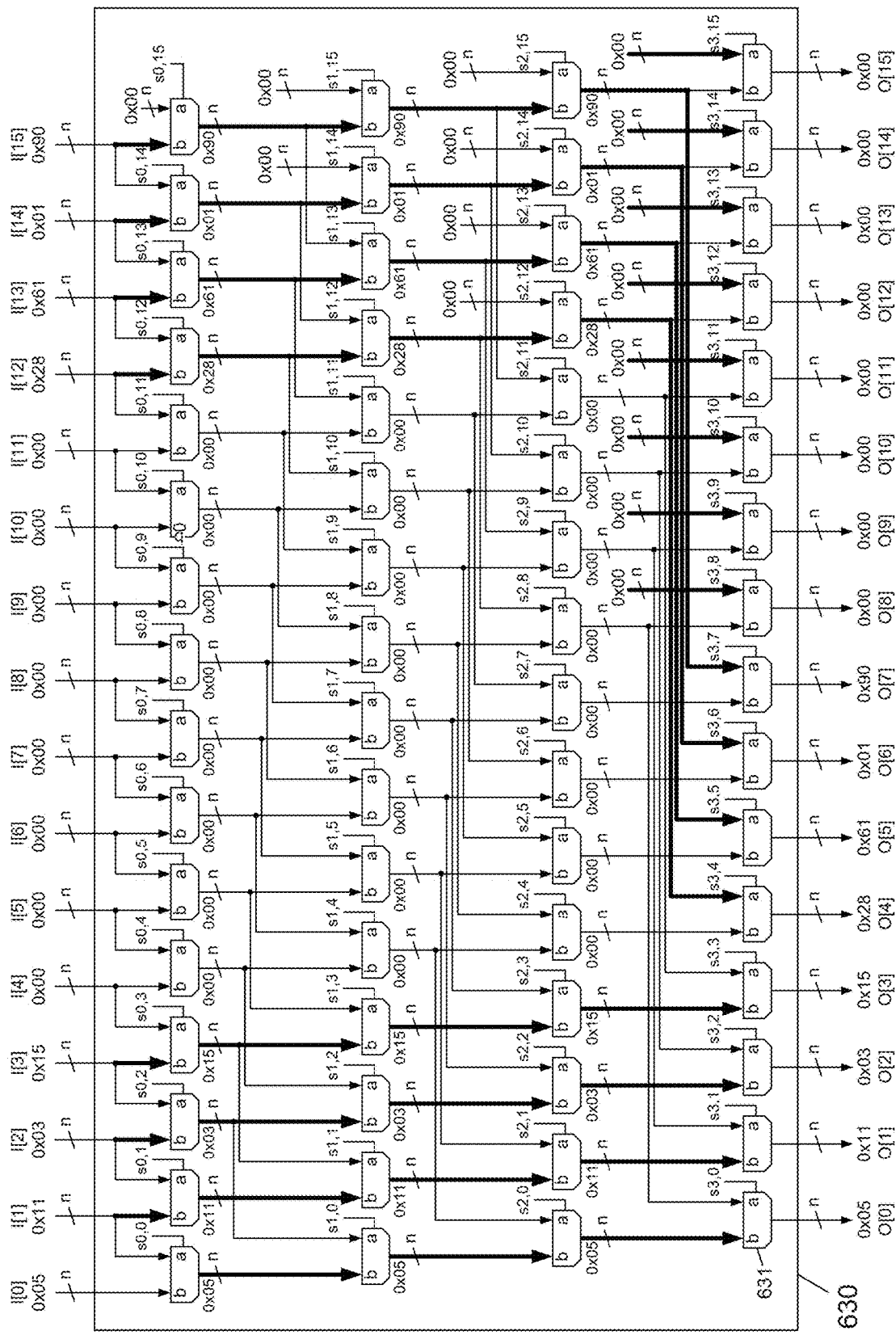
Figure 6J:
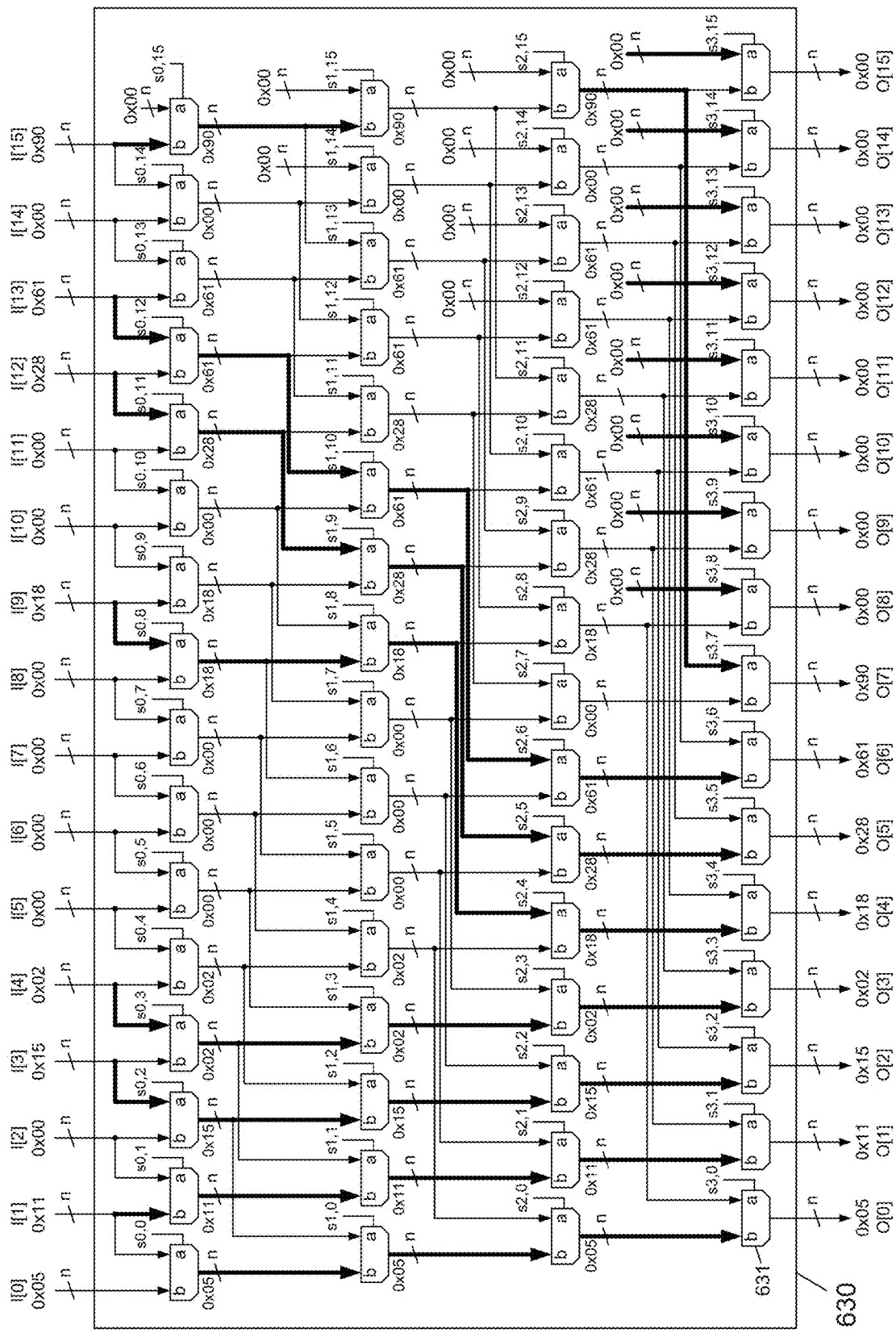

FIG. 6F depicts a situation in which channel 12 receives a zero-value input, while the rest of channels receive non-zero value inputs, i.e., I[12][0 . . . n−1]==0. Following the multiplexer select algorithm described above, s[ . . . N−1][0 . . . m−1]:=0 is initialized. Next, the multiplexers 631 are configured to output non-zero values correctly. Specifically, the channels are iterated, starting from channel ch:=0, while keeping a count of zero-valued channels nz_ch. As channel ch==12 is reached, which receives a zero, I[12]==0, nz_ch is incremented from 0 to nz_ch:=1, nz_ch is converted to binary notation nz_ch_bin[0 . . . N−1]:=1000b, the current multiplexer select channel ch_current:=12 is initiated, and nz_ch_bin[0 . . . N−1]==1000b is iterated, starting from row=0.

The iteration loop includes setting s[row][ch_current]:=nz_ch_bin[row]. Since nz_ch_bin[0]==1b, I[0][12]:=1b. Since nz_ch_bin[0]==1b, the multiplexer selects matrix s from multiplexer s[row][ch_current] (i.e., the output wire of the multiplexer that is controlled by select signal s[row][ch_current], as shown in FIG. 6F) is followed laterally to the left to s[row][ch_current−$2^{row}$], i.e., from select signal s[0][12] to select signal s[0][12−$2^0$]==s[0][11], setting ch_current:=ch_current−$2^{row}$==12−$2^0$==1. The remaining rows 1 . . . 3 are iterated in bit vector nz_ch_bin[1 . . . N−1] to yield all zeros, i.e., nz_ch_bin[1 . . . N−1]=000b. Therefore, no more changes are made to multiplexer select signals in this step.

At channel ch==12, the multiplexer select signals are also configured to output a zero from channel ch_z:=(m−nz_ch)==16−1==15. In embodiment of FIG. 6D, o[m−nz_ch][0 . . . n−1]:=0, i.e., z[16−1][0 . . . 7]:=0. In embodiment of FIG. 6C, rows 3 . . . 0 are iterated as follows. For row:=4, it is determined whether ch≥m, which is false (otherwise the computation would stop), [row][ch_z]:=1 is set, i.e., s[3][15]:=1 and a check whether multiplexer s[3][15] does not receive zero input over a lateral connection is performed. The lateral connection length in row 3 equals lateral_distance:=$2^3$==8 channels. If a lateral connection existed for the multiplexer signal s[3][15], the multiplexer signal s[3][15] would receive that zero value from multiplexer signal s[row−1][ch_z+lateral_distance], i.e., s[3−1][15+8]==s[2][23]. The multiplexer signal s[2][23] does not exist since column 23 exceeds the total number of columns n==16. Therefore, iteration continues over the remaining rows 2, 1 and 0. Lateral connection lengths for rows 2, 1 and 0 equal to $2^{row}$, which is 4, 2 and 1. In all these cases, a lateral connection does not exist because (ch_z+4)>n, (ch_z+2)>n and (ch_z+1)>n, i.e., (15+4)>15, (15+2)>15 and (15+1)>15. Thus, the calculation is completed.

FIGS. 6D through 6J depict additional more advanced cases for when the channels receive progressively more zero values.

Figure 7:
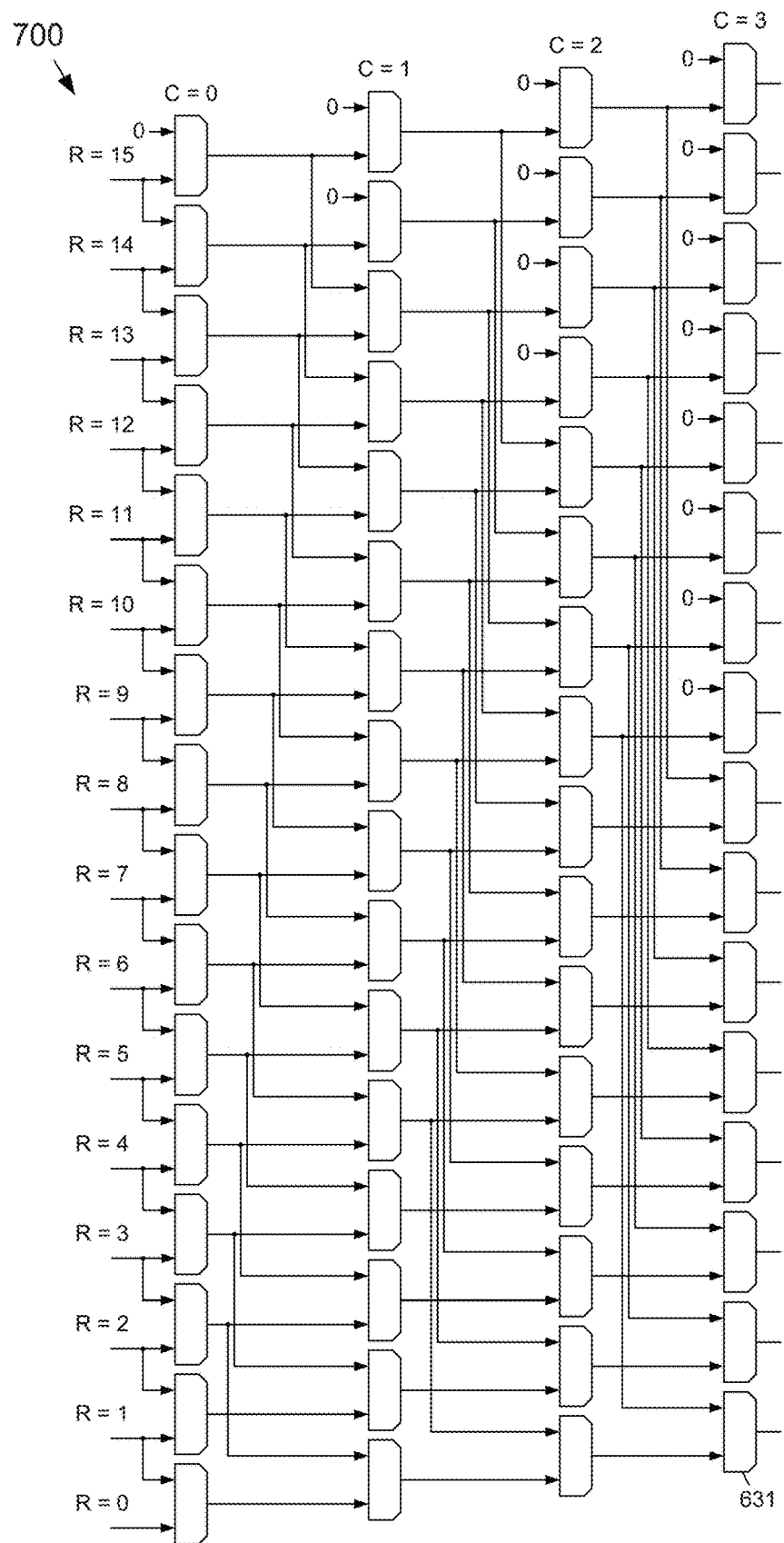
FIG. 7 depicts a block diagram of an example circuit that may be used to remove zeros values from a bit stream according to the subject matter disclosed herein.

FIG. 7 depicts a block diagram of an example circuit 700 that may be used to remove zeros values from a bit stream according to the subject matter disclosed herein. The circuit 700 may include 64 2-to-1 8-bit multiplexers 701 arranged in an array of 16 rows (R=0 through R=15) and 4 columns (C=0 through C=3). The inputs to the multiplexers 701 are configured to receive n=8 bits as shown in FIG. 7. In column C=0, one of the two inputs to the multiplexer 701 in row R=15 is connected to receive an 8-bit 0 value as an input. In column C=1, one of the two inputs to the multiplexers in rows R=14 and R=15 is connected to receive an 8-bit 0 value as an input. In column C=2, one of the two inputs to the multiplexers in rows R=12 to R=15 is connected to receive an 8-bit 0 value as an input. Lastly, in column C=3, one of the two inputs to the multiplexers in rows R=8 to R=15 is connected to receive an 8-bit 0 value as an input. The various components forming the circuit 700 (including the circuit 700 as a whole) may be implemented as one or more circuits and/or as one or more modules. The select signals controlling multiplexers 631 have been omitted.

The multiplexers 631 in the first column C=0 receive an 8-bit value of a respective data stream of the 16 data streams. The multiplexers of the first column are controlled so that a value that non-zero is shifted towards row R=0 to replace a value that equals 0 in a row that is adjacent to the non-zero value in the R=0 direction. That is, the values of the data streams input to the respective multiplexers 631 are detected and if a value is detected to be zero, a non-zero value an adjacent row may be shifted to replace the value detected to be zero.

Referring back to FIG. 6A, the example output of the zero-value remover 601 for the example input 610 is indicated at 611. Generally, the respective data streams may have different lengths after zero values have been removed. The non-zero values packer 602 receives the different-length data streams STR0[7:0]-STR15[7:0] and generates packed data DATA_WR_PACKED[127:0] in which the different-length data streams have been concatenated is depicted at 612. In one embodiment, the non-zero values packer 602 may include a butterfly shuffler, such as the butterfly shuffler 101 in FIG. 1C. The concatenated data may be held in a first-in, first out (FIFO) queue within the non-zero values packer 602 for eventual storage in a memory 620.

The zero bit mask generator 604 may be coupled to each of the 16 lanes of the bit streams Lane0[7:0]-Lane15[7:0]. The zero bit mask generator 604 generates a bit mask for each lane that indicates the position of a zero value in, for example, a 16-byte group of a corresponding bit stream. That is, the zero bit mask generator 604 generates a bit mask 613 for each 16-byte group in each lane Lane0[7:0]-Lane15[7:0]. One bit in the bit mask corresponds to one byte in the 16-lanes-by-16-bytes data block, thus making the bit mask itself 256 bits long. In an alternative embodiment, the bit masks generated by the zero bit mask generator 604 may be generated for groups of values of the bit streams that are a size that is different from 16-byte value groups. The information in the masks generated by the zero bit mask generator 604 may be used to control operation of the zero-value remover 601 and the non-zero values packer 602. A mask packer 605 receives the bit-mask data 613 and may concatenate the bit-mask data and for storage. The mask packer 605 also splits the concatenated bit-mask data into 16-byte words for storage as DATA_WR_MASK[127:0] in order to match the input width of the memory 620. The bit-mask data 613 may be held in a FIFO queue within the mask packer 605.

The row pointer generator 606 may also receive the zero bit mask data and may keep track of the non-zero value count to generate row-pointer data, as DATA_WR_ROW-PTR[127:0] indicated at 614. A row pointer is an offset into the memory 620 pointing to first pixel in each planar row within a tensor. For example, a tensor of layer activations may have a size of 64-by-128-by-32 bytes in which 64-by-128 corresponds to the layer planar size, i.e., height and width, and 32 corresponds to the number of depth channels in that layer. In this example, there may be 64 row pointers, one for each row in which each row pointer contains an offset into compressed data stored in the memory 620. The row-pointer data 614 may be held in a FIFO queue within the row-pointer generator 606. The compressed data stored in the memory 620 may be randomly accessed using the bit-mask data 613 and the row-pointer data 614.

The memory-write arbiter 603 receives the DATA_WR_PACKED[127:0], the DATA_WR_MASK [127:0], and the DATA_WR_ROWPTR[127:0] and arbitrates writing of the respective data to a memory 620. The memory 620 may be a volatile memory and/or a non-volatile memory, and may include a region or space 621 for the non-zero value data (that may vary in size), and a region or space for metadata 622 for the zero bit mask data and the row pointer data. The memory-write arbiter 603 may also receive an ADDR_WR_PACKED[ ] signal and a QUEUE_LEN_PACKED[2:0] signal from the non-zero values packer 602, an ADDR_WR_MASK[ ] signal and a QUEUE_LEN_MASK[127:0] signal from the mask packer 605, and an ADDR_WR_ROWPTR[ ] signal and a QUEUE_LEN_ROWPTR[2:0] from the row-pointer generator 606. The memory-write arbiter 603 determines what particular data and when that data is written to the memory 620 based on the values of the QUEUE_LEN_PACKED[2:0] signal, the QUEUE_LEN_MASK[2:0] signal and the QUEUE_LEN_ROWPTR[2:0] signal. For example, the memory-write arbiter 603 may select the data corresponding to the QUEUE_LEN signal with the largest value indicating, for example, that the associated FIFO contains the most data ready for storage into the memory 620. The amount of data selected to be written to the memory 620 for a write operation may be limited by a port width of the memory 620. In one embodiment, a write operation may include 16 bytes. In another embodiment, a write operation may include 8 bytes. Data is written to the memory 620 as DATA_WR [127:0] to the location indicated by an ADDR_WR signal with timing provided by a write enable we signal.

The ADDR_WR_PACKED[ ] signal may be used by the memory-write arbiter 603 to determine the location in the region 621 for the non-zero value data within the memory 620 where the packed data is written. Similarly, the ADDR_WR_MASK[ ] signal and the ADDR_WR_ROWPTR[ ] signal may be used to determine the location in the metadata region 622 within the memory 620 where the zero bit mask data and the row pointer data is written. The memory-write arbiter may send a pop signal (i.e., a pop_packed signal, a pop_mask signal, or a pop_rowptr signal) to one of the FIFO queues in conjunction to the arbiter writing that data to the memory 620, such that that data may be removed from the FIFO. The memory-write arbiter 603 may also include a busy signal output to control the amount of data that is being input through the lanes Lane0[7:0]-Lane15[7:0].

Figure 8B:
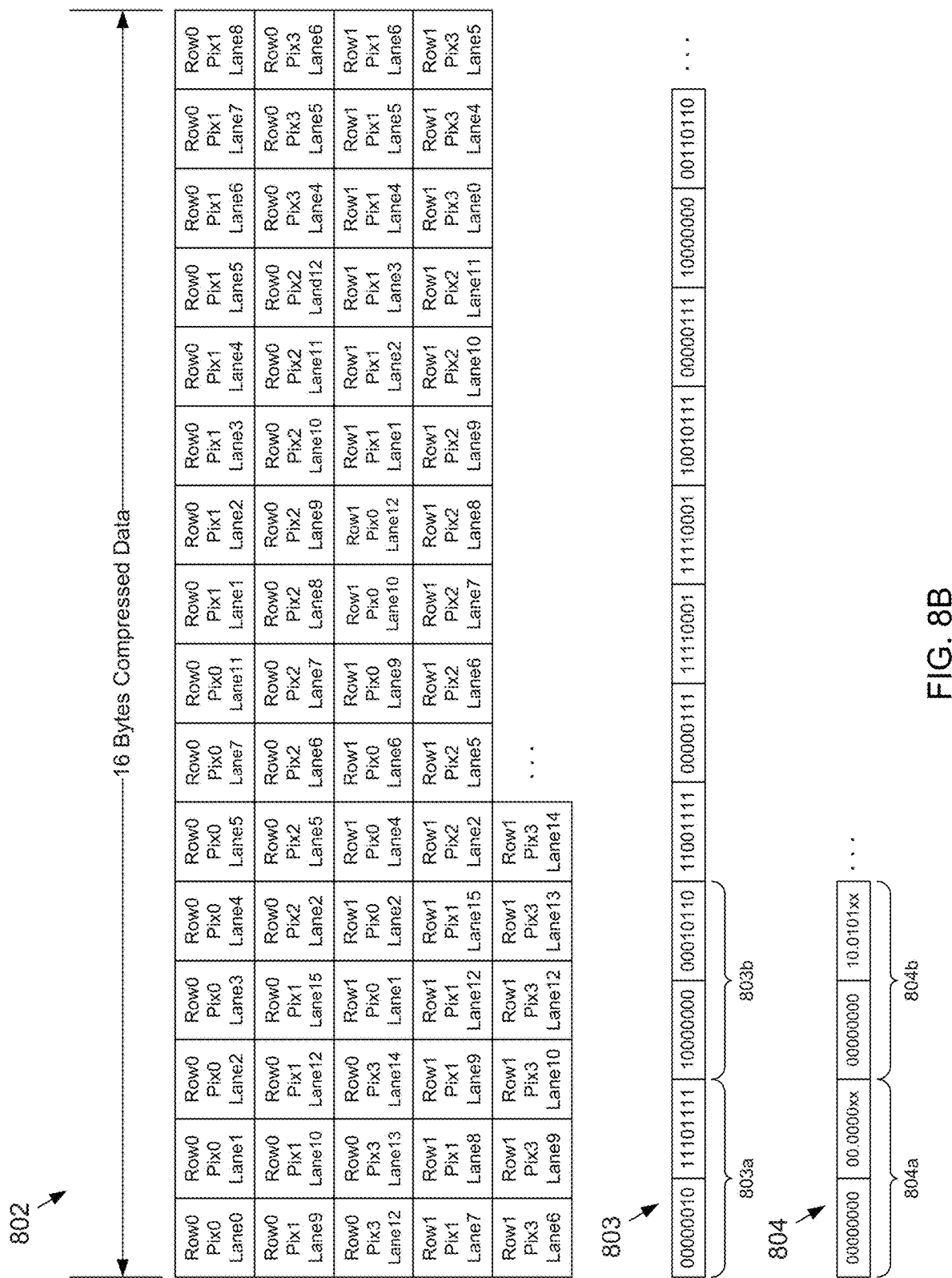

FIGS. 8A and 8B respectively depict another example of uncompressed data 801 and compression of data with random access of the compressed data provided by the zero-collapsing data compressor and packing circuit 600 according to the subject matter disclosed herein. In FIG. 8A, the uncompressed data 801 may represent 8-bit pixel data in which each pixel includes 16 bytes of data, and a row of pixels includes four pixels. Pixels having a zero value are indicated by a "0" and pixels having non-zero data are indicated by a row number, a pixel number and a lane number. The 16 lanes of the zero-collapsing data compressor and packing circuit 600 each receive one byte of uncompressed pixel data. For example, Lane0 receives byte 0 of uncompressed pixel data for pixel 0 (Pix0). Lane1 receives byte 1 of uncompressed data for Pix0, and so on. Thus, the uncompressed pixel data depicted in FIG. 8A may correspond to bit streams 610 in FIGS. 6A and 6B.

FIG. 8B depicts the uncompressed data 801 having been compressed by the zero-collapsing data compressor and packing circuit 600 to form compressed data 802. The compressed pixel data 802 may correspond to the packed data 612. The zero bit mask data corresponding to the compressed pixel data 802 is indicated at 803. The zero bit mask data 803 includes two bytes of mask data for each 16 bytes of uncompressed pixel data. For example, the mask data 803a corresponds to the 16 bytes of uncompressed data for pixel Pix0. Similarly, the mask data 803b corresponds to the 16 bytes of uncompressed data for pixel Pix1, and so on. Row-pointer data corresponding to the compressed pixel data 802 is indicated at 804. The row-pointer data 804 includes two bytes of row-pointer data for each 16 bytes of uncompressed pixel data 801. For example, the row-pointer data 804a corresponds to the 16 bytes of uncompressed data for pixel Pix0. The row-pointer data 804b corresponds to the 16 bytes of uncompressed data for pixel Pix1, and so on.

Figure 9:
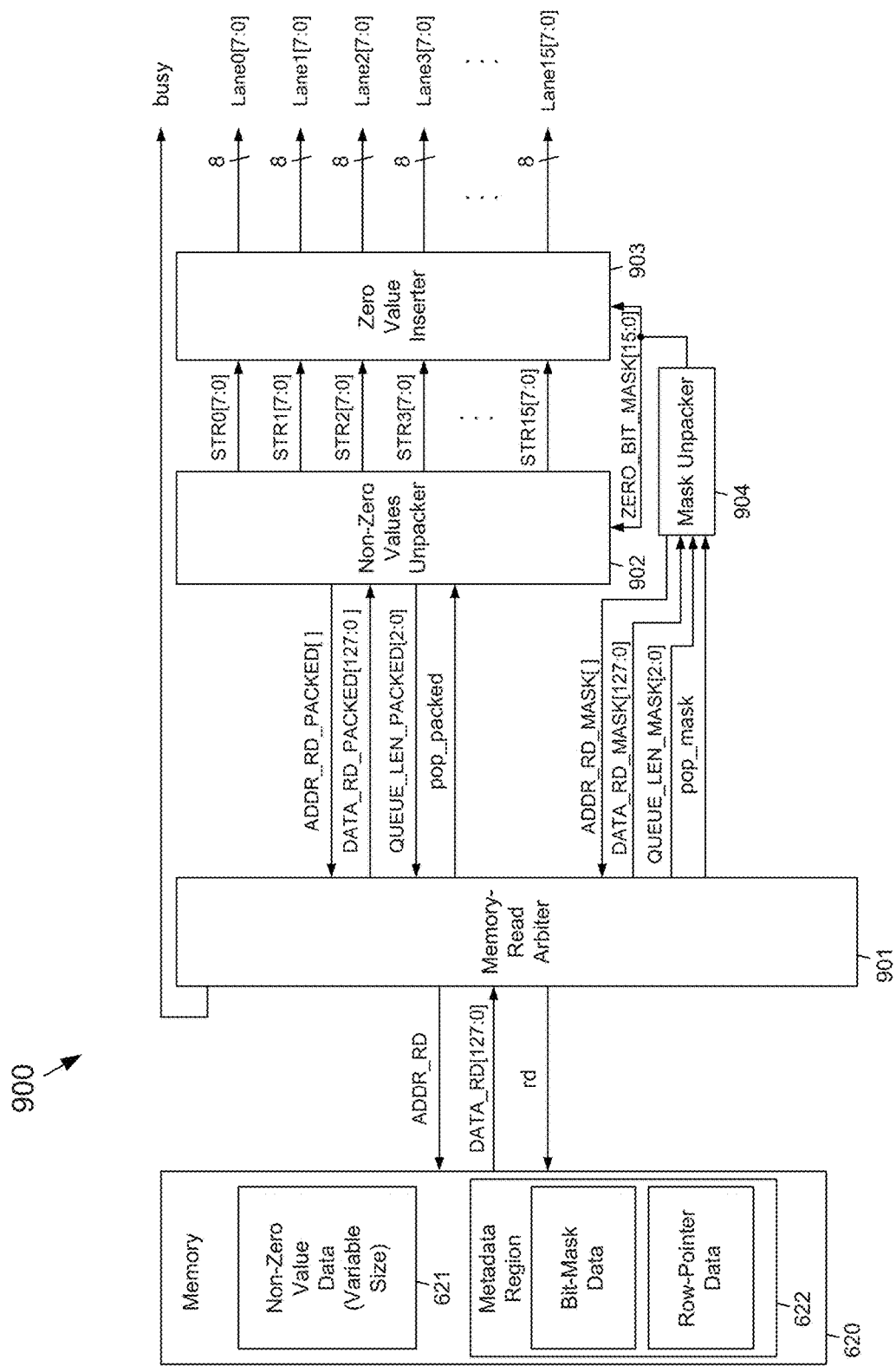
FIG. 9 depicts a block diagram of an example embodiment of an unpacker and decompressor circuit according to the subject matter disclosed herein.

FIG. 9 depicts a block diagram of an example embodiment of an unpacker and decompressor circuit 900 according to the subject matter disclosed herein. The circuit 900 operates generally in reverse to the zero-collapsing data compressor and packing circuit 600 of FIG. 6A by unpacking the non-zero value data in the memory region 621 using the row-pointer data 614 and the zero bit mask data 613. The circuit 900 may include a memory-read arbiter 901, a non-zero values unpacker 902, a zero value inserter 903, and a mask unpacker 904. The various components forming the circuit 900 (including the circuit 900 as a whole) may be implemented as one or more circuits and/or as one or more modules.

The memory-read arbiter 901 reads non-zero value data, row-pointer data and bit mask data from the memory 620. The non-zero values packer 902 unpacks the packed data based on the bit mask data. The zero value inserter 903 inserts zero values into the unpacked data also based on the bit mask data. If the non-zero values packer 602 of the circuit 600 includes a butterfly shuffler, such as butterfly shuffler 101, then the non-zero values unpacker 902 may also include a corresponding butterfly shuffler to unpack the data.

Figure 10A:
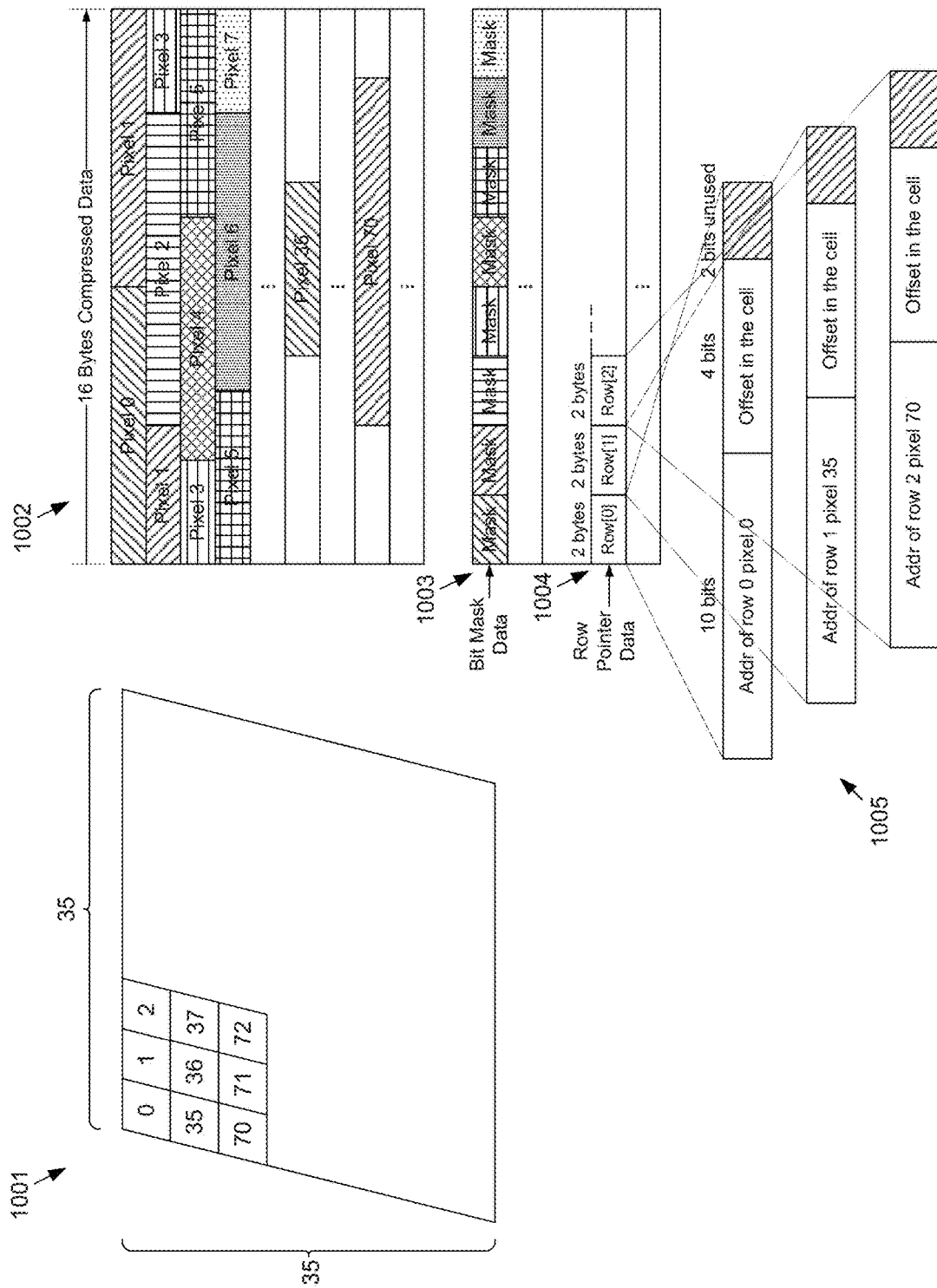
FIGS. 10A-10B depict example details of the random access capability of the compressed data provided by the zero-collapsing data compressor and packing circuit of FIG. 6A and the unpacking and decompressor circuit of FIG. 9 according to the subject matter disclosed herein.
Figure 10B:
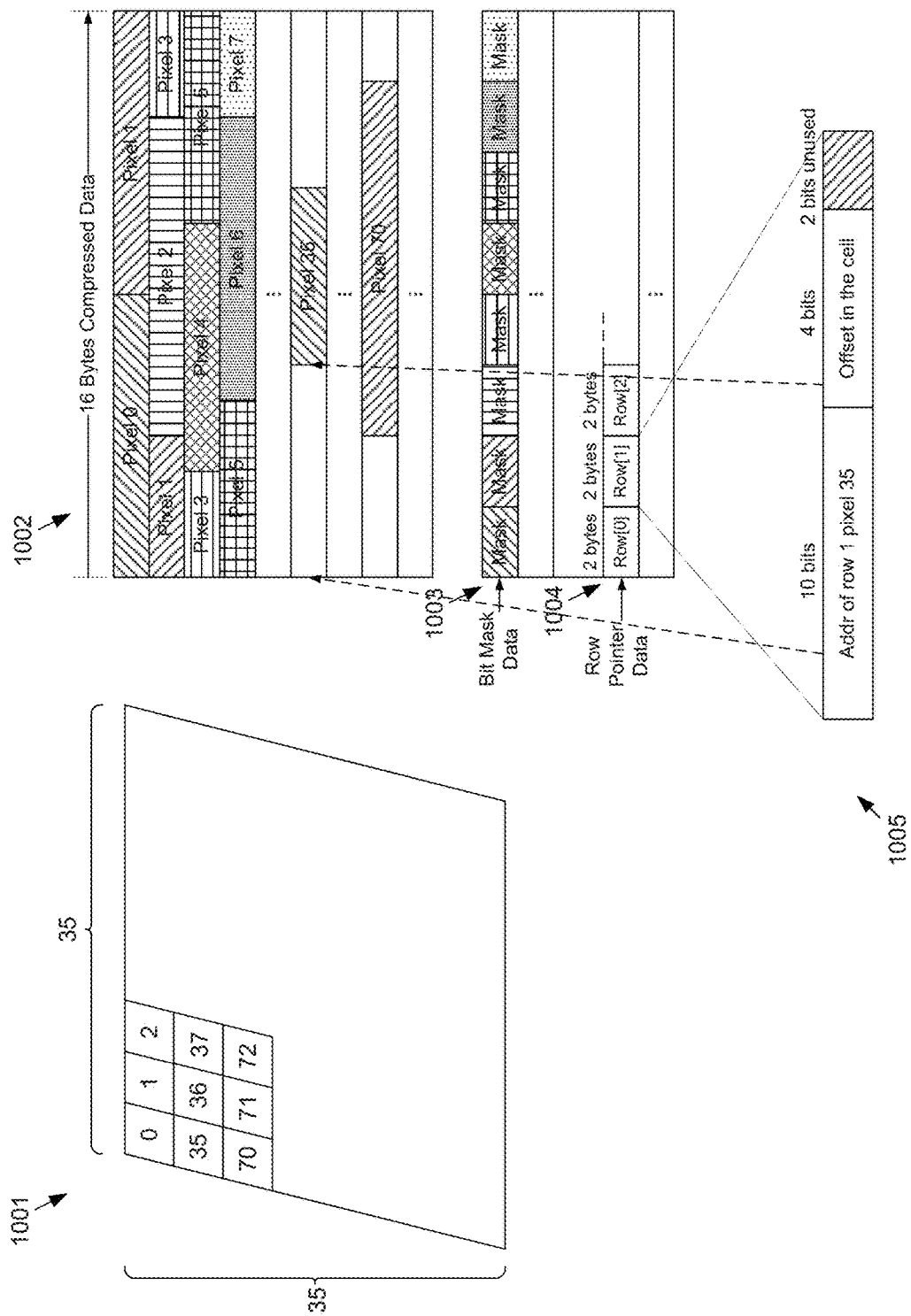

FIGS. 10A-10B depict example details of the random access capability of the compressed data provided by the zero-collapsing data compressor and packing circuit 600 and the unpacking and decompressor circuit 900 according to the subject matter disclosed herein. In FIG. 10A, a 35×35 pixel array is depicted at 1001. Only pixels 0-2, 35-37, and 70-72 are indicated for convenience. At 1002, the compressed pixel data for the pixel array 1001 is depicted as stored in, for example, the non-zero value data region 621 of the memory 620 in FIG. 6A. Bit-mask data 1003 and row-pointer data 1004 for the pixel array 1001 may be stored in, for example, the metadata region 622 of the memory 620.

Row-pointer data for the first three rows of the pixel array 1001 are expanded at 1005. Each row-pointer includes two bytes of data in which the first ten bits may provide the address of the row, or cell, in the non-zero value data region 621 of the first pixel of the row in the pixel array 1001. The next four bits may provide an offset in the cell of the first pixel of the row in the pixel array 1001. The last two bits may be unused. For example, in FIG. 10B, the first ten bits of the row-pointer data for the pixel 35 at row 1 of array 1001 point to the sixth row, or cell, of the non-zero value data region 621 for the pixel array 1001. The next four bits point to the offset in the cell for the pixel 35. The last two bits are unused.

Figure 10C:
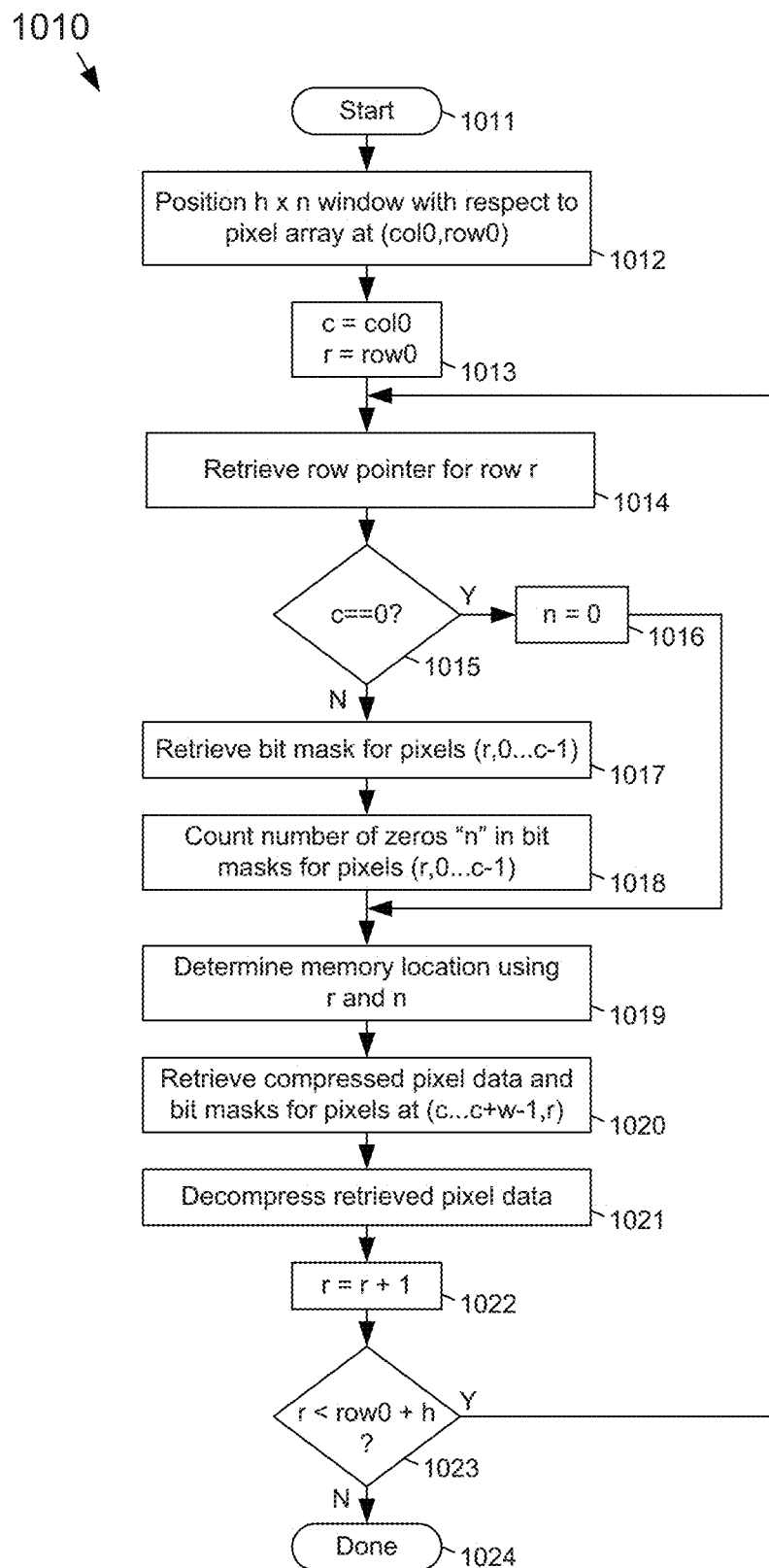
FIG. 10C is a flowchart of an example embodiment of a method to access the compressed data depicted in FIGS. 10A and 10B using the random access capability of packed compressed data provided by the zero-collapsing data compressor and packing circuit of FIG. 6A according to the subject matter disclosed herein.

FIG. 10C is a flowchart for a method 1010 to access a window 1006 within the compressed data 1002 using the random access capability of packed compressed data provided by the zero-collapsing data compressor and packing circuit 600 according to the subject matter disclosed herein. The method 1010 starts at 1011. At 1012, an h×w×d window is positioned with respect to the pixel array 1001 of size H×W×D in which h and w refer to window planar height and width, H and W refer to the pixel array planar height and width, and the number of depth channels d within window 1006 is identical to that of tensor 1001, i.e., d=D. At 1013, planar indices c and r are initialized, indicating the position of the window within data tensor 1001 as planar column and row indices. More specifically, c and r refer to location of the upper-left pixel of the window within window 1006.

At 1014, the row pointer data is accessed for pixels at row r. Step 1015 checks if there are pixels located between the row start, as specified by the row pointer retrieved at 1014, and the start column of window 1006. Because the leading pixels are not needed, their retrieval and decompression should be skipped. When any leading pixels exist, steps 1017 and 1018 update the row pointer to account for the leading pixels. More specifically, at 1017 the method 1010 retrieves bit masks for pixels in row r, columns 0 . . . c−1. Step 1018 counts the number of zeros n in the retrieved bit masks to obtain the number of bytes (containing non-zero values) the leading pixels occupy in the non-zero value data the memory area 621. Step 1019 increases the row pointer r by the offset n to calculate the memory 620 starting location, i.e., the memory 620 address and byte offset within SRAM word in which compressed data for row r and column c is stored.

Bit mask corresponding to pixel at (r, c) is contained starting at the memory 620 word floor((r*W+c)*D/b)+$A_{bit\_mask}$ and byte offset within the memory 620 word mod((r*W+c)*D, b) in which b is SRAM word size in bytes and $A_{bit\_mask}$ is the starting address where bit mask metadata is stored in the memory 620.

In a case when there are no leading pixels to be skipped, step 1016 sets the number of bytes n to skip to zero and proceeds to step 1019. Step 1020 retrieves compressed pixel data from memory area 621 for pixels c . . . c+w−1 in row r as well as associated bit mask data from memory area 622. Step 1021 decompresses and outputs the retrieved pixel data using the associated bit masks. Step 1022 increments the row index r and the process repeats from step 1014 until data from the entire window 1006 has been fetched and step 1023 breaks the loop to finishes execution of the method 1010.

In a case when the number of depth channels d within window 1006 is less than the number of depth channels D within tensor 1001, i.e., d<D, the method 1010 may be modified by skipping output of unused depth channels. In a case when data within window 1006 must be retrieved using vertical and/or horizontal stride other than one, retrieval and output of unused pixels may be suppressed in a manner similar to skipping leading pixels, as described above.

Figure 10D:
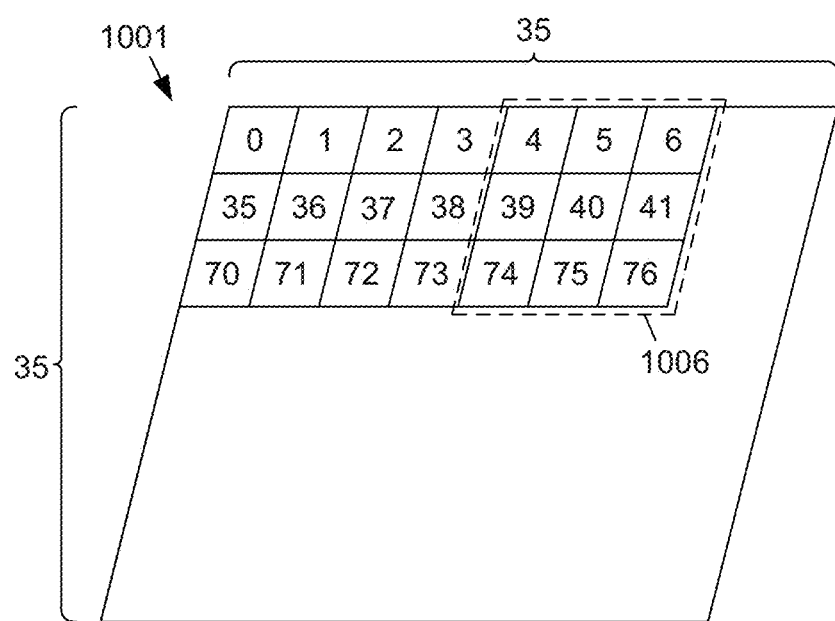
FIG. 10D depicts the method of FIG. 10C reading out a window from a pixel array according to the subject matter disclosed herein.

FIG. 10D depicts the method 1010 retrieving a 3×4 data window 1006 out of 35×35 pixel array 1001 according to the subject matter disclosed herein. For this example, the window coordinates (row0, col0) are (0, 3). For convenience, only pixels 0-6, 35-41, and 70-76 of the pixel array 1001 are indicated. Initially, the method 1010 retrieves the row pointer for row 0. The retrieved value points to the location of pixel 0. Subsequently, the method 1010 skips the unneeded leading pixels 0 . . . 3 by fetching bit masks associated with pixels 0, 1, 2 and 3, calculating the number of bytes pixels 0 . . . 3 occupy in compressed data storage area 621 by counting zero bits in these bit masks and increasing the pointer by the calculated number bytes, such as to point at pixel 4. A memory row pointer may include a word address and an offset into the word. Accessing a byte located at offset $A_{byte}$ within the memory 620 corresponds to accessing the memory address floor($A_{byte}$/s) at offset mod ($A_{byte}$, s) within a memory word in which s is the SRAM word width in bytes.

Having calculated the location of the compressed data in memory area 621 for pixel 4, i.e., the address of pixel 4 and its offset within the memory word, the method 1010 fetches compressed data for pixels 4 . . . 6, fetches bit mask data for pixels 4 . . . 6, combines both to decompress, the compressed data, inflates the compressed data by re-inserting zero-valued bytes, and outputs the de-compressed result. This process repeats once more for row 1 and one more time for row 2, thus completing the retrieval of window 1006 from pixel array 1001.

A butterfly shuffler may also be used to homogenize sparse data. There may be situations in which sparse data, such as data associated with feature maps and weights of neural networks, may include non-zero values that are clumped together. That is, the data may be non-homogeneous sparse data. In such a situation, a system that may parallel-process the sparse data by, for example, multiplying input feature map (IFM) values or values output from activation functions and weight values in parallel, may have many of the multipliers idling (with at least one operand equal to 0) while small groups of multipliers may be providing the bulk of the multiplying, thereby resulting in a bottleneck condition. As used herein the term "activation values (or data)" means values output from activation functions. Also as used herein the terms "input feature map values (or data)" and "activation values (or data)" may be used interchangeably. To more uniformly utilize the multipliers, a butterfly shuffler may be used to shuffle (permute) the IFM values and/or the weight values to make the sparse data more homogeneous and so that the multipliers are more uniformly utilized.

Figure 11A:
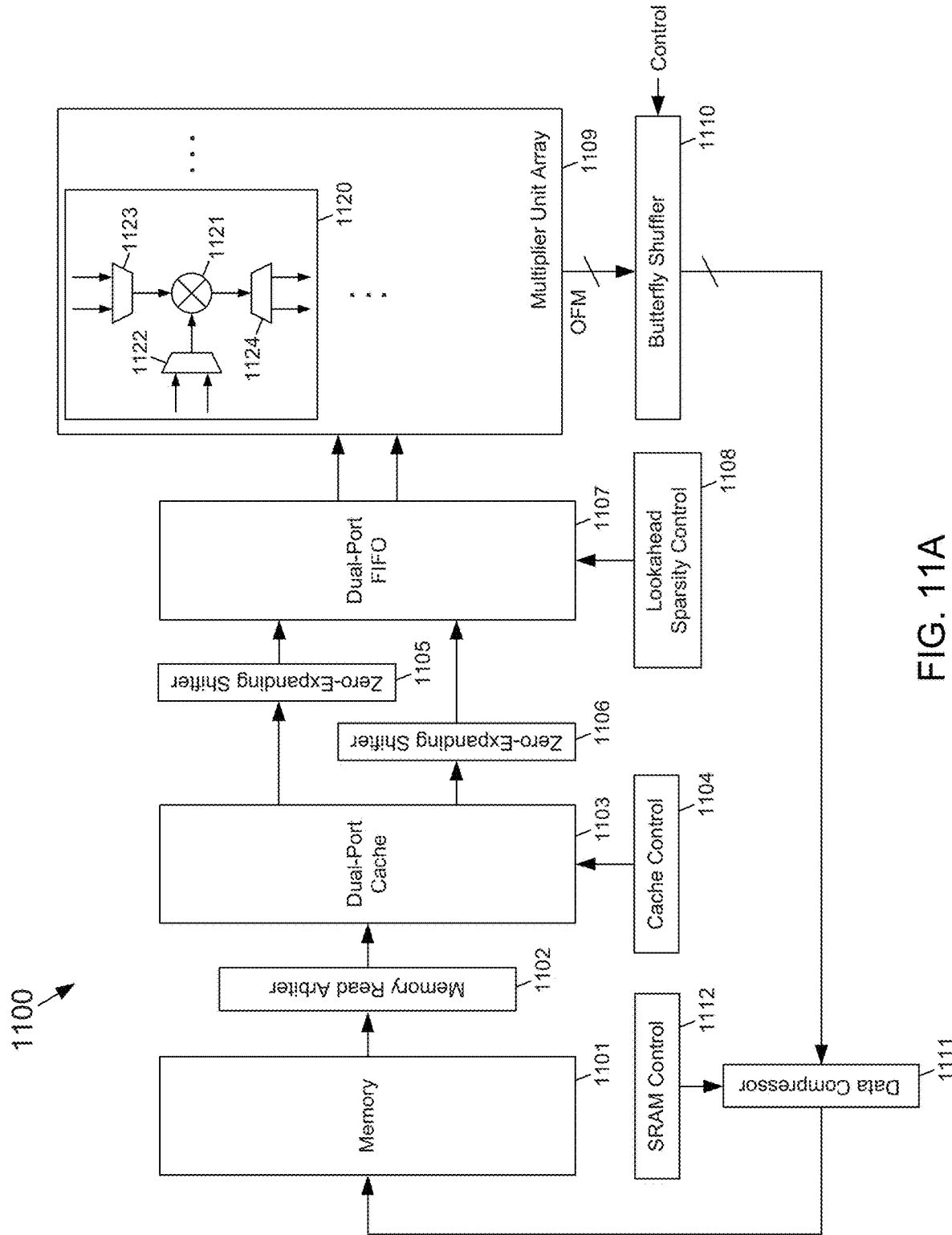
FIG. 11A depicts an example block diagram of an embodiment of a sparse data processing system that utilizes a butterfly shuffler to homogenize sparse data according to the subject matter disclosed herein.

FIG. 11A depicts an example block diagram of an embodiment of a sparse data processing system 1100 that utilizes a butterfly shuffler to homogenize sparse data according to the subject matter disclosed herein. In one embodiment, the sparse data processing system 1100 may parallel-multiply IFM values and weight values to generate output feature map (OFM) values in parallel in order to compute convolutions and vector-by-matrix multiplications, as described in greater detail in U.S. patent application Ser. No. 16/446,610, filed on Jun. 19, 2019, entitled "NEURAL PROCESSOR", (the '610 application), the entire content of which is incorporated herein by reference. The processing system 1100 may include a memory 1101, a memory read arbiter 1102, a dual-port cache 1103, a cache controller 1104, a first zero-expanding shifter 1105, a second zero-expanding shifter 1106, a dual-port FIFO 1107, a look-ahead sparsity controller 1108, a multiplier unit array (MUA) 1109, a butterfly shuffler 1110, a data compressor 1111, and a memory controller 1112. The various components forming the circuit 1100 (including the circuit 1100 as a whole) may be implemented as one or more circuits and/or as one or more modules.

The memory 1101 may store IFM values for one or more output feature maps. Since output feature maps typically act as input feature maps for a next layer in the neural network model, one may refer to the output feature maps as input feature maps. The memory 1101 may be a volatile memory and/or a non-volatile memory. In one embodiment, the memory 1101 may correspond to the memory 620 depicted in FIG. 6, and the IFM values may include packed and compressed non-zero values, zero bit mask data and row-pointer data, as described elsewhere herein. The output of the memory 1101 may be input to the memory read arbiter 1102. Memory read arbiter 1102 may conceptually correspond to the module 901 shown in FIG. 9. The output of the memory read arbiter 1102, including IFM compressed data, bit mask and, optionally, row pointers, may be input to the cache 1103. The cache 1103, zero-expanding shifters 1105 and 1106, and FIFO 1107 may all be placed in proximity to the multiplier unit array 1109.

The cache control 1104 may control both the receiving of the IFM values and the output of the IFM values to the first and second zero-expanding shifters 1105 and 1106. One set of IFM values for a first input feature map may be output to the first zero-expanding shifter 1105, and the other set of IFM values for a second input feature map may be output to the second zero-expanding shifter 1106. The zero-expanding shifters 1105 and 1106 may be configured to add zero values back into the IFM values based on zero bit mask data included with the IFM values. The resulting expanded IFM data may be sparse data. The zero-expanding shifters 1105 and 1106 each may conceptually correspond to the modules 902, 903 and 904 in FIG. 9.

After expansion, the IFM values are input to the dual-port FIFO 1107, also referred to as an IFM buffer in the '610 application. Up to two IFM pixels can be unpacked, inflated and input to the dual-port FIFO simultaneously. The cache controller 1104 controls the output of the dual-port cache 1103 so that the FIFO 1107 holds a queue of pixels (referred to as IFM slices in the '610 application) waiting to be processed. The pixels may belong to same IFM and may be queued according to the order of processing by the multiplier unit array 1109 as described in the '610 application in greater detail. More specifically, the baseline embodiment disclosed in the '610 application controls the FIFO 1107 (IFM buffer) to avoid sending zero-valued activations to the multiplier unit array 1109. In each lane, when an activation that is about to be sent to the multiplier array 1109 for computation happens to have a zero value, the FIFO (IFM buffer) 1107 may try finding and sending a non-zero activation value instead of the zero-valued activation. Finding a non-zero activation may include checking the value of the next activation queued in the same lane as well as checking values of activations in adjacent lanes, i.e., one lane above and one lane below the current lane. If a non-zero-valued activation is found, that activation may be sent—out of order—to the multiplier unit array 1109 instead of sending the zero-valued activation. The multiplier unit array 1109 will then apply the correct weight to the substitute non-zero-valued activation and use an extra adder tree to correctly compute the desired dot product, as described in greater detail in the '610 application. Unlike the baseline embodiment of the '610 application, the embodiment of FIG. 11A may restrict the search for non-zero-valued activations to within same lane only, i.e., no look-aside search of one lane up and down, to reduce circuit area and power. The FIFO (IFM buffer) 1107 in FIG. 11A, however, provides the multiplier unit array 1109 with two sets of activation broadcast lanes in which the first set of activation lanes broadcasts the current queued values (IFM slice), while the second set of activation lanes broadcast the up-next queued values, i.e., the values that would be broadcast in the next clock cycle in the baseline embodiment.

The multiplier unit array 1109 may include an array of multiplier circuits 1120 arranged, for example, in 16 rows and 8 columns. Each multiplier circuit 120 may include a multiplier 1121, a first input multiplexer 1122, a second input multiplexer 1123, and an output multiplexer 1124. The first input multiplexer 1122 may be configured to receive two IFM values from the dual-port FIFO (IFM buffer) 1107. For example, the first input multiplexer of a multiplier 1121 at row 0, column 0 may receive IFM data for a channel 0 and the up-next IFM data for a channel 0. The second input multiplexer 1123 may be configured to receive two weight values from a local weight register file (not shown herein, but described in greater detail in the '610 application). For example, the second input multiplexer 1123 of the multiplier 1121 at row 0, column 0 may receive weight data for a weight 0 and a weight 1.

The look-ahead sparsity controller 1108 evaluates the IFM values queued in a lane in the dual-port FIFO 1107 and controls the first multiplexer 1122 to select a non-zero IFM value input to the first multiplexer 1122 to be a first operand. Another look-ahead sparsity controller (not shown) looks at weight values that have been queued in a lane of the local weight register file (not shown), and controls the second multiplexer 1123 to select a non-zero value weight input to the second multiplexer 1123 to be a second operand, i.e., skip multiplications if the weight is zero or the activation in that lane is zero.

The multiplier 1121 generates a product of the two non-zero operands input to the multiplier 1121. The output multiplexer 1124 is controlled to select an appropriate adder tree (not shown) for the product generated by the multiplier 1121 based on the controls provided by the look-ahead sparsity controllers to the first and second input multiplexers 1122 and 1123. Additional details of the operation of the dual-port FIFO 1107, the look-ahead sparsity controller 1108, and the multiplier unit 1109 may be found in the '610 application, which has been incorporated by reference herein in its entirety.

Figure 11B:
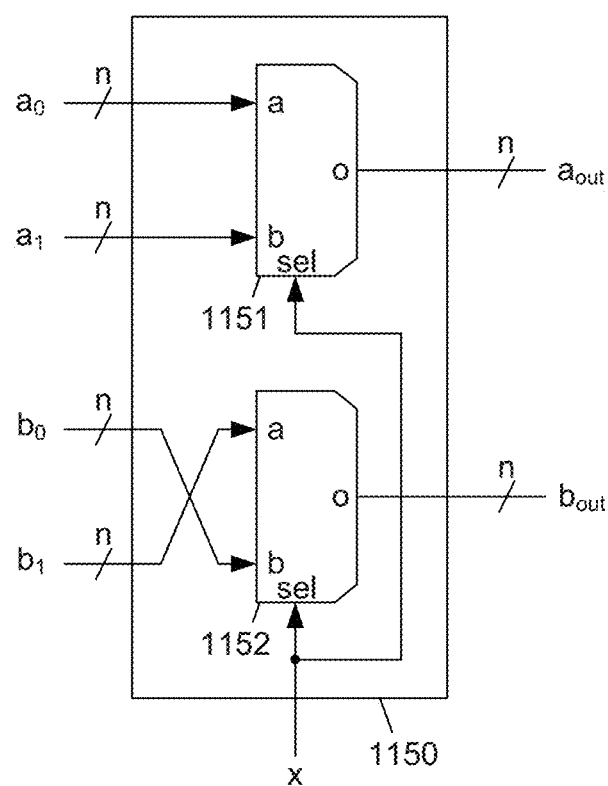
FIG. 11B depicts an example embodiment of a butterfly data path multiplexer according to the subject matter disclosed herein.
Figure 11C:
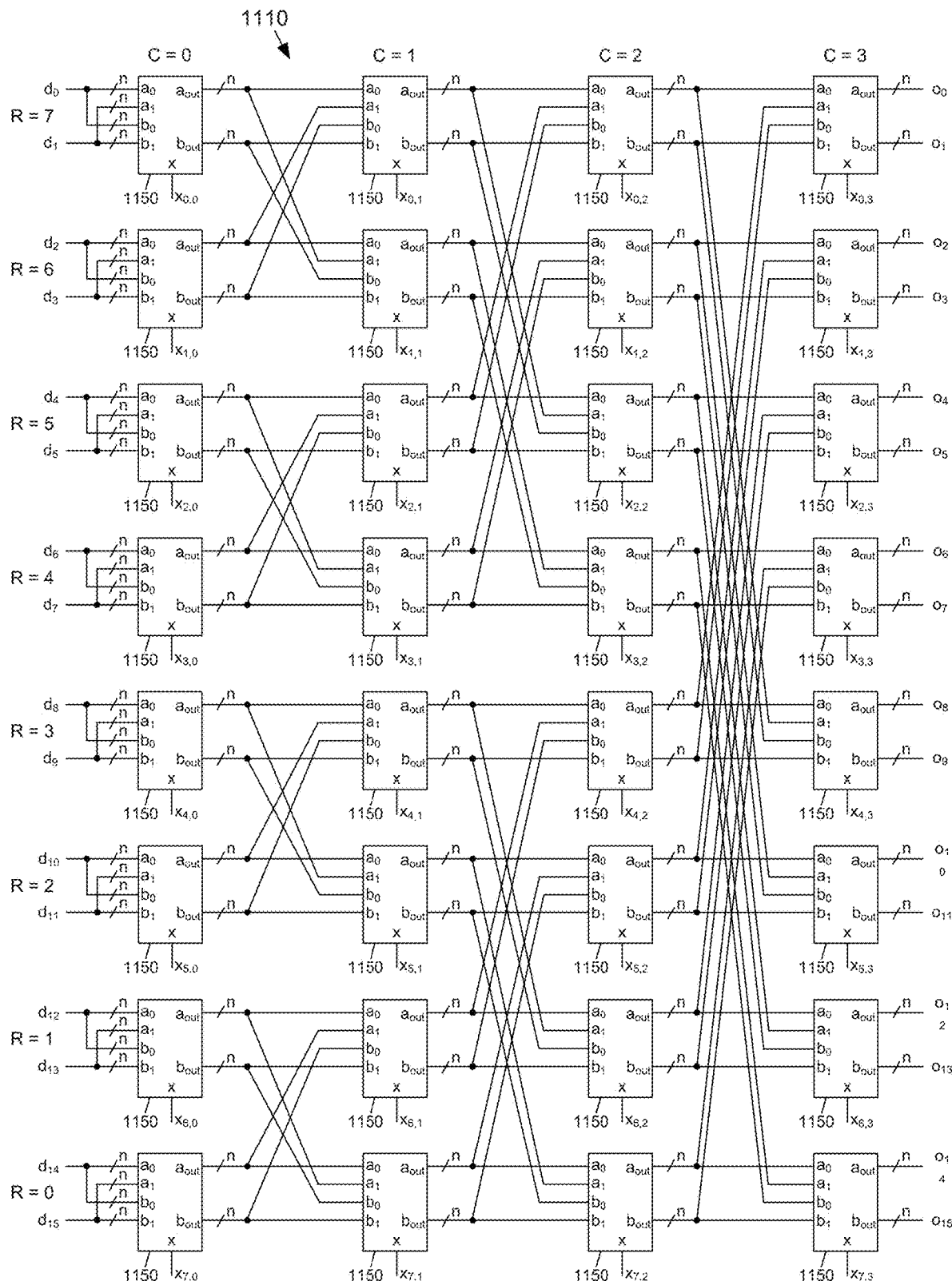
FIG. 11C depicts an example embodiment of a 16-channel butterfly data path according to the subject matter disclosed herein.

The OFM output of the multiplier unit 1109 is input to the butterfly shuffler 1110. The OFM output of the multiplier unit 1109 may be non-homogenous sparse data. That is, there may be clumps of non-zero values in the sparse data. The butterfly shuffler 1110 may shuffle the data to generate homogeneous sparse data. That is, each respective OFM output from the 8 columns of the multiplier unit 1109 is input to a corresponding input to the butterfly shuffler 1110, which may be configured as depicted in FIGS. 11B and 11C. Note that unlike butterfly shuffler in FIGS. 1A-1B, fewer control inputs of the butterfly shuffler in FIG. 11C are tied together, thus enabling more permutations.

The butterfly shuffler 1110 may include a plurality of multiplexer module components 1150 that are depicted in FIG. 11B to include a first multiplexer 1151 and a second multiplexer 1152. Each multiplexer 1151 and 1152 includes two inputs that each receive n bits. A set of n bits a0 is input to the "a" input of the multiplexer 1151, and a set of n bits a1 is input to the "b" input of the multiplexer 1151. A set of n bits b0 is input to the "b" input of the multiplexer 1152, and a set of n bits b1 is input to the "a" input of the multiplexer 1152. A control input "x" is input to both multiplexers 1151 and 1152.

FIG. 11C depicts a block diagram of one example embodiment of the butterfly shuffler 1110 according to the subject matter disclosed herein. The butterfly shuffler 1110 may include 32 2-to-1 8-bit multiplexer modules 1150 arranged in an array of 8 rows (R=0 through R=7) and 4 columns (C=0 through C=3), and connected as shown. Each respective multiplexer module 1150 may receive a control signal $x_{0...7, 0...3}$.

Figure 11D:
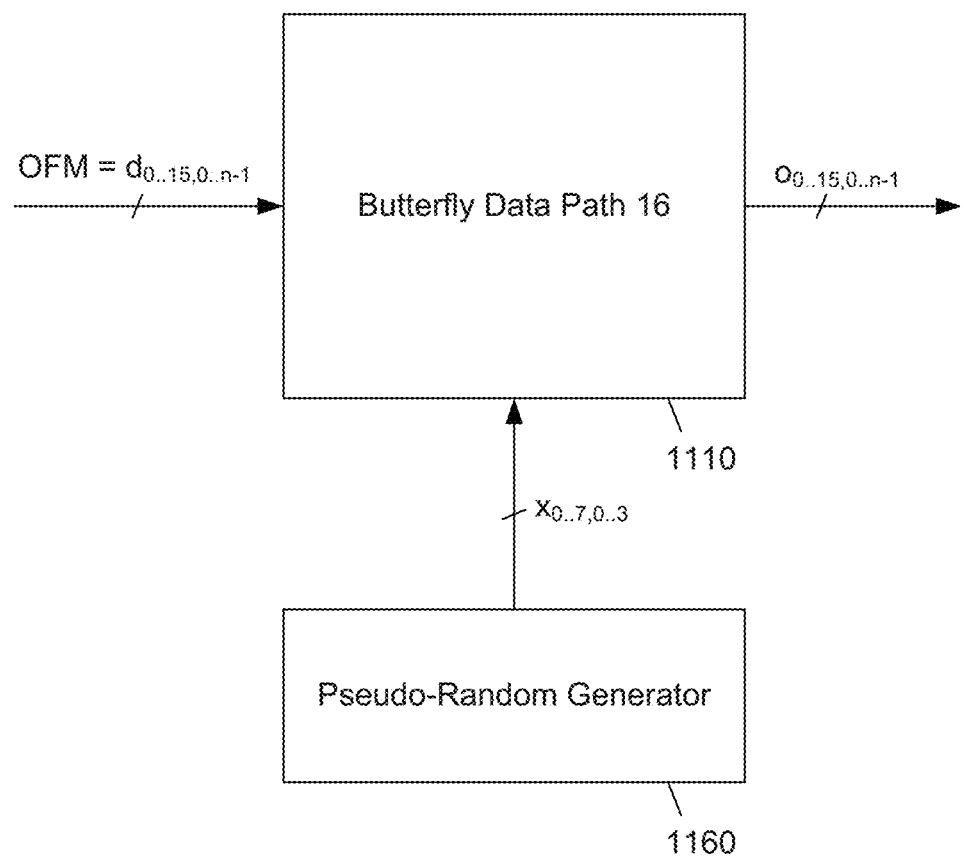
FIG. 11D depicts an example embodiment of a 16-channel butterfly data path with a pseudo-random generator controlling data path permutations according to the subject matter disclosed herein.

The butterfly shuffler 1110 may be controlled to shuffle the data on a value-by-value basis. If the OFM data output from the multiplier unit array 1109 is 8-bit data, then the multiplexer modules 1150 of the butterfly shuffler 1110 may be controlled to shuffle the 8-bit data. That is, the bits associated with a single value of OFM data are kept together as the values are shuffled. If, for example, the OFM data is 16-bit data, the multiplexers of the butterfly shuffler 1110 are controlled to shuffle the 16-bits data, then the butterfly shuffler 1110 may be configured to be similar to the butterfly shuffler depicted in FIG. 1D. The multiplexers of the butterfly shuffler 1110 may be controlled by a pseudo-random generator 1160 in a random or a pseudo-random manner to homogenize the OFM data, as depicted in FIG. 11D.

With the shuffling of the MUA 1109 output being controlled by a pseudo-random value generator, next layer weights have to be pre-shuffled accordingly, off-line, to match the pseudo-random shuffling sequence applied to the output activations so that during next layer calculation IFM values correctly correspond to the associated weights to be applied with weights pre-loaded into multiplier unit array 1109, as described in the '610 application.

The OFM output of the butterfly shuffler 1110 may be input to the data compressor 1111 that may correspond to compressor depicted in FIG. 6A. The OFM output of the data compressor 1111 may be stored in the memory 1101. In one embodiment, the OFM output of the butterfly shuffler 1110 may be input to the zero-collapsing data compressor and packing circuit 600 depicted in FIG. 6A to compress the data by removing the zero values and packing the data for storage in the memory 1101 (or rather, the memory 620). The differences between the embodiment in FIG. 11A and the baseline embodiment disclosed in the '610 application may be motivated by several considerations. Firstly, consider a case when the bandwidth of SRAM 1101 and/or IFM delivery fabric may be limited. More specifically, IFM values in some layers may have such high sparsity, e.g., up to 90%, that IFM must be retrieved several times faster, i.e., $1/(100\%-90\%)=10\times$, in order to provide enough non-zero activations to MUA 1109 to prevent multipliers 1121 from idling. Retrieving as well as transmitting compressed, as opposed to uncompressed, IFM over IFM fabric may help increase multiplier utilization. In a case when storing and transmitting IFM compressed is either unavailable or the rate of IFM retrieval is still insufficient to keep multiplier utilization high, multiplier units 1120 may be configured to generate more OFM values, compared to the '610 application, by computing several OFM slice results per each IFM input slice, i.e., effectively doing OFM cycling as described in the '610 application.

Referring to FIG. 11A, a second consideration may be to make use of weight sparsity—in addition to activation sparsity, i.e., skip multiplications as well as time to perform those multiplications when activation or weight (or both) to be multiplied by multiplier 1121 have zero values. More specifically, each multiplier unit 1120 can check if the weight to multiply the activation broadcast over the first set of activation lanes is zero, that multiplier unit may instead proceed to take the "up-next" activation broadcast over the second set of activation lanes and multiply it with the associated weight.

Multiplying activations by weights in such out-of-order fashion may cause some of the multiplier units 1120 run ahead of the other multiplier units 1120. Therefore, outputs of multiplier units may need to be re-synchronized so that individual products in each multiplier unit column are correctly reduced up into a dot product by adder trees present in each multiplier unit column. One way to re-synchronize the multiplier unit 1120 outputs may involve adding small output FIFOs. Another way to re-synchronize multiplier unit 1120 outputs may be to idle the multiplier units 1120 running considerably ahead of the other multiplier units 1120, i.e., due to fluctuations in sparsity, while making IFM uniformly sparse, such as using the butterfly shuffler 1110 to permute output results within each OFM slice in a pseudo-random fashion.

Note that with zero weight multiplications—and time to perform the multiplications—both skipped, the number of multiplications remaining to be performed may reduce. With IFM arriving at a fixed rate the utilization of the multipliers 1121 will therefore decrease as the multipliers 1121 may become idle due to not having more non-zero IFM values to process during the time freed up by skipping multiplications involving zero weight. This decrease in multiplier utilization may be reversed by increasing IFM SRAM and IFM delivery fabric bandwidth.

As mentioned earlier, as sparsity fluctuates from lane to lane and IFM slice to IFM slice, especially when IFM bandwidth is insufficient to keep the multiplier units 1121 at high utilization, some multiplier units 1120 may run ahead of other multiplier units 1120, with FIFO 1107 acting as an IFM buffer, sending current and next-up non-zero activations in each lane so that multiplier array columns (or individual multiplier units 1120 having output FIFOs) running ahead of other columns (units 1120) can proceed to calculating a next OFM slice instead of waiting for the other columns. Each multiplier array column may calculate, for example, 2 OFM slices before proceeding to a next IFM slice. Calculating more than one OFM slice (OFM cycling) per IFM slice requires correspondingly less IFM bandwidth to keep the multipliers 1121 utilized.

Figure 12A:
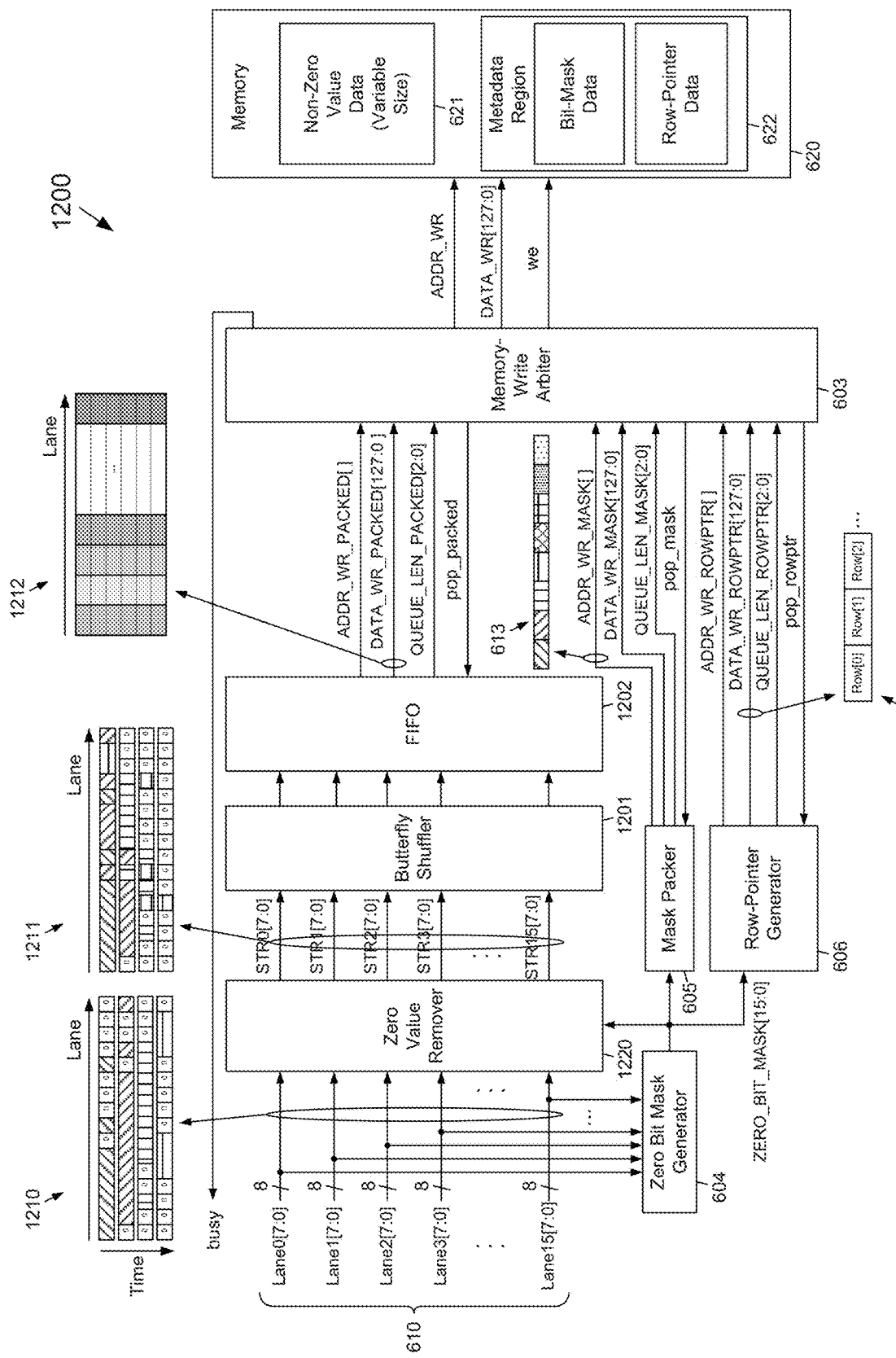
FIG. 12A depicts a block diagram of an example embodiment channel-parallel compressor circuit that provides random access to the packed data according to the subject matter disclosed herein.
Figure 12B:
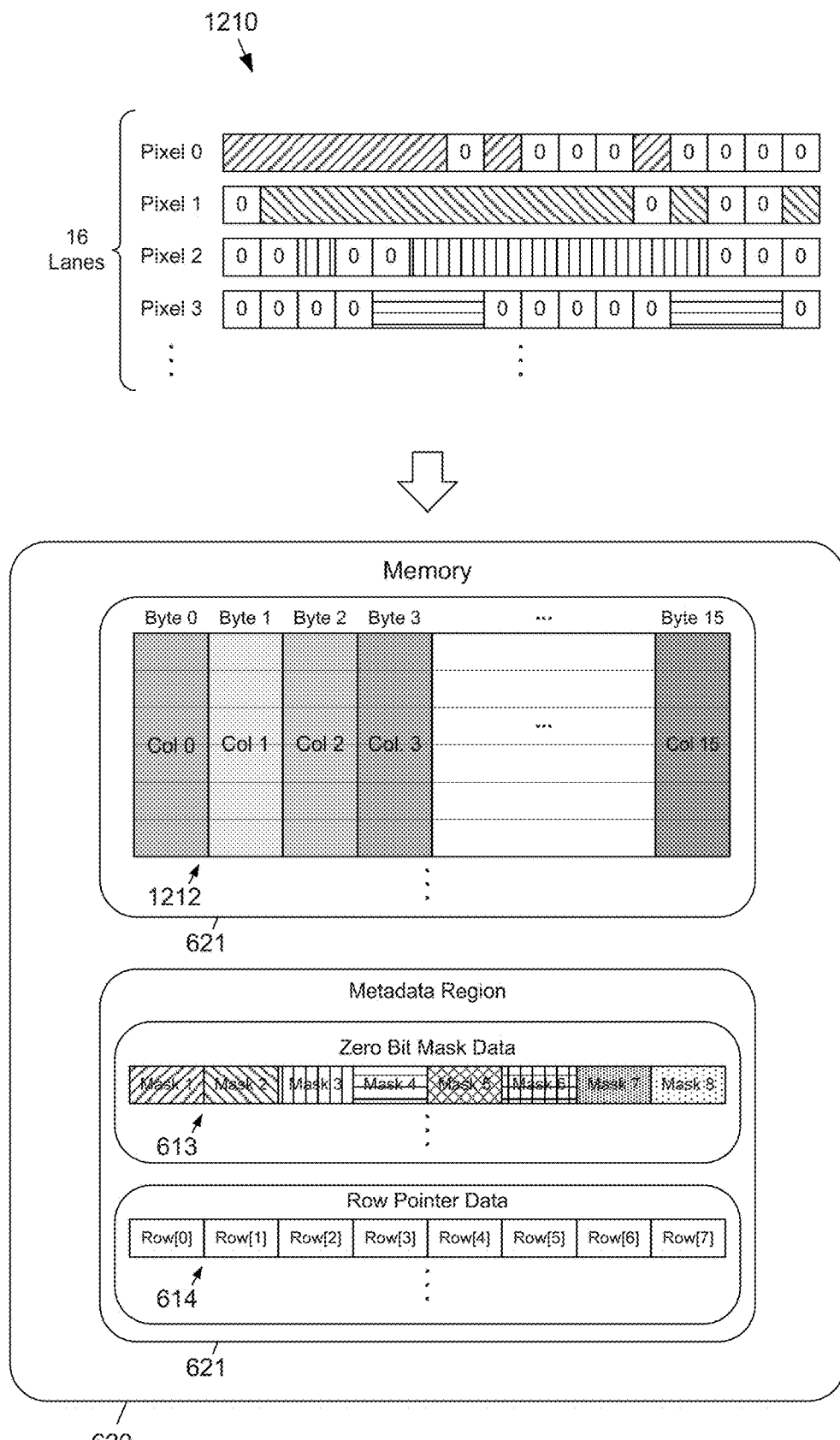
FIG. 12B depicts an example channel-parallel compression of data with random access of the compressed data provided by the zero-collapsing data compressor and packing circuit of FIG. 12A.

FIG. 12A depicts a block diagram of an example embodiment channel-parallel compressor circuit 1200 that provides random write access to the packed data according to the subject matter disclosed herein. FIG. 12B depicts an example channel-parallel compression of data with random access of the compressed data provided by the zero-collapsing data compressor and packing circuit 1200.

The compressor circuit 1200 is similar to the zero-collapsing data compressor and packing circuit 600 depicted in FIG. 6A with the following differences. The non-zero values packer 602 is replaced in the compressor circuit 1200 by a butterfly shuffler 1201 and a FIFO 1202. The circuit 1200 may include a zero-value remover 601, the butterfly shuffler 1201, the FIFO 1202, a memory-write arbiter 603, a zero bit mask generator 604, a mask packer 605, and a row pointer generator 606. The zero-value remover circuit 601 is replaced with circuit 1220, such that where circuit 601 removed zeros (collapsed) each IFM slice individually along the lane index dimension, circuit 1220 removes zeros (collapses) each channel stream individually, as received by the associated lane, along the time series index dimension. Circuit 1220 removing zeros along the time series index dimension can be implemented by placing a FIFO buffer in series with each input lane, such that a value gets written into a channel FIFO if and only if the value is not zero. The various components forming the circuit 1200 (including the circuit 1200 as a whole) may be implemented as one or more circuits and/or as one or more modules. The operation of the circuit 1200 is similar to the operation of the circuit 600 and many of the details of the operation are described in connection with the circuit 600.

Referring to FIGS. 12A and 12B, the zero value remover 601 may receive 16 lanes (i.e., Lane0[7:0]-Lane15[7:0]) or channels of byte stream data 1210. Each lane of the byte stream data 1210 may include 16 bytes of uncompressed non-zero value data and zero-value data. Non-zero value data is indicated by cross-hatching or shading, and zero-value data is indicated by a "0". In one embodiment, the 16 bytes of data may correspond to data of a pixel.

The zero-value remover 1220 may be configured to remove the zero-value data from each byte stream 1210 as described above. The zero-value remover 1220 outputs 16 byte streams STR0[7:0]-STR15[7:0] in which the respective byte streams have the zero values removed. The output of the zero-value remover 601 is depicted at 1211 in FIG. 12A for an example input 1210. Generally, the respective byte streams may have different lengths after zero values have been removed. The butterfly shuffler 1201 receives the different-length byte streams STR0[7:0]-STR15[7:0] and generates packed data in which the different-length byte streams have been concatenated, as depicted in FIGS. 13A-13B.

Figure 13A:
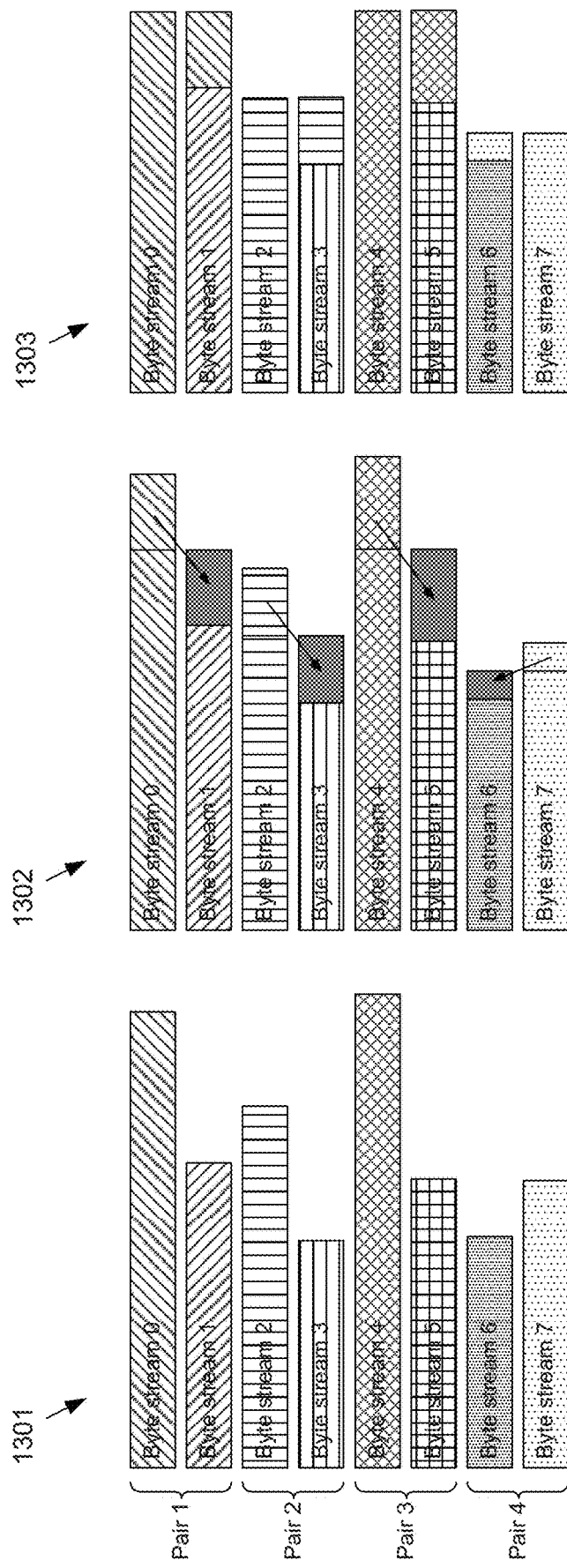
FIGS. 13A-13C conceptually depict eight example byte streams of different byte-stream lengths being recursively packed to become eight byte streams each having equal byte-stream lengths according to the subject matter disclosed herein.
Figure 13B:
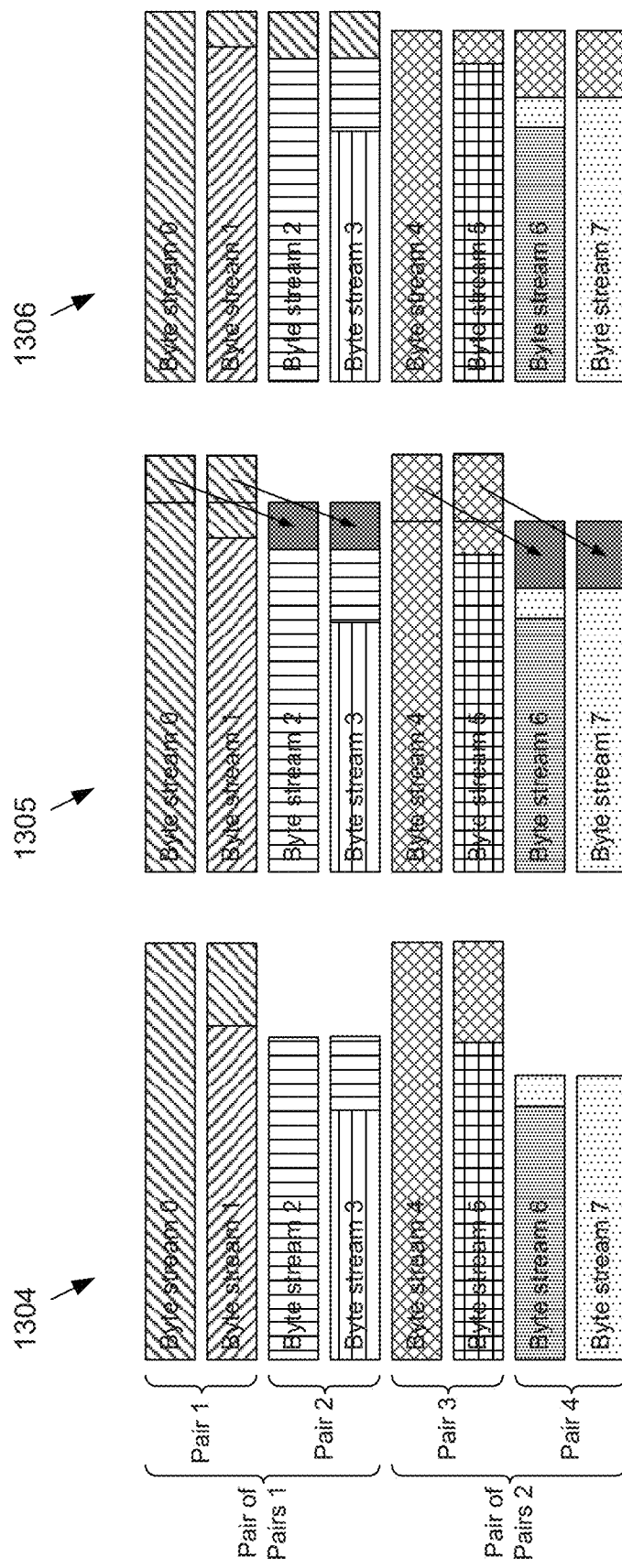
Figure 13C:
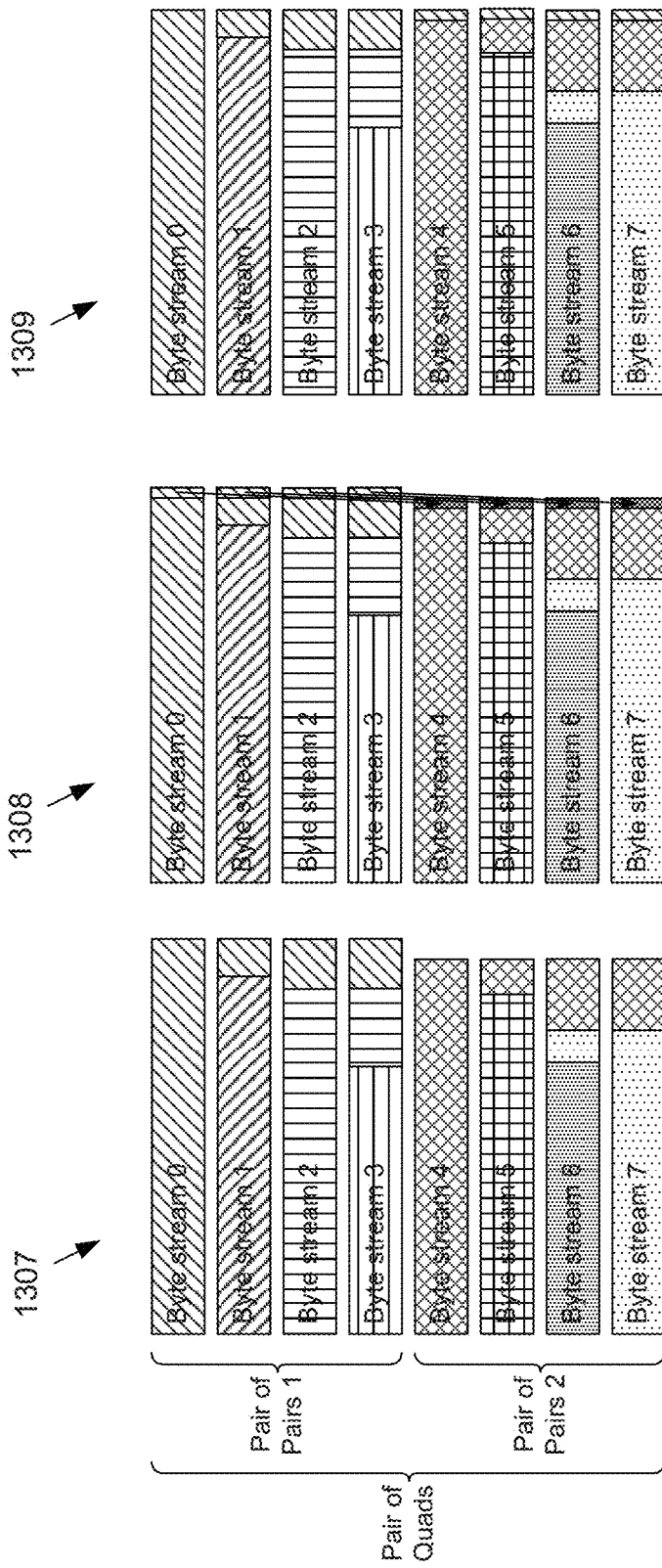

FIGS. 13A-13C conceptually depict eight example byte streams of different byte-stream lengths being recursively packed to become eight byte streams each having equal byte-stream lengths according to the subject matter disclosed herein. While this example illustrates 8-lane byte streams, 16-lane byte streams operate in a similar fashion. Also, this example illustrates butterfly shuffler operating with granularity, i.e., input bit width, of one byte instead of one bit, as previously described in FIGS. 2A-2C. Referring to FIGS. 1C, 12A and 13A-13B, the eight example byte streams 0-7, depicted at 1301, generally have different byte-stream lengths and are input to the multiplexers $104_{00}$ to $104_{70}$ of, for example (and convenience), the butterfly shuffler 101. The butterfly shuffler 1201 in FIG. 12A may be configured to be similar to the butterfly shuffler 101 in FIG. 1C. The different byte streams are depicted by different cross-hatching. The byte streams 0-7 are paired, or grouped, into four pairs corresponding to the pairing of the input multiplexers.

At 1302 in FIG. 13A, a portion, or head, of the longer byte-stream length of each pair is relocated, or redirected, through the butterfly shuffler 1201 to be part of the shorter byte stream of the pair by controlling the multiplexers of the pair so that the pair of byte streams has equal byte-stream lengths. For example, a portion of byte stream 0 is redirected by the multiplexers of column C=0 to become part of byte stream 1. Similarly, a portion of byte stream 2 is redirected to become part of byte stream 3. A portion of byte stream 4 is redirected to byte stream 5, and a portion of byte stream 7 is directed to be part of byte stream 6. In situations in which the difference in byte-stream lengths of a pair of byte streams is an odd number of bytes, a dummy, or filler, byte may be added to the shorter of the two byte streams. The pairs of byte streams having equal byte-stream lengths within the pairs are depicted at 1303, and are output from the multiplexers of column C=0. The different cross-hatched regions indicated at 1303 represent portions of byte streams that have been redirected to become part of another byte stream.

At 1304 in FIG. 13B, the pairs of byte streams having equal byte-stream lengths within the pairs are input to the multiplexers $104_{01}$ through $104_{71}$ in the second column (column C=1) of the butterfly shuffler 1201. The pairs of byte streams are further paired, or grouped, into two pairs of pairs corresponding to the pairing of the multiplexers in the second column of the butterfly shuffler 1201.

At 1305, a portion of each of byte streams of the pair of byte streams that has the longer byte-stream length are relocated, or redirected, to respectively be part of the pair of byte streams having the shorter byte-stream length by controlling the multiplexers of the second column. For example, a portion of each of the byte streams of the first pair of pairs (pair of pairs 1) is redirected by the multiplexers of the second column to respectively become part of the shorter byte streams of the first pair of pairs of byte streams. Similarly, a portion of each of the byte streams of the second pair of pairs (pair of pairs 2) is redirected by the multiplexers of the second column to respectively become part of the shorter byte streams of the second pair of pairs of byte streams. The pairs of pairs of byte streams having equal byte-stream lengths within the pair of pairs are depicted at 1306.

At 1307 in FIG. 13C, the pairs of pairs of byte streams having equal byte-stream lengths are input to the multiplexers $104_{02}$ through $104_{72}$ in the third column (column C=2) of the butterfly shuffler 1201. The pairs of pairs of byte streams are further paired, or grouped, into two pairs of pairs of quads of byte stream corresponding to the pairing of the multiplexers in the third column of the butterfly shuffler 101.

At 1308, a portion of each of byte streams of the pair of quads of byte streams having the longer byte-stream length are relocated, or redirected, to respectively be part of the pair of quads of byte streams having the shorter byte-stream length by controlling the multiplexers of the third column of the butterfly shuffler 101. For example, a portion of each of the byte streams of the pair of quads is redirected by the multiplexers of the third column to respectively become part of the shorter byte streams of the pair of quads of byte streams. The byte streams now having equal byte-stream lengths are depicted at 1309.

The memory-write arbiter 603, the zero bit mask generator 604, the mask packer 605, and the row-pointer generator 606 operate in a manner that is similar to that described in connection with the zero-collapsing data compressor and packing circuit 600 depicted in FIG. 6A, and will not be described here.

Referring back to FIGS. 12A and 12B, the output of the butterfly shuffler 1201 is input to the FIFO 1202. The output of the FIFO 1202 is depicted at 1212 for the example input 1210. As the FIFO 1202 fills, and as the FIFOS in the mask packer 605 and the row-pointer generator 606 fill, the memory-write arbiter 603 write the data to the respective regions in the memory 620. The non-zero value data 1212 has been arranged by the butterfly shuffler 1201 so that the compressed and packed data 1212 is stored in a column-by-column arrangement. The zero bit mask data 613 and the row-pointer data 614 is stored as described earlier. More specifically, the zero bit mask data is not stored as part 303 of the packed stream 302 illustrated earlier in FIG. 3A.

Figure 14:
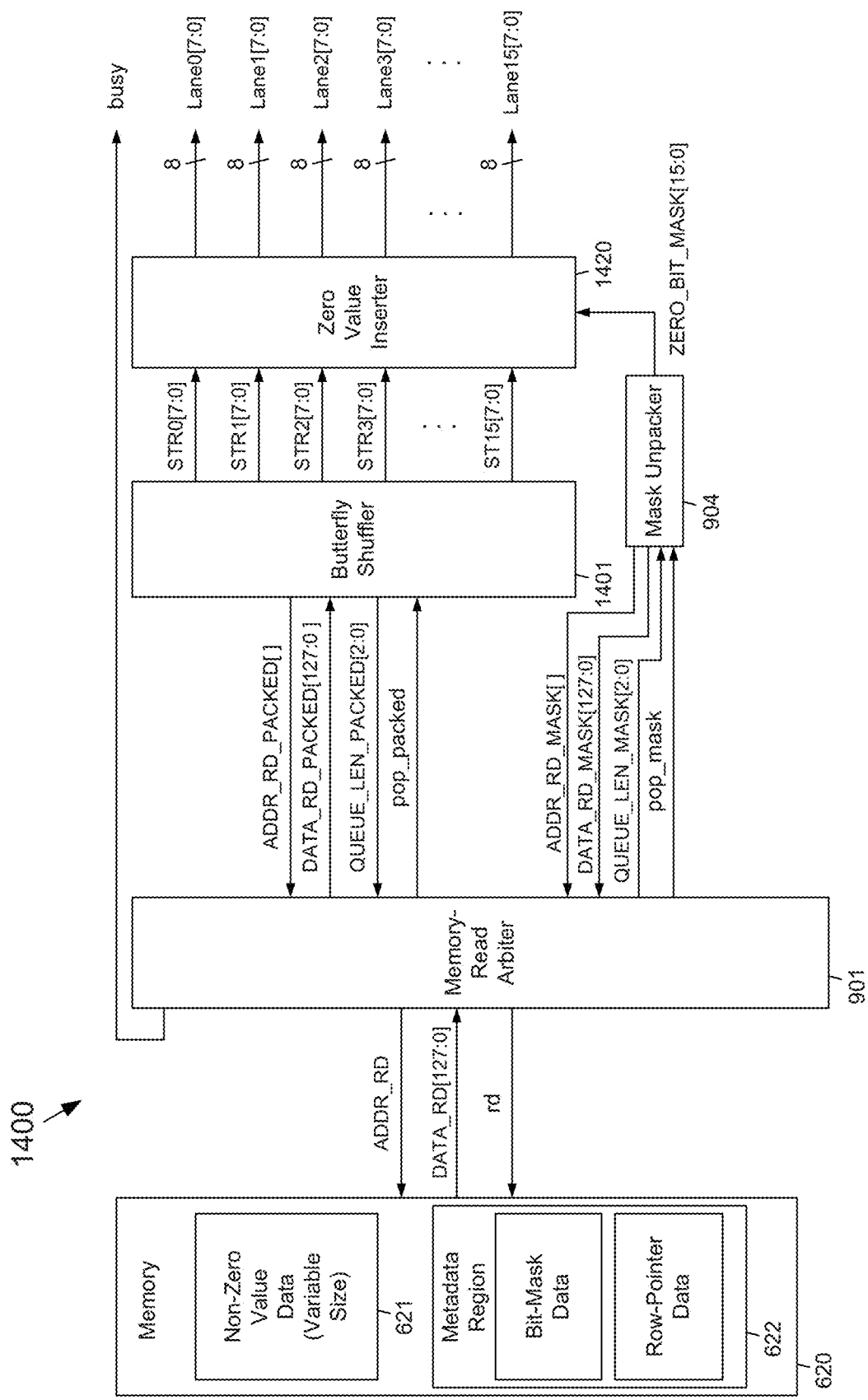
FIG. 14 depicts a block diagram of an example embodiment of an unpacker and decompressor circuit according to the subject matter disclosed herein.

FIG. 14 depicts a block diagram of an example embodiment of an unpacker and decompressor circuit 1400 according to the subject matter disclosed herein. The unpacker and decompressor circuit 1400 is similar to the unpacker and compressor circuit 900 depicted in FIG. 9 with the following differences. The non-zero values unpacker 902 is replaced in the decompressor circuit 1400 by a butterfly shuffler 1401. The zero-value inserter circuit 903 is replaced with circuit 1420 as to inflate (re-insert zeros) into each channel stream along the temporal stream index dimension. The various components forming the circuit 1400 (including the circuit 1400 as a whole) may be implemented as one or more circuits and/or as one or more modules.

The circuit 1400 operates generally in reverse to the channel-parallel compressor circuit 1200 of FIG. 12A by unpacking the non-zero value data in the memory region 621 of the memory 620 using the row-pointer data 614 and the zero bit mask data 613. The circuit 1400 may include a memory-read arbiter 901, the butterfly shuffler 1401, a zero value inserter 1420, and a mask unpacker 904. The memory-read arbiter 901 reads non-zero value data, row-pointer data and bit mask data from the memory 620. The non-zero values packer 902 unpacks the packed data based on the bit mask data. The zero value inserter 1420 inserts zero values into the unpacked data also based on the bit mask data.

The previously described embodiments may use a zero bit mask technique to encode zero values using one bit of a zero bit mask. That is, the previously described embodiments use a compression technique having a one data unit per bit-mask bit overhead. When 8-bit data units (i.e., bytes) are used, the overhead for the compression technique is one bit-mask bit per one byte of uncompressed data. Different granularities of compression may also be used according to the subject matter disclosed herein. For example, the activation and/or weight data may predominantly have small absolute values. If the granularity of compression is made finer, for example, based on nibbles, i.e., 4-bit data units, the activation and/or weight data may become even sparser at this level of granularity because many of the most significant nibbles (MSNs) of the activation and/or weight data may be zero, even for non-zero activations and weights. Compression of the data based on a nibble-per-bit compression granularity may be used to reduce the compression mask overhead. Alternatively, a coarser compression granularity may be used for extremely sparse data to reduce the compression mask overhead. That is, a two-byte-per-bit mask overhead may be used to reduce the compression mask overhead.

Figure 15:
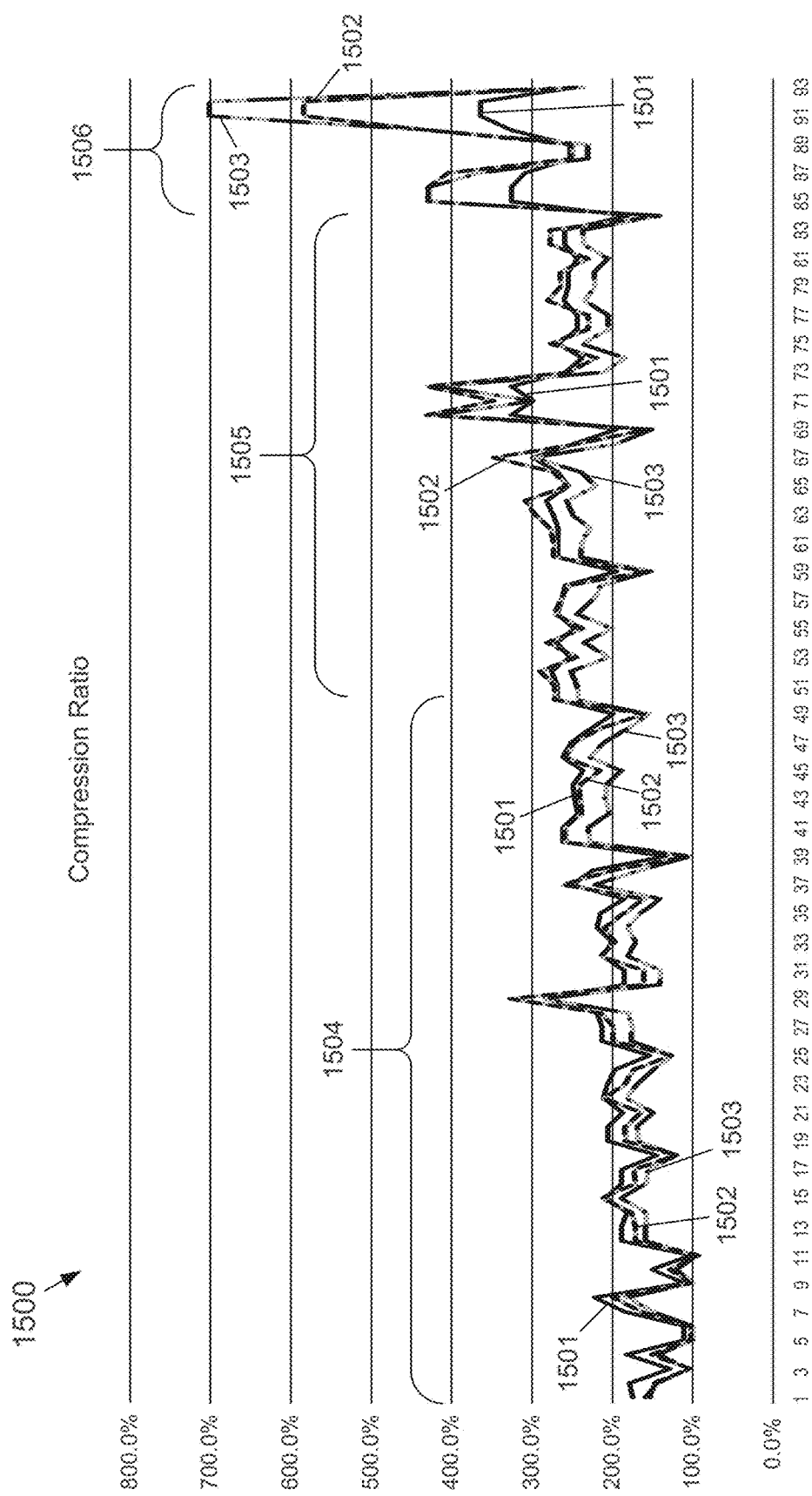
FIG. 15 shows a graph of compression ratio for three different granularities of compression for a commonly available example convolutional neural network.

FIG. 15 shows a graph 1500 of compression ratio for three different granularities of compression 1501-1503 for a commonly available example convolutional neural network (CNN), such as Google's Inception v3 CNN, with its weights quantized to int8 and activations quantized to uint8 data types. The layer numbers of the example CNN are shown along the abscissa of the graph 1500, and the compression ratio of activations in percentage is shown along the ordinate of the graph 1500. The scale of the ordinate may make the differences in the compression ratio difficult to see in places, so the compression ratios for the different compression granularities 1501-1503 are indicated in multiple places. Other example CNNs may provide similar compression ratios for different granularities of compression.

The compression ratio for an example channel-wise nibble compression granularity is indicated at 1501. The zero bit mask for the channel-wise nibble compression granularity uses one bit-mask bit per nibble. A compression ratio for a channel-wise one-byte compression granularity with a transposition technique is indicated at 1502. The zero bit mask for the one-byte compression granularity uses one bit-mask bit per byte of uncompressed data. A data unit of data may be a byte for 8-bit data. The transposition technique for the one-byte compression granularity operates to transpose the most-significant nibbles of a current data unit (e.g., byte) and a next channel-wise data unit (e.g., byte) to be together in the same data unit (e.g., byte), followed by the least-significant nibbles of the current data unit and the next channel-wise data unit to be in the next data unit.

Figure 17:
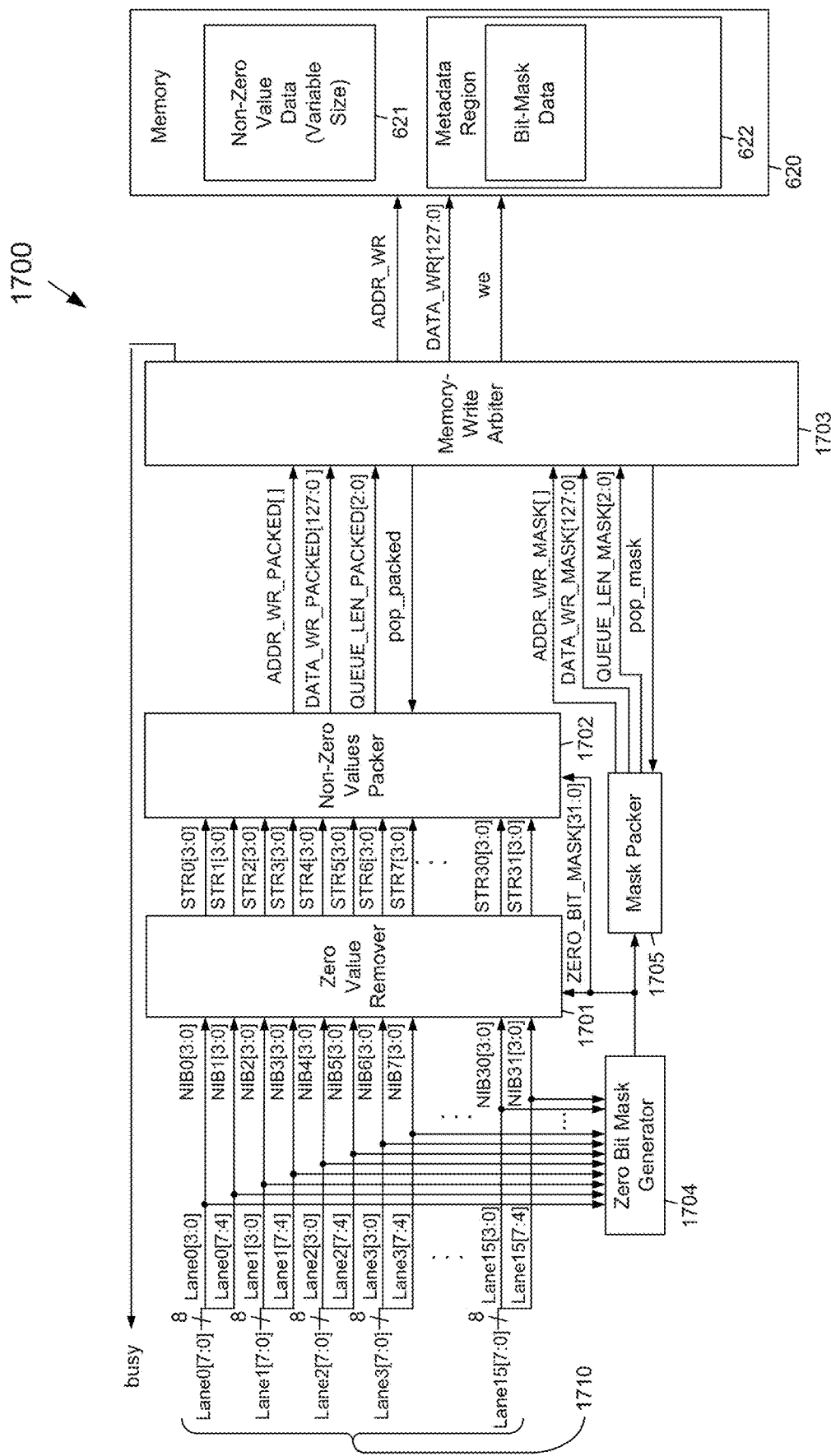
FIG. 17 depicts a block diagram of an example embodiment of a compression circuit that may provide a nibble compression granularity according to the subject matter disclosed herein.

The module depicted in FIG. 6A may be modified to compress data using a nibble-level granularity by splitting each incoming byte into two nibbles (upper and lower) and subsequently operating on nibbles instead of bytes, as depicted in FIG. 17. Similarly, the module depicted in FIG. 6A may be modified to compress data using a two-byte granularity by merging each incoming byte into a 16-bit unit and subsequently operating on the 16-bit units instead of bytes. Other granularities may also be used, including 2 bits, 4 bytes and so on.

FIG. 16A depicts a channel-wise transposition technique for an 8-bit data unit, i.e., a byte, according to the subject matter disclosed herein. In Lane 0, the original 8-bit data may include 0x02 0x07 0x08 xA . . . . After transposition, the 8-bit data of Lane 0 may now be arranged as 0x00 0x27 0x00 0x8A . . . , with both most-significant nibbles 0x0 and 0x0 of byte pair 0x02 and 0x07 forming byte 0x00 and both least-significant nibbles 0x2 and 0x7 forming the byte 0x27. Similar transpositions, i.e., taking each incoming pair of bytes and re-arranging its nibbles to splice the most-significant nibbles together and splice the least-significant nibbles together, occur in other lanes in FIG. 16A. FIG. 16B depicts the transposition technique for 16-bit data according to the subject matter disclosed herein. In Lane 0, the original 16-bit data may include 0x02 0x07 0x08 xA . . . . After transposition, the 16-bit data of Lane 0 may now be arranged as 0x00 0x00 0x27 0x8A, i.e., each pair of incoming 16-bit values being split into bytes followed by splicing the most-significant bytes together and splicing the least-significant bytes together. Similar transpositions occur in other lanes in FIG. 16B. Another transposition technique that may be used is cross-channel transposition in which portions of data units in adjacent channels are transposed with each other, as opposed to splicing most-significant (or least-significant) nibbles (or bytes) in each lane independently of other lanes.

A compression ratio for a two-byte compression granularity per channel with a transpose technique is indicated at 1502 in FIG. 15. The transposition technique for the two-byte compression granularity operates to transpose the most-significant nibbles of two current data units and the next channel-wise two data units to be together in the same two data units, followed by least-significant nibbles of the two current data units and the next two channel-wise data units to be in the next two data units.

As can be seen from the graph 1500, the nibble compression granularity 1501 generally provides a greater compression ratio than the other two compression granularities toward the beginning to the middle layers of the example CNN, which are indicated at 1504. The activation and/or weights generally have a moderate sparsity in this range of layers of the example CNN. In particular, a nibble-granularity compression performs especially well when—in addition to activations having a moderate sparsity—activations have values that are small in absolute magnitude, i.e., values 1 . . . 15 that may be encoded in the lowest nibble of a byte (e.g., uint8), while the highest nibble of that byte equals to zero.

From the middle layers toward the end layers of the CNN, indicated at 1505 in FIG. 15, the one-byte compression granularity 1502 generally provides the best compression ratio. In this range of layers of the example CNN, the activation and weight data has generally an increased sparsity as compared to the data in the layer range 1504. In the end layers of the CNN where sparsity is the greatest, indicated at 1506, the two-byte compression granularity 1503 generally provides the best compression ratio. Thus, selection of a compression granularity may optimize the compression ratio for a given layer and/or for a given range of layers of a CNN, as well as weight kernels.

FIG. 17 depicts a block diagram of an example embodiment of a compression circuit 1700 that may provide a nibble compression granularity according to the subject matter disclosed herein. The compression circuit 1700 is similar to the compression circuit 600 depicted in FIG. 6A and operates generally the same way. A difference is that the zero value remover 1701, the non-zero values packer 1702, the memory-write arbiter 1703 and the zero bit mask generator 1704 may be configured to operate on nibbles as opposed to bytes. A row-pointer generator may be used when random access is required. FIG. 17 depicts a case where random access is not required with the row pointer generated omitted. Other embodiments may be configured to operate on bytes as a compression granularity and/or multiple bytes as a compression granularity. The various components forming the circuit 1700 (including the circuit 1700 as a whole) may be implemented as one or more circuits and/or as one or more modules.

The leftmost column of Table 1 shows an example set of data that may be input to the zero value remover 1701 of the circuit 1700 at a first clock cycle. The middle column shows the output of the zero value remover 1701 that is input to the non-zero values packer 1702 based on the example set of input data. The rightmost column of Table 1 shows the output of the zero value remover 1701 at a second clock cycle for the example set of input data. An "X" in the following tables represents a "do not care" value.

TABLE 1

| INPUT TO ZERO VALUE REMOVER 1701 | INPUT TO NON-ZERO VALUES PACKER 1702 | |
|---|---|---|
| LANE0 = 0x00 | NIB0 = 0x0 | STR0 = X |
|  | NIB1 = 0x0 | STR1 = X |
| LANE1 = 0x03 | NIB2 = 0x0 | STR2 = X |
|  | NIB3 = 0x3 | STR3 = X |
| LANE2 = 0x15 | NIB4 = 0x1 | STR4 = X |
|  | NIB5 = 0x5 | STR5 = X |
| LANE3 = 0x10 | NIB6 = 0x1 | STR6 = X |
|  | NIB7 = 0x0 | STR7 = X |
| LANE4 = 0x2A | NIB8 = 0x2 | STR8 = X |
|  | NIB9 = 0xA | STR9 = X |
| LANE5 = 0x06 | NIB10 = 0x0 | STR10 = X |
|  | NIB11 = 0x6 | STR11 = X |
| LANE6 = 0x1E | NIB12 = 0x1 | STR12 = X |
|  | NIB13 = 0xE | STR13 = X |
| LANE7 = 0x00 | NIB14 = 0x0 | STR14 = X |
|  | NIB15 = 0x0 | STR15 = X |
| LANE8 = 0x09 | NIB16 = 0x0 | STR16 = X |
|  | NIB17 = 0x9 | STR17 = 0x3 |
| LANE9 = 0x12 | NIB18 = 0x1 | STR18 = 0x1 |
|  | NIB19 = 0x2 | STR19 = 0x5 |
| LANE10 = 0x10 | NIB20 = 0x1 | STR20 = 0x1 |
|  | NIB21 = 0x0 | STR21 = 0x2 |
| LANE11 = 0x00 | NIB22 = 0x0 | STR22 = 0xA |
|  | NIB23 = 0x0 | STR23 = 0x6 |
| LANE12 = 0x07 | NIB24 = 0x0 | STR24 = 0x1 |
|  | NIB25 = 0x7 | STR25 = 0xE |
| LANE13 = 0x00 | NIB26 = 0x0 | STR26 = 0x9 |
|  | NIB27 = 0x0 | STR27 = 0x1 |
| LANE14 = 0x00 | NIB28 = 0x0 | STR28 = 0x2 |
|  | NIB29 = 0x0 | STR29 = 0x1 |
| LANE15 = 0x05 | NIB30 = 0x0 | STR30 = 0x7 |
|  | NIB31 = 0x5 | STR31 = 0x5 |

The zero bit mask output from the zero bit mask generator 1704 for the example input data is 0111 1101 1110 0001 1100 0100 1000 0111, in which a "1" represents a zero value. The left column of Table 2 shows the packed data and the zero bit mask data in the FIFOs of the non-zero values packer 1702 and the mask packer 1705 that will be output from the memory-write arbiter 1703 for the example data input of Table 1. The "Xs" in the left column of Table 2 represent the FIFOs filling, but not yet filled. The right column of Table 2 shows the contents of the memory 620 prior to the data in the FIFOs of the memory-write arbiter 1703 being written into the memory 620 (i.e., the data has not yet been written to the memory 620).

TABLE 2

| FIFO PACKED | MEMORY PACKED |
|---|---|
| 0x571219E1 | @ 0x0000 |
| 0x6A21513X |  |
| XXXXXXXX |  |
| XXXXXXXX |  |

| FIFO MASK | MEMORY MASK |
|---|---|
| 0x7DE1C487 | @ 0x1000 |
| XXXXXXXX |  |
| XXXXXXXX |  |
| XXXXXXXX |  |

The leftmost column of Table 3 shows the next example data that is input to the zero value remover 1701 of the circuit 1700 at the second clock cycle. The middle column is the output from the zero value remover 1701 that is input to the non-zero values packer 1702. The rightmost column of Table 3 shows the output of the zero value remover 1701 at a third clock cycle.

TABLE 3

| INPUT TO ZERO VALUE REMOVER 1701 | INPUT TO NON-ZERO VALUES PACKER 1702 | |
|---|---|---|
| LANE0 = 0x27 | NIB0 = 0x2 | STR0 = X |
|  | NIB1 = 0x7 | STR1 = X |
| LANE1 = 0x2F | NIB2 = 0x2 | STR2 = X |
|  | NIB3 = 0xF | STR3 = X |
| LANE2 = 0x32 | NIB4 = 0x3 | STR4 = X |
|  | NIB5 = 0x2 | STR5 = X |
| LANE3 = 0x19 | NIB6 = 0x1 | STR6 = X |
|  | NIB7 = 0x9 | STR7 = X |
| LANE4 = 0x00 | NIB8 = 0x0 | STR8 = X |
|  | NIB9 = 0x0 | STR9 = X |
| LANE5 = 0xB0 | NIB10 = 0xB | STR10 = X |
|  | NIB11 = 0x0 | STR11 = 0x2 |
| LANE6 = 0x00 | NIB12 = 0x0 | STR12 = 0x7 |
|  | NIB13 = 0x0 | STR13 = 0x2 |
| LANE7 = 0x12 | NIB14 = 0x1 | STR14 = 0xF |
|  | NIB15 = 0x2 | STR15 = 0x3 |
| LANE8 = 0x20 | NIB16 = 0x2 | STR16 = 0x2 |
|  | NIB17 = 0x0 | STR17 = 0x1 |
| LANE9 = 0x00 | NIB18 = 0x0 | STR18 = 0x9 |
|  | NIB19 = 0x0 | STR19 = 0xB |
| LANE10 = 0x0C | NIB20 = 0x0 | STR20 = 0x1 |
|  | NIB21 = 0xC | STR21 = 0x2 |
| LANE11 = 0x21 | NIB22 = 0x2 | STR22 = 0x2 |
|  | NIB23 = 0x1 | STR23 = 0xC |
| LANE12 = 0x10 | NIB24 = 0x1 | STR24 = 0x2 |
|  | NIB25 = 0x0 | STR25 = 0x1 |
| LANE13 = 0x98 | NIB26 = 0x9 | STR26 = 0x1 |
|  | NIB27 = 0x8 | STR27 = 0x9 |
| LANE14 = 0x71 | NIB28 = 0x7 | STR28 = 0x8 |
|  | NIB29 = 0x1 | STR29 = 0x7 |
| LANE15 = 0xA0 | NIB30 = 0xA | STR30 = 0x1 |
|  | NIB31 = 0x0 | STR31 = 0xA |

The zero bit mask output from the zero bit mask generator 1704 for the example input data is 1000 0010 0001 1110 0011 1011 0000 0000. The left column of Table 4 shows the packed data and the zero bit mask data that will be output from the respective FIFOs of the non-zero values packer 1702 and the mask packer 1705 to the memory-write arbiter 1703 for the example data input of Table 3. The right column Table 4 shows the contents of the memory 620.

TABLE 4

| FIFO PACKED | MEMORY PACKED |
|---|---|
| 0xF272XXXX | @ 0x0000 |
| XXXXXXXX | 0x571219E1 |
| XXXXXXXX | 0x6A21513A |
| XXXXXXXX | 0x1789112C |
|  | 0x221B9123 |

| FIFO MASK | MEMORY MASK |
|---|---|
| 0x7DE1C487 | @ 0x1000 |
| 0x821E3D00 |  |
| XXXXXXXX |  |
| XXXXXXXX |  |

TABLE 6

| FIFO PACKED | MEMORY PACKED |
|---|---|
| 0xF272FE96 | @ 0x0000 |
| 0x DA511355 | 0x571219E1 |
| 0x492BB9E8 | 0x6A21513A |
| 0x4XXXXXXX | 0x1789112C |
|  | 0X221B9123 |

| FIFO MASK | MEMORY MASK |
|---|---|
| 0x7DE1C487 | @ 0x1000 |
| 0x821E3D00 |  |
| 0x27304A82 |  |
| XXXXXXXX |  |

The leftmost column of Table 5 shows the next example data that is input to the zero value remover 1701 of the circuit 1700 at the third clock cycle. The middle column is the output of the zero value remover 1701 that is input to the non-zero values packer 1702. The rightmost column of Table 5 shows the output of the zero value remover 1701 at a fourth clock cycle.

TABLE 5

| INPUT TO ZERO VALUE REMOVER 1701 | | INPUT TO NON-ZERO VALUES PACKER 1702 |
|---|---|---|
| LANE0 = 0x40 | NIB0 = 0x4 | STR0 = X |
|  | NIB1 = 0x0 | STR1 = X |
| LANE1 = 0x8E | NIB2 = 0x8 | STR2 = X |
|  | NIB3 = 0xE | STR3 = X |
| LANE2 = 0x9B | NIB4 = 0x9 | STR4 = X |
|  | NIB5 = 0xB | STR5 = X |
| LANE3 = 0x0B | NIB6 = 0x0 | STR6 = X |
|  | NIB7 = 0xB | STR7 = X |
| LANE4 = 0x29 | NIB8 = 0x2 | STR8 = X |
|  | NIB9 = 0x9 | STR9 = X |
| LANE5 = 0x00 | NIB10 = 0x0 | STR10 = X |
|  | NIB11 = 0x0 | STR11 = 0x4 |
| LANE6 = 0x45 | NIB12 = 0x4 | STR12 = 0x8 |
|  | NIB13 = 0x5 | STR13 = 0xE |
| LANE7 = 0x05 | NIB14 = 0x0 | STR14 = 0x9 |
|  | NIB15 = 0x5 | STR15 = 0xB |
| LANE8 = 0x31 | NIB16 = 0x3 | STR16 = 0xB |
|  | NIB17 = 0x1 | STR17 = 0x2 |
| LANE9 = 0x15 | NIB18 = 0x1 | STR18 = 0x9 |
|  | NIB19 = 0x5 | STR19 = 0x4 |
| LANE10 = 0x00 | NIB20 = 0x0 | STR20 = 0x5 |
|  | NIB21 = 0x0 | STR21 = 0x5 |
| LANE11 = 0xAD | NIB22 = 0xA | STR22 = 0x3 |
|  | NIB23 = 0xD | STR23 = 0x1 |
| LANE12 = 0x00 | NIB24 = 0x0 | STR24 = 0x1 |
|  | NIB25 = 0x0 | STR25 = 0x5 |
| LANE13 = 0x06 | NIB26 = 0x0 | STR26 = 0xA |
|  | NIB27 = 0x6 | STR27 = 0xD |
| LANE14 = 0x90 | NIB28 = 0x9 | STR28 = 0x6 |
|  | NIB29 = 0x0 | STR29 = 0x9 |
| LANE15 = 0xEF | NIB30 = 0xE | STR30 = 0xE |
|  | NIB31 = 0xF | STR31 = 0xF |

The zero bit mask output from the zero bit mask generator 1704 for the example input data is 0010 0111 0011 0000 0100 1100 0100 0010. The left column of Table 6 shows the packed data and the zero bit mask data that will be output from the respective FIFOs of the non-zero values packer 1702 and the mask packer 1705 to the memory-write arbiter 1703 for the example data input of Table 5. The right column shows the contents of the memory 620.

The leftmost column of Table 7 shows an example set of data that is input to the zero value remover 1701 of the circuit 1700 at the fourth clock cycle. The middle column is the output of the zero value remover 1701 that is input to the non-zero values packer 1702. The rightmost column of Table 7 shows the output of the zero value remover 1701 at the fifth clock cycle.

TABLE 7

| INPUT TO ZERO VALUE REMOVER 1701 | | INPUT TO NON-ZERO VALUES PACKER 1702 |
|---|---|---|
| LANE0 = 0x08 | NIB0 = 0x0 | STR0 = X |
|  | NIB1 = 0x8 | STR1 = X |
| LANE1 = 0x88 | NIB2 = 0x8 | STR2 = X |
|  | NIB3 = 0x8 | STR3 = X |
| LANE2 = 0xDA | NIB4 = 0xD | STR4 = X |
|  | NIB5 = 0xA | STR5 = X |
| LANE3 = 0x00 | NIB6 = 0x0 | STR6 = X |
|  | NIB7 = 0x0 | STR7 = X |
| LANE4 = 0x7F | NIB8 = 0x7 | STR8 = X |
|  | NIB9 = 0xF | STR9 = 0x8 |
| LANE5 = 0x07 | NIB10 = 0x0 | STR10 = 0x8 |
|  | NIB11 = 0x7 | STR11 = 0x8 |
| LANE6 = 0x23 | NIB12 = 0x2 | STR12 = 0xD |
|  | NIB13 = 0x3 | STR13 = 0xA |
| LANE7 = 0x00 | NIB14 = 0x0 | STR14 = 0x7 |
|  | NIB15 = 0x0 | STR15 = 0xF |
| LANE8 = 0xB1 | NIB16 = 0xB | STR16 = 0x7 |
|  | NIB17 = 0x1 | STR17 = 0x2 |
| LANE9 = 0xA5 | NIB18 = 0xA | STR18 = 0x3 |
|  | NIB19 = 0x5 | STR19 = 0xB |
| LANE10 = 0x11 | NIB20 = 0x1 | STR20 = 0x1 |
|  | NIB21 = 0x1 | STR21 = 0xA |
| LANE11 = 0xD4 | NIB22 = 0xD | STR22 = 0x5 |
|  | NIB23 = 0x4 | STR23 = 0x1 |
| LANE12 = 0x29 | NIB24 = 0x2 | STR24 = 0x1 |
|  | NIB25 = 0x9 | STR25 = 0xD |
| LANE13 = 0xB0 | NIB26 = 0xB | STR26 = 0x4 |
|  | NIB27 = 0x0 | STR27 = 0x2 |
| LANE14 = 0x50 | NIB28 = 0x5 | STR28 = 0x9 |
|  | NIB29 = 0x0 | STR29 = 0xB |
| LANE15 = 0x02 | NIB30 = 0x0 | STR30 = 0x5 |
|  | NIB31 = 0x2 | STR31 = 0x2 |

The zero bit mask output from the zero bit mask generator 1704 for the example input data is 0110 1000 0000 0000 1100 0100 1100 0001. The left column of Table 8 sets forth the packed data and the zero bit mask data that will be output from the respective FIFOs of the non-zero values packer 1702 and the mask packer 1705 to the memory-write arbiter 1703 for the example data input of Table 7. The right column shows the contents of the memory 620.

TABLE 8

| FIFO PACKED | MEMORY PACKED |
|---|---|
| 0x115A1B32 | @ 0x0000 |
| 0x7F7AD888 | 0x571219E1 |
| XXXXXXXX | 0x6A21513A |
| XXXXXXXX | 0x1789112C |
| | 0x221B9123 |
| | @ 0x0001 |
| | 0xF272FE96 |
| | 0x DA511355 |
| | 0x492BB9E8 |
| | 0x425B924D |

| FIFO MASK | MEMORY MASK |
|---|---|
| XXXXXXXX | @ 0x1000 |
| XXXXXXXX | 0x7DE1C487 |
| XXXXXXXX | 0x821E3D00 |
| XXXXXXXX | 0x27304A82 |
| | 0x6800C8C1 |

Figure 18:
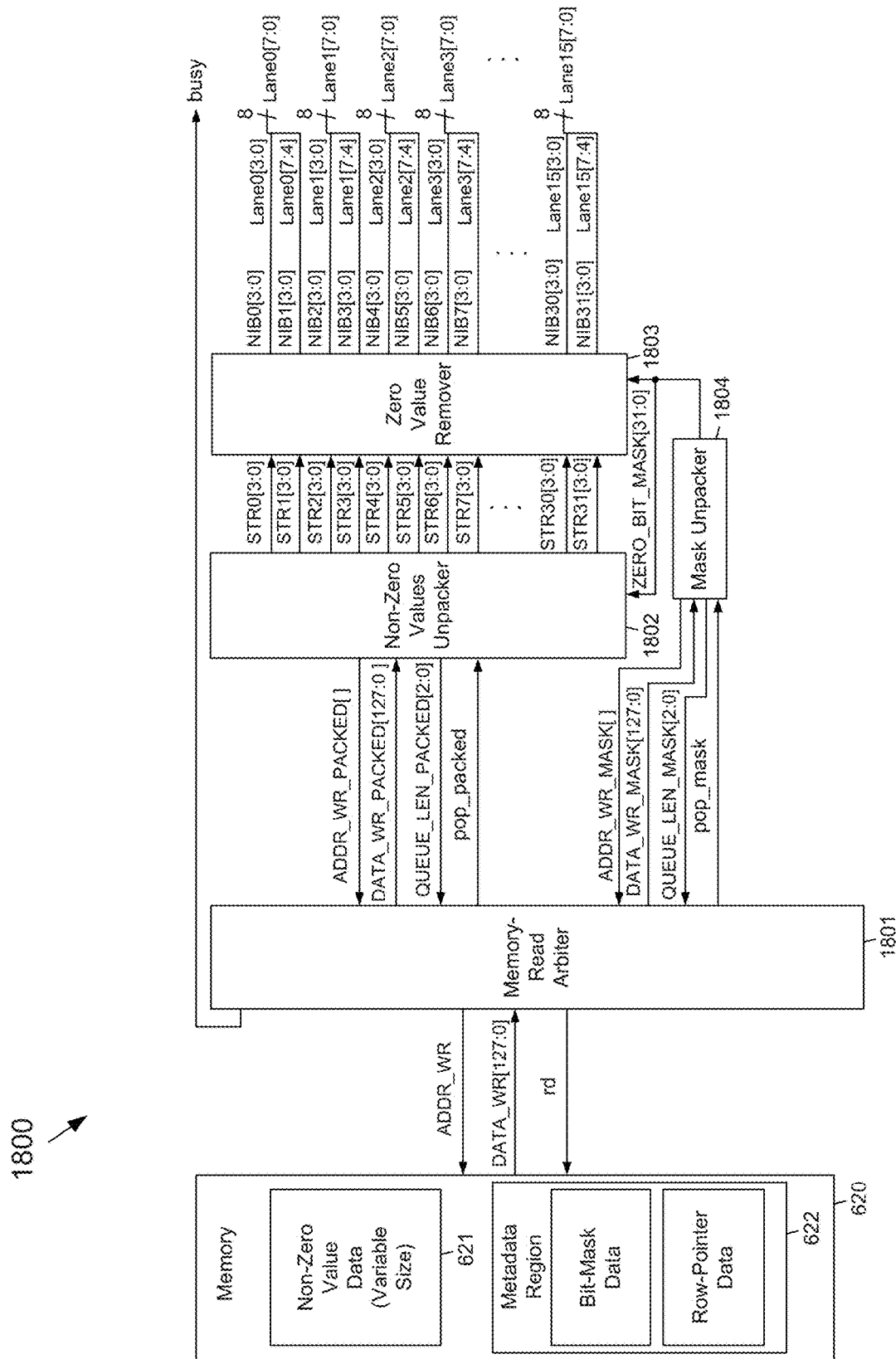
FIG. 18 depicts a block diagram of an example embodiment of a decompression circuit that may be used with the compression circuit of FIG. 17 according to the subject matter disclosed herein.

FIG. 18 depicts a block diagram of an example embodiment of a decompression circuit 1800 that may be used with the compression circuit 1700 according to the subject matter disclosed herein. The decompression circuit 1800 is similar to the compression circuit 900 depicted in FIG. 9 and operates generally the same way. A difference is that the non-zero values unpacker 1802 and the zero values inserter 1803 may be configured to operate on nibbles as opposed to bytes. Another difference is that in this particular example, direct memory access is removed and the row pointer module is omitted. The various components forming the circuit 1800 (including the circuit 1800 as a whole) may be implemented as one or more circuits and/or as one or more modules.

An alternative method to performing random access of the packed data stored the memory 620 may utilize a control logic (not shown) that may count the zero bits in the zero bit mask—as data is being compressed—and may form a lookup table providing offsets into uncompressed data to offset into compressed data (i.e., stored in the memory 620). That is, the uncompressed data at offset X has been stored at physical address Y. In one embodiment, the lookup table granularity may be based on logical offset entries, such as 0x000 x0040, 0x0080, etc., to provide a step of 0x0040 per table entry. Other steps may be used. Alternatively, if addresses that will need to be read later are known in advance, the table entries may be setup based on those address. In still another alternative embodiment, the table structure may be configured to be like a tree structure. Relatively smaller steps will generally increase the table size, so the step size may be selected based on available memory. To retrieve data at an arbitrary logic offset X, the physical address Y may be found in the lookup table corresponding to X. If the table does not contain an exact Y(X), then find Xp and Yp such that Xp immediately precedes X. The bit mask is then read to determine Y(X), and the Y(X) is read from memory 620. Table 9 shows an example lookup table.

TABLE 9

| Offset into Uncompressed (Logical) Data | Offset into Compressed (Physical) SRAM Data |
|---|---|
| 0x0000 | 0x0000 |
| 0x0010 | 0x0008 |
| 0x0020 | 0x000A |
| . . . | . . . |

Figure 19:
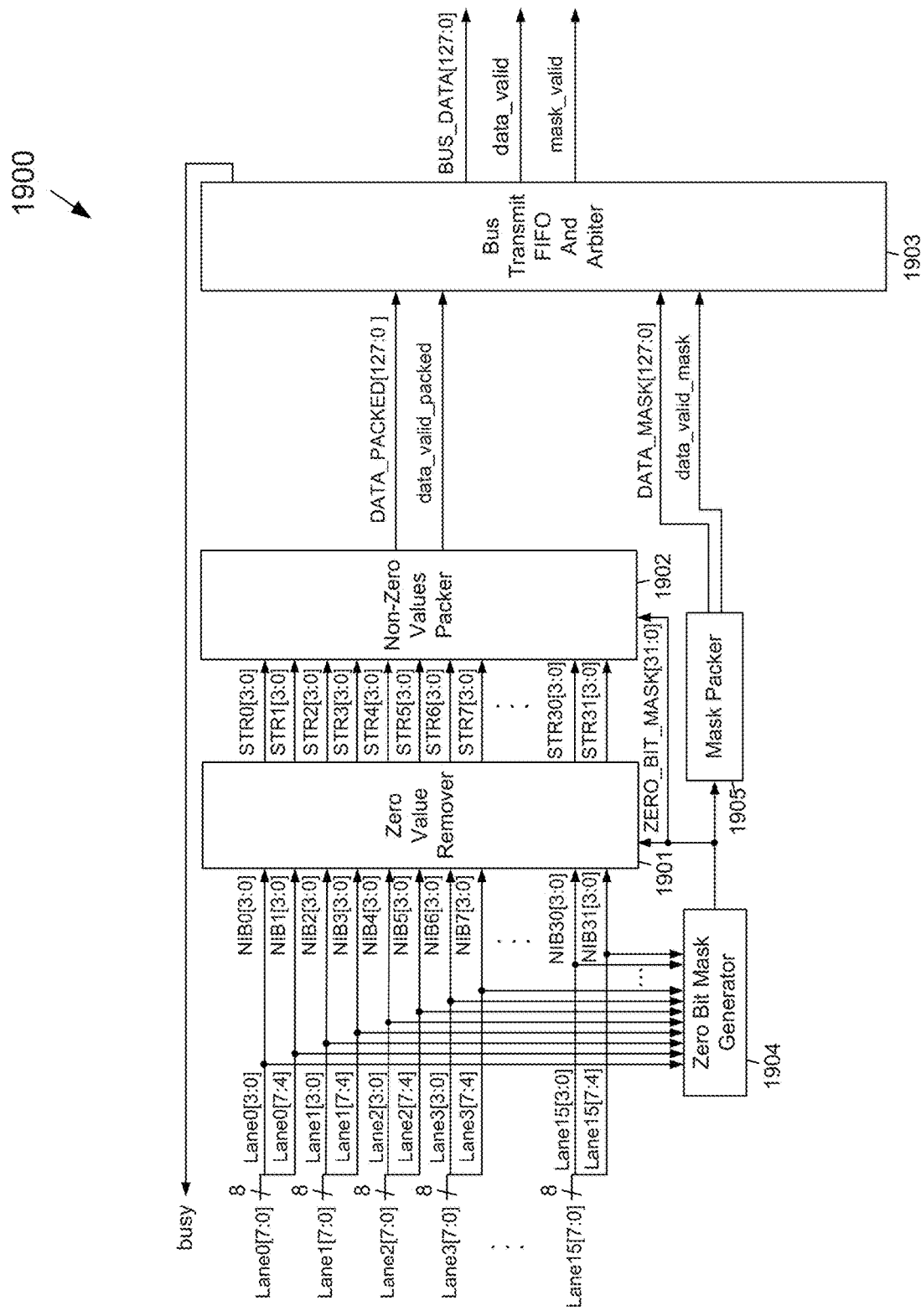
FIG. 19 depicts a block diagram of an example embodiment of a compression circuit that may provide a nibble compression granularity and may be used for transmitting compressed data over a bus according to the subject matter disclosed herein.

The various embodiments disclosed herein may be used for compressing and decompressing data for transmission over a bus as opposed to storage and retrieve to and from a memory. FIG. 19 depicts a block diagram of an example embodiment of a compression circuit 1900 that may provide a nibble compression granularity and may be used for transmitting compressed data over a bus according to the subject matter disclosed herein. The compression circuit 1900 is similar to the compression circuit 1700 depicted in FIG. 17 and operates generally the same way. A difference is that a bus transmit FIFO and arbiter 1903 replaces the memory-write arbiter 1703. In addition to outputting the compressed packed data, the bus transmit FIFO and arbiter 1903 outputs a data_valid signal and a mask_valid signal. The data_valid signal is active when the BUS_DATA being transmitted is compressed packed data, and the mask_valid signal is active when the BUS_DATA being transmitted is zero bit mask data. Both the data_valid signal and the mask_valid signal are inactive when no data is being transmitted over the bus. Otherwise, the compression circuit 1900 operates in the same way as the compression circuit 1700. The various components forming the circuit 1900 (including the circuit 1900 as a whole) may be implemented as one or more circuits and/or as one or more modules.

Figure 20:
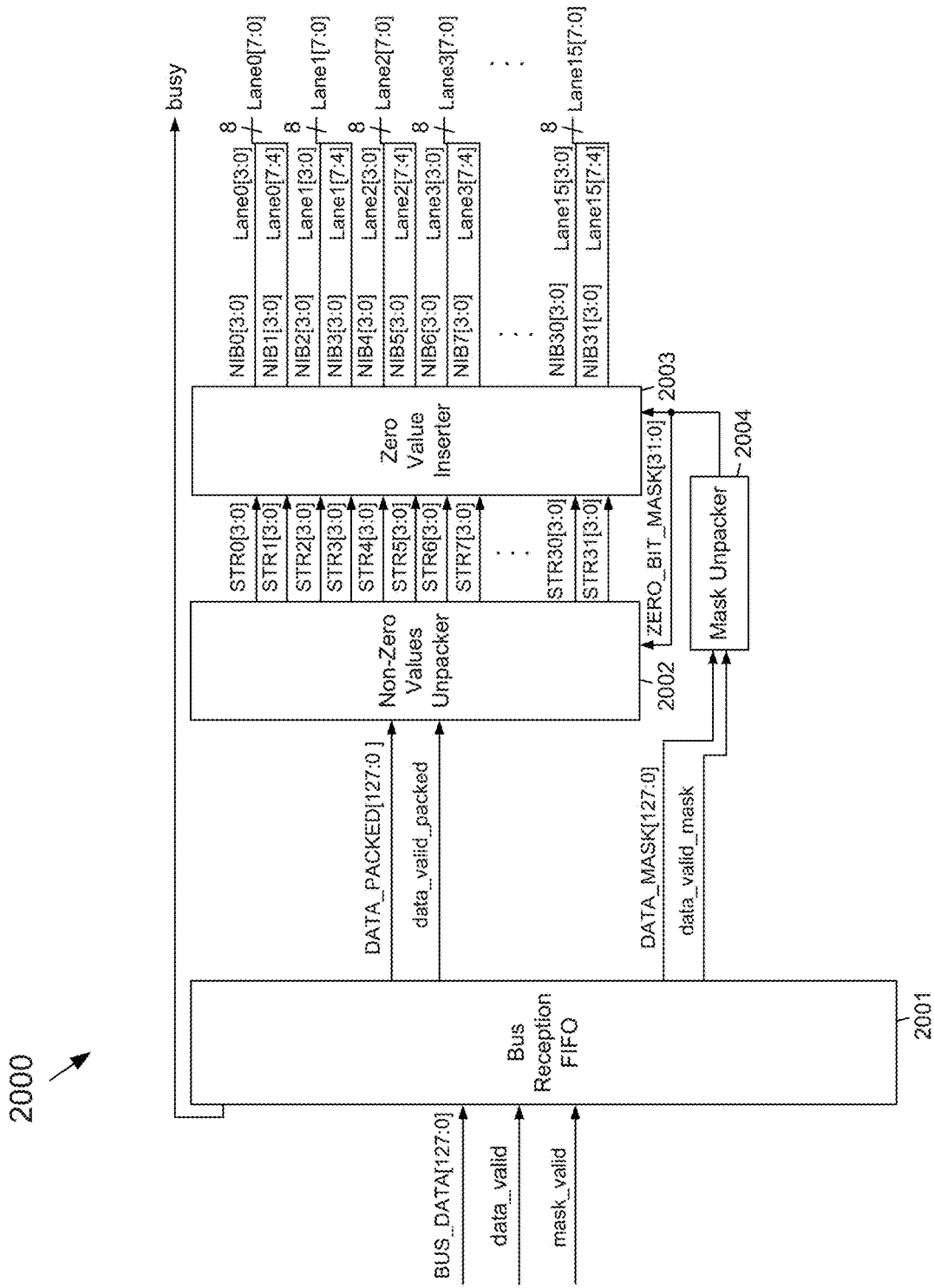
FIG. 20 depicts a block diagram of an example embodiment of a decompression circuit that may provide a nibble compression granularity and may be used for receiving compressed data over a bus according to the subject matter disclosed herein.

FIG. 20 depicts a block diagram of an example embodiment of a decompression circuit 2000 that may a nibble compression granularity and may be used for receiving compressed data over a bus according to the subject matter disclosed herein. The compression circuit 2000 is similar to the compression circuit 1800 depicted in FIG. 18 and operates generally the same way. A difference is that a bus reception FIFO 2001 replaces the memory-read arbiter 1801. A data_valid signal is active when the BUS_DATA being received is compressed packed data, and the mask_valid signal is active when the BUS_DATA being received is zero bit mask data. Both the data_valid signal and the mask_valid signal are inactive when no data is being received over the bus. Otherwise, the decompression circuit 2000 operates in the same way as the decompression circuit 1800. The various components forming the circuit 2000 (including the circuit 2000 as a whole) may be implemented as one or more circuits and/or as one or more modules.

Figure 21:
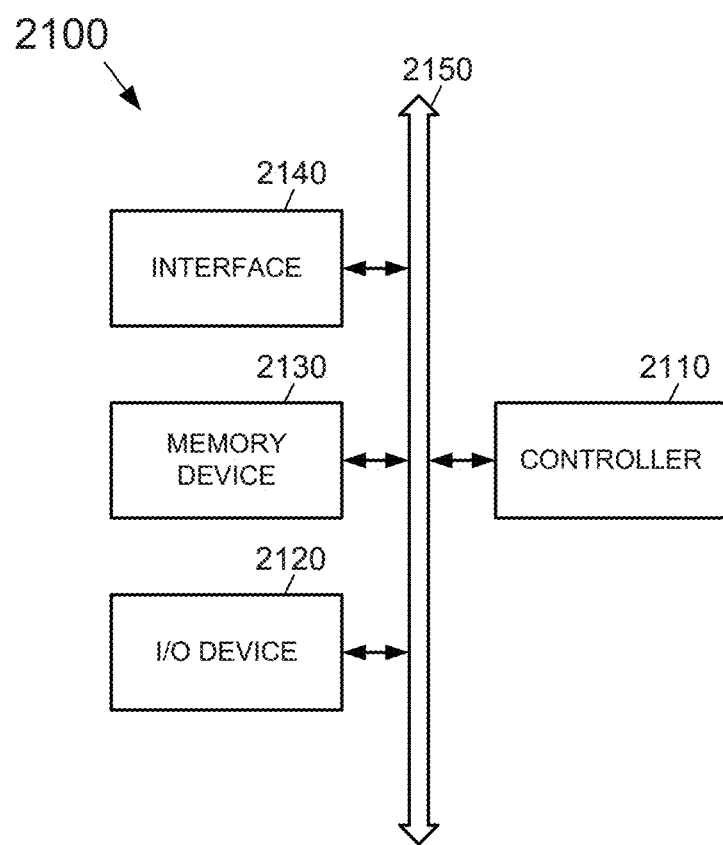
FIG. 21 depicts an electronic device that includes a data compressor and/or a data decompressor that uses a butterfly shuffler according to the subject matter disclosed herein.

FIG. 21 depicts an electronic device 2100 that may include a data compressor and/or a data decompressor that uses a butterfly shuffler according to the subject matter disclosed herein. Electronic device 2100 may be used in, but not limited to, a computing device, a personal digital assistant (PDA), a laptop computer, a mobile computer, a web tablet, a wireless phone, a cell phone, a smart phone, a digital music player, or a wireline or wireless electronic device. The electronic device 2100 may include a controller 2110, an input/output device 2120 such as, but not limited to, a keypad, a keyboard, a display, a touch-screen display, a camera, and/or an image sensor, a memory 2130, and an interface 2140 that are coupled to each other through a bus 2150. The controller 2110 may include, for example, at least one microprocessor, at least one digital signal process, at least one microcontroller, or the like. The memory 2130 may be configured to store a command code to be used by the controller 2110 or a user data.

Electronic device 2100 and the various system components of electronic device 2100 may include a data compressor and/or data decompressor that uses a butterfly shuffler according to the subject matter disclosed herein. The interface 2140 may be configured to include a wireless interface that is configured to transmit data to or receive data from a wireless communication network using a RF signal.

The wireless interface 840 may include, for example, an antenna, a wireless transceiver and so on. The electronic system 800 also may be used in a communication interface protocol of a communication system, such as, but not limited to, Code Division Multiple Access (CDMA), Global System for Mobile Communications (GSM), North American Digital Communications (NADC), Extended Time Division Multiple Access (E-TDMA), Wideband CDMA (WCDMA), CDMA2000, Wi-Fi, Municipal Wi-Fi (Muni Wi-Fi), Bluetooth, Digital Enhanced Cordless Telecommunications (DECT), Wireless Universal Serial Bus (Wireless USB), Fast low-latency access with seamless handoff Orthogonal Frequency Division Multiplexing (Flash-OFDM), IEEE 802.20, General Packet Radio Service (GPRS), iBurst, Wireless Broadband (WiBro), WiMAX, WiMAX-Advanced, Universal Mobile Telecommunication Service-Time Division Duplex (UMTS-TDD), High Speed Packet Access (HSPA), Evolution Data Optimized (EVDO), Long Term Evolution-Advanced (LTE-Advanced), Multichannel Multipoint Distribution Service (MMDS), and so forth.

Embodiments of the subject matter and the operations described in this specification can be implemented in digital electronic circuitry, or in computer software, firmware, or hardware, including the structures disclosed in this specification and their structural equivalents, or in combinations of one or more of them. Embodiments of the subject matter described in this specification may be implemented as one or more computer programs, i.e., one or more modules of computer-program instructions, encoded on computer-storage medium for execution by, or to control the operation of, data-processing apparatus. Alternatively or in addition, the program instructions can be encoded on an artificially-generated propagated signal, e.g., a machine-generated electrical, optical, or electromagnetic signal that is generated to encode information for transmission to suitable receiver apparatus for execution by a data processing apparatus. A computer-storage medium can be, or be included in, a computer-readable storage device, a computer-readable storage substrate, a random or serial-access memory array or device, or a combination thereof. Moreover, while a computer-storage medium is not a propagated signal, a computer-storage medium may be a source or destination of computer-program instructions encoded in an artificially-generated propagated signal. The computer-storage medium can also be, or be included in, one or more separate physical components or media (e.g., multiple CDs, disks, or other storage devices).

The operations described in this specification may be implemented as operations performed by a data-processing apparatus on data stored on one or more computer-readable storage devices or received from other sources. The term "data-processing apparatus" encompasses all kinds of apparatus, devices and machines for processing data, including by way of example, a programmable processor, a computer, a system on a chip, or multiple ones, or combinations, of the foregoing The apparatus may include special-purpose logic circuitry, e.g., an FPGA (field programmable gate array) or an ASIC (application-specific integrated circuit). The apparatus may also include, in addition to hardware, code that creates an execution environment for the computer program, e.g., code that constitutes processor firmware, a protocol stack, a database-management system, an operating system, a cross-platform runtime environment, a virtual machine, or a combination thereof. The apparatus and execution environment may realize various different computing model infrastructures, such as web services, distributed computing and grid computing infrastructures.

A computer program (also known as a program, software, software application, script, or code) may be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program may be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program may be deployed to be executed on one computer or on multiple computers that are located at one site or distributed across multiple sites and interconnected by a communication network.

The processes and logic flows described in this specification may be performed by one or more programmable processors executing one or more computer programs to perform actions by operating on input data and generating output. The processes and logic flows may also be performed by, and apparatus can also be implemented as, special-purpose logic circuitry, e.g., an FPGA (field programmable gate array) or an ASIC (application-specific integrated circuit). Processors suitable for the execution of a computer program include, by way of example, both general-purpose and special-purpose microprocessors, and any one or more processors of any kind of digital computer. Generally, a processor may receive instructions and data from a read-only memory or a random access memory or both. The essential elements of a computer are a processor for performing actions in accordance with instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. A computer, however, need not have such devices. Moreover, a computer may be embedded in another device, e.g., a mobile telephone, a personal-digital assistant (PDA), a mobile audio or video player, a game console, a Global Positioning System (GPS) receiver, or a portable storage device (e.g., a universal serial bus (USB) flash drive), to name just a few. Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory may be supplemented by, or incorporated in, special-purpose logic circuitry.

To provide for interaction with a user, embodiments of the subject matter described in this specification may be implemented on a computer having a display device, e.g., a CRT (cathode ray tube) or LCD (liquid crystal display) monitor, for displaying information to the user and a keyboard and a pointing device, e.g., a mouse or a trackball, with which the user can provide input to the computer. Other kinds of devices can be used to provide for interaction with a user as well; for example, feedback provided to the user may be any form of sensory feedback, e.g., visual feedback, auditory feedback, or tactile feedback; and input from the user may be received in any form, including acoustic, speech, or tactile input.

Embodiments of the subject matter described in this specification may be implemented in a computing system that includes a back-end component, e.g., as a data server, or that includes a middleware component, e.g., an application server, or that includes a front-end component, e.g., a user computer having a graphical user interface or a Web browser through which a user may interact with an implementation of the subject matter described in this specification, or any combination of one or more such back-end, middleware, or front-end components. The components of the system may be interconnected by any form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

The computing system may include users and servers. A user and server are generally remote from each other and typically interact through a communication network. The relationship of user and server arises by virtue of computer programs running on the respective computers and having a user-server relationship to each other. While this specification contains many specific implementation details, these should not be construed as limitations on the scope of any inventions or of what may be claimed, but rather as descriptions of features specific to particular embodiments of particular inventions. Certain features that are described in this specification in the context of separate embodiments may also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. In some cases, the actions recited in the claims may be performed in a different order and still achieve desirable results. In addition, the processes depicted in the accompanying figures do not necessarily require the particular order shown, or sequential order, to achieve desirable results. In certain implementations, multitasking and parallel processing may be advantageous.

As will be recognized by those skilled in the art, the innovative concepts described herein can be modified and varied over a wide range of applications. Accordingly, the scope of claimed subject matter should not be limited to any of the specific exemplary teachings discussed above, but is instead defined by the following claims.

What is claimed is:

1. A data compressor, comprising:
a zero-value remover that receives $2^N$ bit streams of values in which N is an integer greater than 1 and outputs $2^N$ non-zero-value bit streams having zero values removed from each respective bit stream;
a zero bit mask generator that receives the $2^N$ bit streams of values and generates a zero bit mask for a predetermined number of values of each bit stream, each zero bit mask indicating a location of a zero value in the predetermined number of values corresponding to the zero bit mask;
a plurality of multiplexers that receives the $2^N$ non-zero-value bit streams output from the zero-value remover, the plurality of multiplexers being arranged in $2^N$ rows and N columns, each input of a multiplexer in a first column receiving a respective bit stream of the $2^N$ bit streams of non-zero values, each respective non-zero-value bit stream comprising a bit-stream length based on data in the non-zero-value bit stream, and the multiplexers in a last column outputting $2^N$ bit streams of values as a group of packed non-zero values, each output bit stream having a same bit-stream length; and
a row-pointer generator that generates a row-pointer for each respective non-zero-value bit stream in the group of packed non-zero values.

2. The data compressor of claim 1, further comprising a memory-write arbiter that receives the group of packed non-zero values, zero bit masks corresponding to the $2^N$ bit streams formed into the group of packed non-zero values, and the row-pointers for the group of packed non-zero values, the memory-write arbiter sending for storage the group of packed non-zero values, the zero bit masks corresponding to the group of packed non-zero values or the row-pointers for the group of packed non-zero values.

3. The data compressor of claim 2, wherein the memory-write arbiter sends for storage the group of packed non-zero values, the zero bit masks corresponding to the group of packed non-zero values or the row-pointers for the group of packed non-zero values based on a respective accumulated length of the group of packed non-zero values, the zero bit masks corresponding to the group of packed non-zero values or the row-pointers for the group of packed non-zero values.

4. The data compressor of claim 2, further comprising a memory comprising a variable-sized non-zero value storage area that stores the group of packed non-zero values, and a metadata storage area that stores the zero bit masks corresponding to the group of packed non-zero values and the row-pointers for the group of packed non-zero values.

5. The data compressor of claim 2, further comprising a controller that controls the plurality of multiplexers so that the multiplexers in column N output the $2^N$ bit streams as the group of packed non-zero values.

6. The data compressor of claim 2, further comprising a data decompressor, the data decompressor comprising:
a memory-read arbiter that receives the row-pointers for the group of packed non-zero values, the zero bit masks corresponding to the group of packed non-zero values, and the group of packed non-zero values based on the row-pointers for the group of packed non-zero values;
a non-zero values unpacker that receives the group of packed non-zero values received and forms $2^N$ bit streams of packed non-zero values;
a zero-value mask unpacker that receives the zero bit masks corresponding to the group of packed non-zero values; and a zero-value inserter that inserts zero values into each bit stream of packed non-zero values based on the zero bit masks corresponding to the bit stream of packed non-zero values.

7. The data compressor of claim 6, wherein the non-zero values unpacker comprises:
a plurality of multiplexers arranged in $2^N$ rows and N columns, each input of a multiplexer in a first column receiving a respective bit stream of the $2^N$ bit-streams of packed non-zero values, each respective bit stream of packed non-zero values comprising a same bit-stream length, the multiplexers in a last column outputting $2^N$ bits streams each having a bit stream length corresponding to unpacked data of the bit stream; and
a controller that controls the multiplexers so that the multiplexers in column N output the $2^N$ bit streams of unpacked bit streams.

8. A data compressor, comprising:
a zero-value remover that receives 8 bit streams of values and outputs 8 non-zero-value bit streams having zero values removed from each respective bit stream;
a zero bit mask generator that receives the 8 bit streams of values and generates a zero bit mask for 16 values of each bit stream, each zero bit mask indicating a location of a zero value in the 16 values corresponding to the zero bit mask;
a plurality of multiplexers that receives the 8 non-zero-value bit streams output from the zero-value remover, the plurality of multiplexers being arranged in 8 rows and 3 columns, each input of a multiplexer in a first column receiving a respective bit stream of the 8 bit streams of non-zero values, each respective non-zero-value bit stream comprising a bit-stream length based on data in the non-zero-value bit stream, and the multiplexers in a last column outputting 8 bit streams of values as a group of packed non-zero values, each output bit stream having a same bit-stream length; and
a row-pointer generator that generates a row-pointer for each respective non-zero-value bit stream in the group of packed non-zero values.

9. The data compressor of claim 8, further comprising a memory-write arbiter that receives the group of packed non-zero values, zero bit masks corresponding to the 8 bit streams formed into the group of packed non-zero values, and the row-pointers for the group of packed non-zero values, the memory-write arbiter sending the group of packed non-zero values, the zero bit masks corresponding to the group of packed non-zero values or the row-pointers for the group of packed non-zero values for storage.

10. The data compressor of claim 9, wherein the memory-write arbiter sends the group of packed non-zero values, the zero bit masks corresponding to the group of packed non-zero values or the row-pointers for the group of packed non-zero values for storage based on a respective accumulated length of the group of packed non-zero values, the zero bit masks corresponding to the group of packed non-zero values or the row-pointers for the group of packed non-zero values.

11. The data compressor of claim 9, further comprising a memory comprising a variable-sized non-zero value storage area that stores the group of packed non-zero values, and a metadata storage area that stores the zero bit masks corresponding to the group of packed non-zero values and the row-pointers for the group of packed non-zero values.

12. The data compressor of claim 9, wherein the non-zero values packer comprises a controller that controls the plurality of multiplexers so that the multiplexers in column 3 output the 8 bit streams as the group of packed non-zero values.

13. The data compressor of claim 9, further comprising a data decompressor, the data decompressor comprising:
a memory-read arbiter that receives the row-pointers for the group of packed non-zero values, the zero bit masks corresponding to the group of packed non-zero values, and the group of packed non-zero values based on the row-pointers for the group of packed non-zero values;
a non-zero values unpacker that receives the group of packed non-zero values and forms 8 bit streams of packed non-zero values;
a zero-value mask unpacker that receives the zero bit masks corresponding to the group of packed non-zero values; and
a zero-value inserter that inserts zero values into each bit stream of packed non-zero values based on the zero bit masks corresponding to the bit stream of packed non-zero values.

14. The data compressor of claim 13, wherein the non-zero values unpacker comprises:
a plurality of multiplexers arranged in $2^N$ rows and N columns, each input of a multiplexer in a first column receiving a respective bit stream of the $2^N$ bit-streams of packed non-zero values, each respective bit stream of packed non-zero values comprising a same bit-stream length, the multiplexers in a last column outputting $2^N$ bits streams each having a bit stream length corresponding to unpacked data of the bit stream; and
a controller that controls the multiplexers so that the multiplexers in column N output the $2^N$ bit streams of unpacked bit streams.

15. A data decompressor, comprising:
a memory-read arbiter that receives row-pointers for a group of packed non-zero values, zero bit masks corresponding to the group of packed non-zero values, and the group of packed non-zero values based on the row-pointers for the group of packed non-zero values;
a plurality of multiplexers that receives the group of packed non-zero-values from the memory-read arbiter, the plurality of multiplexers being arranged in an $2^N$ rows and N columns in which N is an integer greater than 1, each input of a multiplexer in a first column receiving a respective bit stream of the $2^N$ bit-streams of packed non-zero values, each respective bit stream of packed non-zero values comprising a same bit-stream length, the multiplexers in a last column outputting $2^N$ bits streams each having a bit stream length corresponding to unpacked data of the bit stream;
a zero-value mask unpacker that receives the zero bit masks corresponding to the group of packed non-zero values; and
a zero-value inserter that inserts zero values into each bit stream of packed non-zero values based on the zero bit masks corresponding to the bit stream of packed non-zero values.

16. The data decompressor of claim 15, further comprising a controller that controls the multiplexers so that the multiplexers in column N output the $2^N$ bit streams of unpacked bit streams.

17. The data decompressor of claim 15, further comprising a data compressor, the data decompressor comprising:
a zero-value remover that receives $2^N$ bit streams of values and outputs $2^N$ non-zero-value bit streams having zero values removed from each respective bit stream;

a zero bit mask generator that receives the $2^N$ bit streams of values and generates a zero bit mask for a predetermined number of values of each bit stream, each zero bit mask indicating a location of a zero value in the predetermined number of values corresponding to the zero bit mask;

a non-zero values packer that receives the $2^N$ non-zero-value bit streams and forms a group of packed non-zero values that are arranged based on a bit stream identifier;

a row-pointer generator that generates a row-pointer for each respective non-zero-value bit stream in the group of packed non-zero values; and a memory-write arbiter that receives the group of packed non-zero values, zero bit masks corresponding to the $2^N$ bit streams formed into the group of packed non-zero values, and the row-pointers for the group of packed non-zero values, the memory-write arbiter sending the group of packed non-zero values, the zero bit masks corresponding to the group of packed non-zero values or the row-pointers for the group of packed non-zero values for storage.

18. The data decompressor of claim 17, wherein the memory-write arbiter sends the group of packed non-zero values, the zero bit masks corresponding to the group of packed non-zero values or the row-pointers for the group of packed non-zero values for storage based on a respective accumulated length of the group of packed non-zero values, the zero bit masks corresponding to the group of packed non-zero values or the row-pointers for the group of packed non-zero values.

19. The data decompressor of claim 17, further comprising a memory comprising a variable-sized non-zero value storage area that stores the group of packed non-zero values, and a metadata storage area that stores the zero bit masks corresponding to the group of packed non-zero values and the row-pointers for the group of packed non-zero values.

20. The data decompressor of claim 17, wherein the non-zero values packer comprises:

a plurality of multiplexers that receive the group of packed non-zero values from the memory-read arbiter, the plurality of multiplexers being arranged in $2^N$ rows and N columns, each input of a multiplexer in a first column receiving a respective bit stream of the $2^N$ bit streams of non-zero values, each respective non-zero-value bit stream comprising a bit-stream length based on data in the non-zero-value bit stream, and the multiplexers in a last column outputting $2^N$ bit streams of values as the group of packed non-zero values, each output bit stream having a same bit-stream length; and a controller that controls the non-zero values packer so that the multiplexers in column N output the $2^N$ bit streams as the group of packed non-zero values.

* * * * *